United States Patent
Chen et al.

(10) Patent No.: US 12,540,530 B2
(45) Date of Patent: Feb. 3, 2026

(54) SYSTEMS AND METHODS FOR MANAGING TEMPERATURES IN WELLBORES

(71) Applicant: Helmerich & Payne Technologies, LLC, Tulsa, OK (US)

(72) Inventors: Teddy Chen, Austin, TX (US); Angus Lamberton Jamieson, Inverness (GB); Andrew Evan Mcgregor, Inverness (GB); Marc Ernest Willerth, San Luis Obispo, CA (US)

(73) Assignee: Helmerich & Payne Technologies, LLC, Tulsa, OK (US)

( * ) Notice: Subject to any disclaimer, the term of this patent is extended or adjusted under 35 U.S.C. 154(b) by 0 days.

(21) Appl. No.: 18/490,668

(22) Filed: Oct. 19, 2023

(65) Prior Publication Data

US 2024/0133267 A1 Apr. 25, 2024
US 2024/0237535 A9 Jul. 11, 2024

Related U.S. Application Data

(60) Provisional application No. 63/380,448, filed on Oct. 21, 2022.

(51) Int. Cl.
 *E21B 41/00* (2006.01)
 *E21B 36/00* (2006.01)
 *F03G 4/00* (2006.01)

(52) U.S. Cl.
 CPC ........ *E21B 41/0085* (2013.01); *E21B 36/001* (2013.01); *E21B 36/003* (2013.01); *F03G 4/00* (2021.08)

(58) Field of Classification Search
 CPC ..................................................... E21B 36/00
 See application file for complete search history.

(56) References Cited

U.S. PATENT DOCUMENTS

| 7,647,979 B2 | 1/2010 | Shipley et al. |
| 11,319,779 B1 | 5/2022 | Bryan et al. |

(Continued)

FOREIGN PATENT DOCUMENTS

| CN | 108322096 A | 7/2018 |
| CN | 111237146 B | 8/2021 |

(Continued)

OTHER PUBLICATIONS

PCT/US2023/077339, "International Search Report and Written Opinion", Feb. 6, 2024, 16 pages.

(Continued)

*Primary Examiner* — William D Hutton, Jr.
*Assistant Examiner* — Avi T Skaist
(74) *Attorney, Agent, or Firm* — Kilpatrick Townsend & Stockton LLP

(57) ABSTRACT

In some implementations, a plurality of thermoelectric devices may be arranged to cool one or more components of a downhole drilling component during drilling operations. A current can be applied to one or more thermoelectric devices to generate a cooling effect. The thermoelectric devices can be located and arranged so that they cool some or all of a bottom hole assembly or components thereof, such as one or more sensors, batteries, processors, electrics, and the like. The thermoelectric devices also may be located and arranged to cool sensors, batteries, other downhole components, and/or drilling mud in a wellbore during drilling operations. A plurality of thermoelectric devices may be used to generate electric power downhole from a temperature difference. The electric power may be used to power sensors, processors, charge batteries, and be used by one or more downhole electric components, such as those in a bottom hold assembly. One or more thermal storage devices may be used with the thermoelectric devices to store thermal (Continued)

energy for use when needed. A control system may be used to control the activation and/or deactivation of one or more thermoelectric devices to provide cooling or electricity when desired and to switch between such operations.

33 Claims, 36 Drawing Sheets

(56) References Cited

U.S. PATENT DOCUMENTS

| | | | |
|---|---|---|---|
| 2006/0101831 A1* | 5/2006 | Storm | E21B 47/0175 165/104.21 |
| 2006/0117759 A1* | 6/2006 | Hall | E21B 41/0085 62/3.2 |
| 2009/0217664 A1 | 9/2009 | Rapp et al. | |
| 2011/0203798 A1* | 8/2011 | Herrera | E21B 47/0175 166/57 |
| 2016/0273309 A1 | 9/2016 | Maher et al. | |
| 2018/0202288 A1 | 7/2018 | Elbadawy et al. | |
| 2019/0128067 A1* | 5/2019 | Viens | E21B 7/04 |

FOREIGN PATENT DOCUMENTS

| | | |
|---|---|---|
| CN | 113224979 A | 8/2021 |
| DE | 2438172 A1 | 2/1976 |
| EP | 2740890 A1 | 6/2014 |
| FR | 3009613 A1 | 2/2015 |
| KR | 20170020702 A | 2/2017 |
| WO | 2010057017 A2 | 5/2010 |
| WO | 2014089128 A1 | 6/2014 |
| WO | 2016150651 A1 | 9/2016 |
| WO | 2017015004 A1 | 1/2017 |
| WO | 2019067618 A1 | 4/2019 |
| WO | 2020141437 A1 | 7/2020 |
| WO | 2022211583 A1 | 10/2022 |

OTHER PUBLICATIONS

PCT/US2023/077342, "International Search Report and Written Opinion", Feb. 6, 2024, 12 pages.
PCT/EP2023/085670, "Annex to Form PCT/ISA/206 Communication Relating to the Results of the Partial International Search", Apr. 25, 2024, 5 pages.
U.S. Appl. No. 18/490,655, "Notice of Allowance", Jul. 29, 2025, 12 pages.
PCT/US2023/077339, "International Preliminary Report on Patentability", May 1, 2025, 12 pages.
PCT/US2023/077342, "International Preliminary Report on Patentability", May 1, 2025, 9 pages.

* cited by examiner

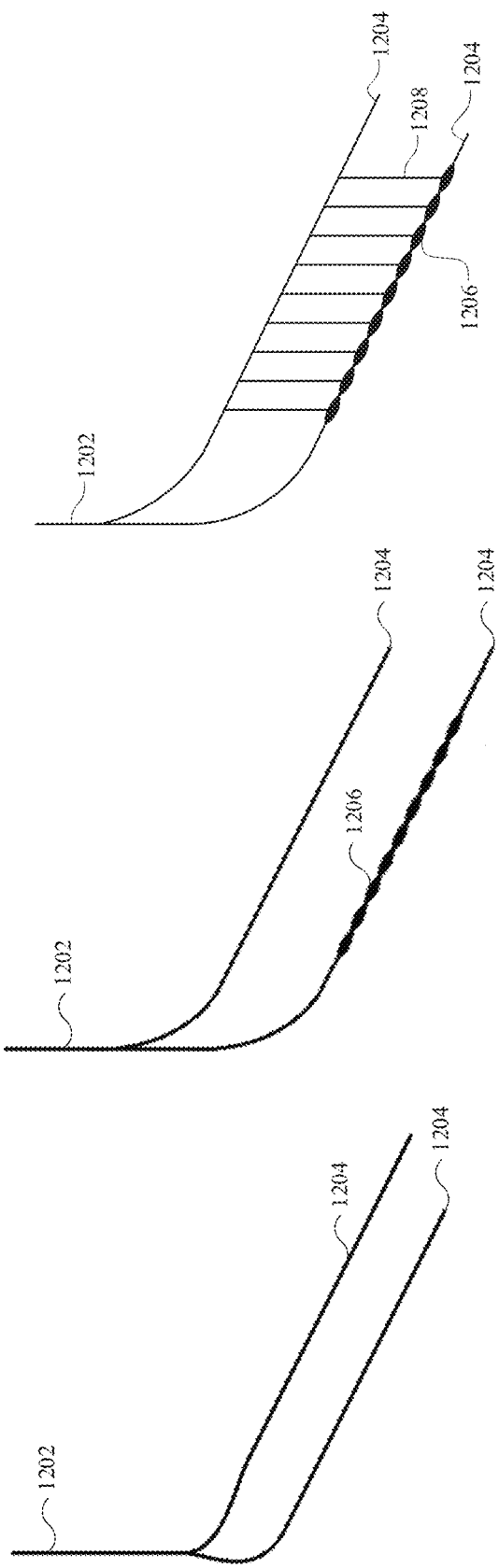

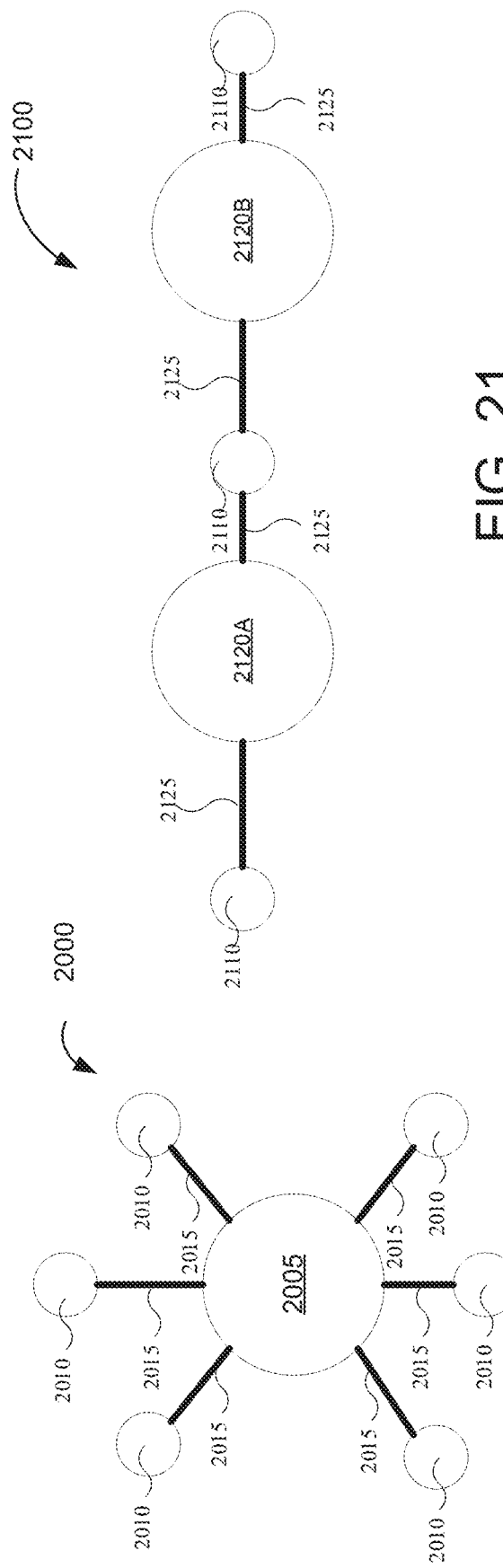

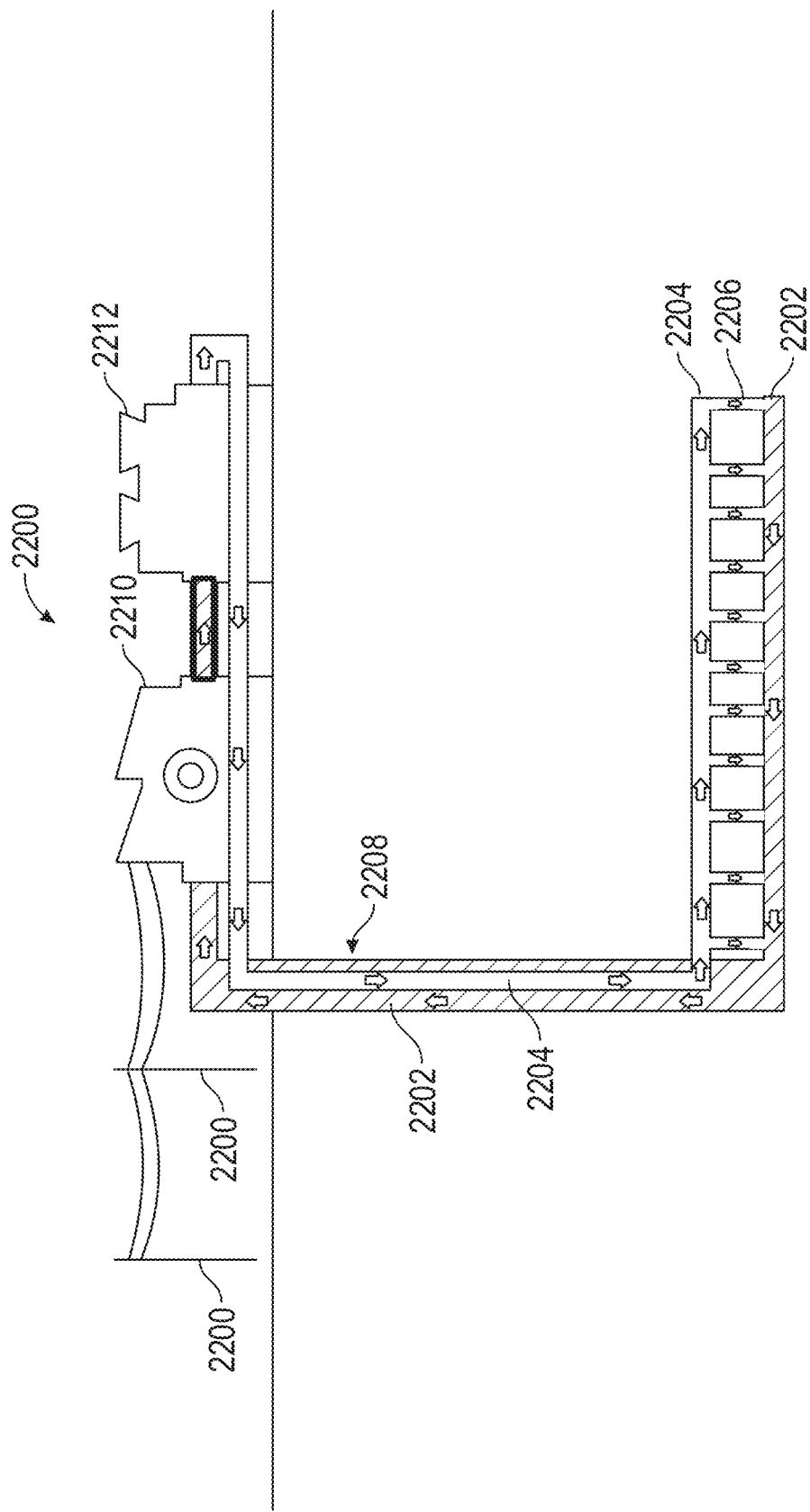

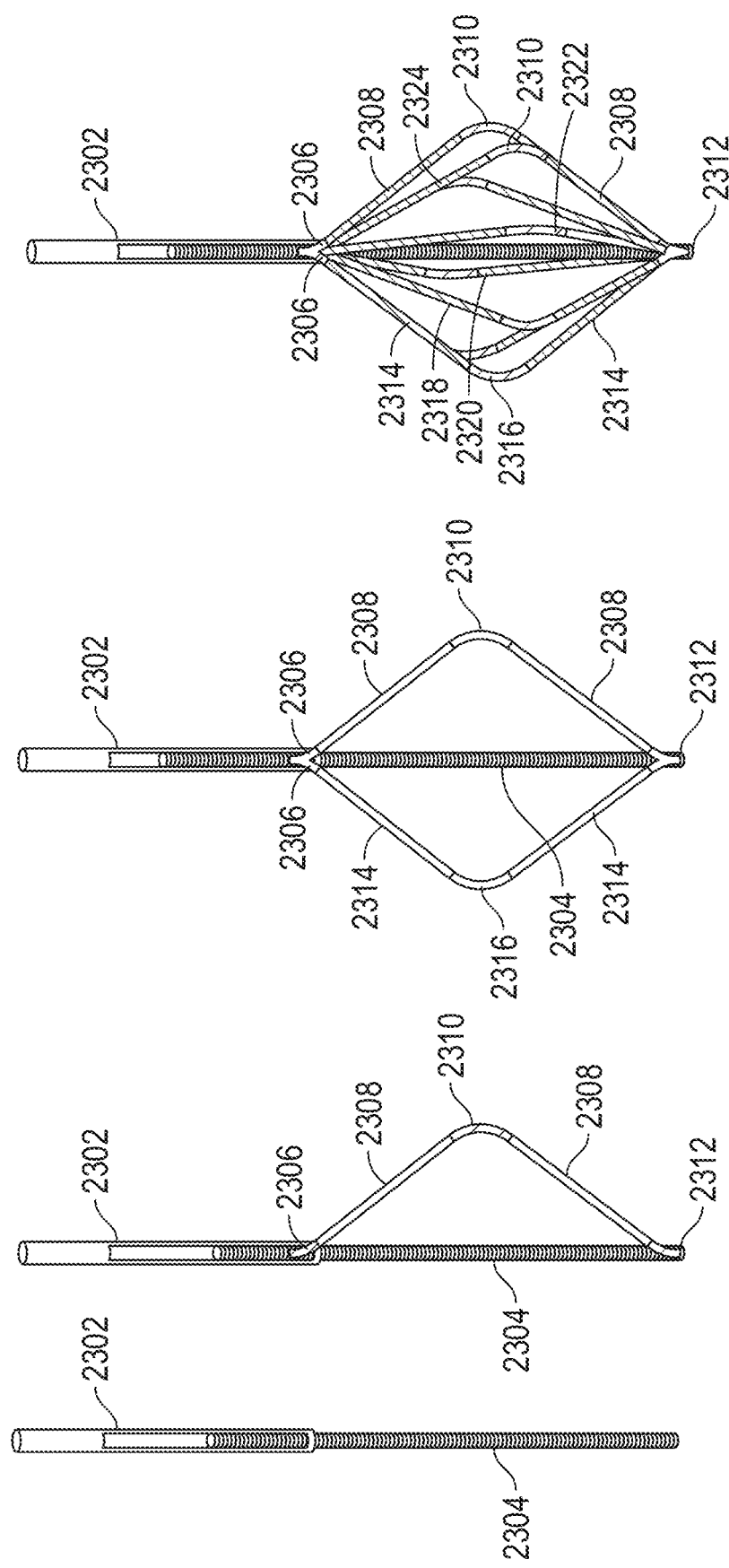

SYSTEMS AND METHODS FOR MANAGING TEMPERATURES IN WELLBORES

CROSS-REFERENCES TO RELATED APPLICATIONS

This application claims priority to and the benefit of U.S. Provisional Application No. 63/380,448, filed on Oct. 21, 2022, and entitled "Systems and Methods for Generating and Storing Energy," the specification of which is hereby incorporated herein by reference in its entirety as if fully set forth herein. This application is related to co-pending U.S. nonprovisional patent application titled "Systems and Methods for Downhole Power Generation," which was filed on the same date as this application.

BACKGROUND

Field of the Disclosure

This application relates to systems and methods for managing temperatures, such as by cooling or heating, in a wellbore, as well as generating and/or storing energy, such as electricity, and more particularly, to systems and methods that use thermoelectric or Seebeck generator devices to generate electric currents from temperature gradients, as well as to generate temperature gradients for managing temperatures in a wellbore, including but not limited to temperatures of one or more components of a drill string, including a bottom hole assembly and components thereof.

Description of the Related Art

Geothermal power generation can provide several advantages. Geothermal energy can be more environmentally friendly than conventional fuel sources. Geothermal energy can be a source of renewable energy. The number of exploitable geothermal resources will increase with ongoing research and development in the industry. Geothermal energy is a sustainable source of energy that can be consistently available unlike some other renewable energy sources (e.g., wind and solar power). Geothermal energy can be a reliable source of energy and it can be easier to predict the power output from a geothermal plant with a high degree of accuracy. No additional fuel may be required for geothermal energy. New technologies are being created to improve the energy process as a result of increase in exploration. Geothermal energy production can result in much lower pollution levels as compared to fossil fuels.

A major disadvantage of geothermal energy is that it is location specific. For example, geothermal energy is economic in places like Iceland, Alaska, and East Asia generally because these locations have access to a shallow heat source. Additional disadvantages can include the release of gasses into the atmosphere during drilling. Some geothermal wells can present a risk of triggering earthquakes. Currently, geothermal energy can be expensive to exploit with high upfront costs ranging from around $2 million to $7 million for a plant with a 1-megawatt capacity. Another disadvantage can include that fluid may be required to be pumped back into the underground reservoirs faster than it is depleted. Management can be required to maintain sustainability.

In order to offset various disadvantages and improve the efficiency of geothermal wells several techniques and devices have been developed. These techniques can determine the most cost-effective way of exposing maximum circulation to maximum heat. These techniques can adapt existing oil and gas technologies for maximum benefit of geothermal energy systems. These techniques can reduce drilling time to a minimum while simultaneously maximizing heat production over time.

Some current implementations of a geothermal well require the drilling of two or more wells. For example, two vertical wells may be drilled, with one of the vertical wells used for injection and the other vertical well used for recovery of the hot water or steam. However, the cost of drilling two vertical wells for use for geothermal power generation can be cost prohibitive. Therefore, techniques that minimize the drilling required while maximizing the heat transfer would be more economically feasible.

BRIEF SUMMARY

Certain embodiments of the present disclosure can provide methods, systems, and apparatuses for drilling geothermal wells and using such wells to generate and store energy, such as in the form of electricity.

Thermoelectric heat pumps are currently used in a few applications, such as providing cooling for ice-free, portable coolers. When a DC voltage is applied to a thermoelectric device, such as a TEC1-12706, one side of the device gets hotter and the other side gets colder. However, if the same device is subject to a heat differential across the two sides, the thermoelectric device can produce a current. A number of thermoelectric devices can be embedded in pipe that is located in a geothermal well, with the temperature differential across the two sides of the devices used to generate an electric current, which can in turn be stored, such as by being used to charge batteries, or can be used by other electrically powered devices. In one embodiment, a plurality of pipes are located within a well, with each of the plurality of pipes having a plurality of thermoelectric devices embedded therein. The plurality of thermoelectric devices can be connected in series or in parallel, or in a combination thereof, and each of the plurality of pipes in the well can have the same or a different connection mode, or a combination thereof. In some embodiments, the thermoelectric devices are arranged in a manner so that a plurality of thermoelectric devices is located in radially different positions from one another around the longitudinal axis of one or more of the plurality of pipes. In some embodiments, the thermoelectric devices may be located in the casing of the geothermal well instead of the pipes, and in some cases the thermoelectric devices may be located in one or more portions of the casing and in one or more of the pipes of the plurality of pipes in the well. In still other embodiments, the output of the thermoelectric devices may be used in combination with a conventional steam turbine or the like that is coupled to a subterranean well (e.g., a well drilled to extract oil and gas or a geothermal well). In various embodiments, excess energy can be harvested from existing oil and gas wells in which the same pipe systems can be employed to concurrently generate energy using thermoelectric devices. In still other embodiments, the thermoelectric devices may be used in geothermal wells with multiple laterals that follow one or more patterns.

In some respects, techniques for drilling geothermal wells include drilling a vertical borehole and using the vertical portion to drill a plurality of lateral boreholes extending from the vertical portion. The techniques can include using at least a portion of the vertical borehole, drilling a plurality of lateral boreholes, each of which is connected to the vertical borehole, then connecting the two lateral boreholes with a plurality of fluid pathways. The techniques can include generating a plurality of chambers in at least one of the plurality of lateral boreholes. The techniques can include drilling a plurality of passageways that each provide fluid communication between one of the plurality of chambers in a first lateral borehole and a second lateral borehole of the plurality of lateral boreholes.

The foregoing discussion focuses on the generation of electricity from a temperature gradient and the use of the electricity in connection with drilling operations. In addition, the thermoelectric devices described can be used to generate a temperature gradient with a cooler side and a hotter side by applying an electric current thereto. By selectively placing one or more thermoelectric devices adjacent or proximal to one or more components of a drill string, such as a bottom hole assembly (BHA) and its components, and by selectively applying an electric current to the one or more thermoelectric devices, the downhole temperature of the BHA and/or one or more of its components can be adjusted and controlled. It is believed that the use of the one or more thermoelectric devices to cool the BHA and its components may be very useful in a geothermal well, especially when the BHA encounters significantly high temperatures during drilling of the heated zone of the geothermal well. However, it is also believed that the use of the one or more thermoelectric devices to cool the BHA and/or its components during drilling of otherwise conventional vertical or horizontal wells may be of great benefit. For example, experience teaches that measurement-while-drilling (MWD) components often will not work (or will not work reliably) at temperatures of around 250 degrees Celsius or high. By using one or more thermoelectric devices to cool the MWD components by generating cooler temperatures in an area adjacent to or proximal to the MWD components, the present disclosure allows for the use of otherwise conventional MWD components in wells at higher temperatures than would otherwise be possible. As explained further below, the one or more thermoelectric devices may be located in or as part of the BHA, as part of the BHA's component(s), and may be selectively activated or deactivated during drilling responsive to conditions encountered in the wellbore during drilling. The activation or deactivation may be done by an operator, or the thermoelectric devices may be coupled to one or more control systems with appropriate computer programming so that, when one or more conditions are sensed (e.g., a downhole temperature exceeds a threshold therefor, or exceed a threshold by a certain amount and/or for a certain time period), the thermoelectric devices are activated to begin cooling. In addition, a plurality of components in the BHA may be provided with one or more thermoelectric devices themselves. For example, the BHA may include MWD sensors, one or more processors, batteries, and the like, and each of these components may have one or more thermoelectric devices arranged to provide cooling thereto. In addition, one or more thermal conductors or insulators may be used to assist in transferring the cooler thermal conditions from the thermoelectric devices to the one or more components, and/or may be used to help transfer the heat generated by the thermoelectric devices to one or more heat zones. In some embodiments, one or more thermal storage devices and/or thermal conductors may be used to provide cooling to components and/or to store thermal energy which can be used to cool one or more downhole components when desired (such as when mud pumps are turned off and there is no circulation of the drilling fluid). Additional benefits and advantages of the present disclosure are provided below.

In various embodiments, the techniques can include drilling a first gauge hole in the vertical borehole at a first location of a first parallel lateral well. The techniques can include casing a curve in the first gauge hole at the first location. The techniques can include milling the casing in the curve for a second gauge hole. The techniques can include providing a pipe in the second gauge hole to form an annulus between an inside of the first gauge hole and an outside of the pipe.

In various embodiments, a heated fluid (e.g., hot water and/or steam) flows up the annulus.

In various embodiments, the target location is a geothermally active location within the earth.

In various embodiments, one of the first lateral borehole and the second lateral borehole is located above the other.

In various embodiments, the techniques can include reinforcing the vertical borehole and the first lateral borehole well beyond the curve.

In various embodiments, the generating of a plurality of chambers comprises at least one or more of targeted jetting, applying acid slugs, washing out, and/or drilling with asymmetric drill bits, or a combination of one or more of these.

In various embodiments, the generating of chambers comprises forming chambers having at least a predetermined diameter or shape.

In an aspect, a controller device, includes a memory comprising computer-executable instructions and one or more processors in communication with the memory and configured to access the memory and execute the computer-executable instructions to perform the method of any of the techniques described above.

In an aspect, one or more non-transitory computer-readable storage medium comprising computer-executable instructions that, when executed by one or more processors, cause the one or more processors to perform the method of any of the techniques described above.

In an aspect, an apparatus for drilling can include a propellant feed line coupled to a proximate end of a rotating head via a bearing assembly, the rotating head having one or more cutting nozzles affixed to a distal end of the rotating head. The apparatus can include one or more thrust nozzles coupled to a proximate end of the bearing assembly, wherein one or more interior passageways connect the propellant feed line to the one or more thrust nozzles.

In various embodiments, the apparatus can include a gravity sensor to detect an orientation of the apparatus and direct jetting of propellant.

In various embodiments, the apparatus can include one or more nozzle feeds for the one or more cutting nozzles.

In various embodiments, the apparatus can include a pendulum block to direct a flow of propellant from a propellant chamber of the apparatus to the one or more nozzle feeds.

In an aspect, a geothermal energy generator facility, the facility can include a first wellbore, a portion of which is located proximal a geothermal heat source. The facility can include a second wellbore, wherein at least a portion of the second wellbore is proximal and in fluid communication with the first wellbore though a plurality of fluid pathways extending between the first wellbore and the second wellbore, wherein a fluid can be provided from a surface location to the first wellbore, flow through the first wellbore and through the plurality of fluid pathways, and return to the surface location as steam, heated liquid, or a combination thereof.

In various embodiments, the facility can include a generator at the surface location adapted to receive the steam, liquid, or combination thereof and generate electricity therefrom.

In various embodiments, the facility can include the first wellbore and the second wellbore are in fluid communication with a vertical wellbore.

In various embodiments, at least a portion of the second wellbore is located under a portion of the first wellbore.

In various embodiments, a flow divider located in the vertical wellbore divides an input flow and an output flow in the vertical wellbore.

In various embodiments, the vertical wellbore can include a first portion adapted to receive an input flow of a liquid to at least one of the first wellbore and the second wellbore, and a second portion adapted to receive an output flow of the liquid from the other of the first wellbore and the second wellbore.

Reference to the remaining portions of the specification, including the drawings and claims, will realize other features and advantages of embodiments of the present disclosure. Further features and advantages, as well as the structure and operation of various embodiments of the present disclosure, are described in detail below with respect to the accompanying drawings. In the drawings, like reference numbers can indicate identical or functionally similar elements.

BRIEF DESCRIPTION OF THE DRAWINGS

For a more complete understanding of the present invention and its features and advantages, reference is now made to the following description, taken in conjunction with the accompanying drawings, in which:

FIG. 11A illustrates a vertical borehole with multiple lateral boreholes.

FIG. 11B illustrates chambering out a plurality of chamber points in one of the lateral boreholes.

FIG. 11C illustrates a plurality of passageways that can drilled between the plurality of lateral boreholes.

FIGS. 12A-12C illustrate various stages of a second exemplary "radiator" well.

FIG. 12A illustrates a vertical borehole with multiple lateral boreholes.

FIG. 12B illustrates chambering out a plurality of chamber points in one of the lateral boreholes.

FIG. 12C illustrates a plurality of vertical passageways that can drilled between the plurality of lateral boreholes.

FIG. 20 illustrates an example borehole configurations for a geothermal well.

FIG. 21 illustrates a second potential borehole configuration for a geothermal well.

FIG. 22 illustrates an exemplary geothermal facility.

FIGS. 23A-23D illustrates various stage of an exemplary geothermal well.

FIG. 23A illustrates a first stage in an exemplary geothermal well.

FIG. 23B illustrates a second stage of an exemplary geothermal well.

FIG. 23C illustrates a third stage of an exemplary geothermal well.

FIG. 23D illustrates a fourth stage of an exemplary geothermal well.

DESCRIPTION OF PARTICULAR EMBODIMENT(S)

Figure 1:
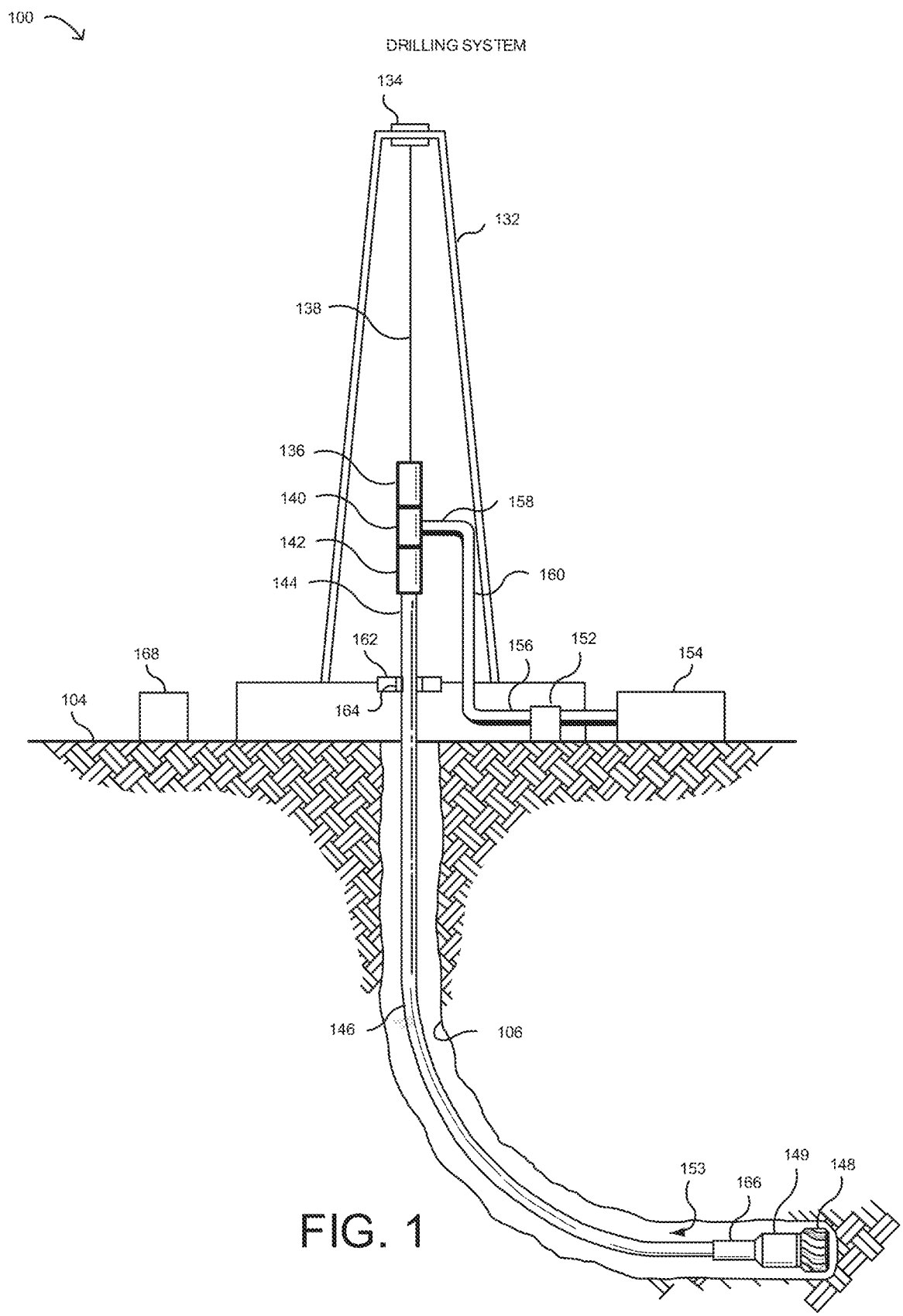
FIG. 1 is a depiction of a drilling system for drilling a borehole.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), device "12-1" refers to an instance of a device class, which may be referred to collectively as devices "12" and any one of which may be referred to generically as a device "12". In the figures and the description, like numerals are intended to represent like elements.

In conventional geothermal wells, the well must be drilled a significant vertical distance before the well reaches a layer of rock that is sufficiently hot to provide geothermal power through conventional means, such as conversion to steam that drives a turbine to produce electricity. Because of this vertical distance, a loss of some geothermal energy is to be expected when the heated fluid travels back up a well to the surface. This loss is considered a waste. Similarly, the time required to charge the fluid in a geothermal well may be considered a waste (e.g., the longer the time a given amount of fluid is required to sufficiently heat, the more time that other fluid cannot be heating).

Thermoelectric devices can be embedded in pipes used to drill geothermal wells and can provide additional energy due to the temperature gradient across the two sides of each embedded thermoelectric device. The use of such devices will mitigate the losses involved in heat loss due to the heated fluid traveling to the surface and to the time that it takes for the fluid to be sufficiently heated in a geothermal well. In some applications, the use of pressurized fluid in a geothermal well should increase the pressure differential, which in turn will increase the power output of thermoelectric devices embedded in pipes in the well. In addition, insulating the pipes in a way that increases the temperature differential to which the thermoelectric devices are exposed will also increase power output. For example, a plurality of thermoelectric devices may be embedded in a coating of the outer surface of a pipe, and/or embedded in a coating of the inner surface of the pipe, and/or within the pipe itself.

Drilling a well typically involves a substantial amount of human decision-making during the drilling process. For example, geologists and drilling engineers use their knowledge, experience, and the available information to make decisions on how to plan the drilling operation, how to accomplish the drill plan, and how to handle issues that arise during drilling. However, even the best geologists and drilling engineers perform some guesswork due to the unique nature of each borehole. Furthermore, a directional human driller performing the drilling may have drilled other boreholes in the same region and so may have some similar experience. However, during drilling operations, a multitude of input information and other factors may affect a drilling decision being made by a human operator or specialist, such that the amount of information may overwhelm the cognitive ability of the human to properly consider and factor into the drilling decision. Furthermore, the quality or the error involved with the drilling decision may improve with larger amounts of input data being considered, for example, such as formation data from a large number of offset wells. For these reasons, human specialists may be unable to achieve optimal drilling decisions, particularly when such drilling decisions are made under time constraints, such as during drilling operations when continuation of drilling is dependent on the drilling decision and, thus, the entire drilling rig waits idly for the next drilling decision. Furthermore, human decision-making for drilling decisions can result in expensive mistakes because drilling errors can add significant cost to drilling operations. In some cases, drilling errors may permanently lower the output of a well, resulting in substantial long term economic losses due to the lost output of the well.

The systems and methods used to drill oil and gas wells are complex and sophisticated. Methods and systems developed for oil and gas wells can be adapted for use in planning, drilling, and creating wells for geothermal energy. The following discussion provides a description of systems and techniques for drilling wells that can be useful for drilling geothermal wells, as well as generating electricity therefrom.

Referring now to the drawings, Referring to FIG. 1, a drilling system 100 is illustrated in one embodiment as a top drive system. As shown, the drilling system 100 includes a derrick 132 on the surface 104 of the earth and is used to drill a borehole 106 into the earth. Typically, drilling system 100 is used at a location corresponding to a geographic formation 102 in the earth that is known.

In FIG. 1, derrick 132 includes a crown block 134 to which a traveling block 136 is coupled via a drilling line 138. In drilling system 100, a top drive 140 is coupled to traveling block 136 and may provide rotational force for drilling. A saver sub 142 may sit between the top drive 140 and a drill pipe 144 that is part of a drill string 146. Top drive 140 may rotate drill string 146 via the saver sub 142, which in turn may rotate a drill bit 148 of a bottom hole assembly (BHA) 149 in borehole 106 passing through formation 102. Also visible in drilling system 100 is a rotary table 162 that may be fitted with a master bushing 164 to hold drill string 146 when not rotating.

A mud pump 152 may direct a fluid mixture (e.g., drilling mud 153) from a mud pit 154 into drill string 146. Mud pit 154 is shown schematically as a container, but it is noted that various receptacles, tanks, pits, or other containers may be used. Drilling mud 153 may flow from mud pump 152 into a discharge line 156 that is coupled to a rotary hose 158 by a standpipe 160. Rotary hose 158 may then be coupled to top drive 140, which includes a passage for drilling mud 153 to flow into borehole 106 via drill string 146 from where drilling mud 153 may emerge at drill bit 148. Drilling mud 153 may lubricate drill bit 148 during drilling and, due to the pressure supplied by mud pump 152, drilling mud 153 may return via borehole 106 to surface 104.

In drilling system 100, drilling equipment (see also FIG. 5) is used to perform the drilling of borehole 106, such as top drive 140 (or rotary drive equipment) that couples to drill string 146 and BHA 149 and is configured to rotate drill string 146 and apply pressure to drill bit 148. Drilling system 100 may include control systems such as a WOB/differential pressure control system 522, a positional/rotary control system 524, a fluid circulation control system 526, and a sensor system 528, as further described below with respect to FIG. 5. The control systems may be used to monitor and change drilling rig settings, such as the WOB or differential pressure to alter the ROP or the radial orientation of the toolface, change the flow rate of drilling mud, and perform other operations. Sensor system 528 may be for obtaining sensor data about the drilling operation and drilling system 100, including the downhole equipment. For example, sensor system 528 may include MWD or logging while drilling (LWD) tools for acquiring information, such as toolface and formation logging information, that may be saved for later retrieval, transmitted with or without a delay using any of various communication means (e.g., wireless, wireline, or mud pulse telemetry), or otherwise transferred to steering control system 168. As used herein, an MWD tool is enabled to communicate downhole measurements without substantial delay to the surface 104, such as using mud pulse telemetry, while a LWD tool is equipped with an internal memory that stores measurements when downhole and can be used to download a stored log of measurements when the LWD tool is at the surface 104. The internal memory in the LWD tool may be a removable memory, such as a universal serial bus (USB) memory device or another removable memory device. It is noted that certain downhole tools may have both MWD and LWD capabilities. Such information acquired by sensor system 528 may include information related to hole depth, bit depth, inclination angle, azimuth angle, true vertical depth, gamma count, standpipe pressure, mud flow rate, rotary rotations per minute (RPM), bit speed, ROP, WOB, among other information. It is noted that all or part of sensor system 528 may be incorporated into a control system, or in another component of the drilling equipment. As drilling system 100 can be configured in many different implementations, it is noted that different control systems and subsystems may be used.

Sensing, detection, measurement, evaluation, storage, alarm, and other functionality may be incorporated into a downhole tool 166 or BHA 149 or elsewhere along drill string 146 to provide downhole surveys of borehole 106. Accordingly, downhole tool 166 may be an MWD tool or a LWD tool or both, and may accordingly utilize connectivity to the surface 104, local storage, or both. In different implementations, gamma radiation sensors, magnetometers, accelerometers, and other types of sensors may be used for the downhole surveys. Although downhole tool 166 is shown in singular in drilling system 100, it is noted that multiple instances (not shown) of downhole tool 166 may be located at one or more locations along drill string 146.

In some embodiments, formation detection and evaluation functionality may be provided via a steering control system 168 on the surface 104. Steering control system 168 may be located in proximity to derrick 132 or may be included with drilling system 100. In other embodiments, steering control system 168 may be remote from the actual location of borehole 106 (see also FIG. 4). For example, steering control system 168 may be a stand-alone system or may be incorporated into other systems included with drilling system 100.

In operation, steering control system 168 may be accessible via a communication network (see also FIG. 10) and may accordingly receive formation information via the communication network. In some embodiments, steering control system 168 may use the evaluation functionality to provide corrective measures, such as a convergence plan to overcome an error in the well trajectory of borehole 106 with respect to a reference, or a planned well trajectory. The convergence plans or other corrective measures may depend on a determination of the well trajectory, and therefore, may be improved in accuracy using certain methods and systems for improved drilling performance.

In particular embodiments, at least a portion of steering control system 168 may be located in downhole tool 166 (not shown). In some embodiments, steering control system 168 may communicate with a separate controller (not shown) located in downhole tool 166. In particular, steering control system 168 may receive and process measurements received from downhole surveys and may perform the calculations described herein using the downhole surveys and other information referenced herein.

In drilling system 100, to aid in the drilling process, data is collected from borehole 106, such as from sensors in BHA 149, downhole tool 166, or both. The collected data may include the geological characteristics of formation 102 in which borehole 106 was formed, the attributes of drilling system 100, including BHA 149, and drilling information such as weight-on-bit (WOB), drilling speed, and other information pertinent to the formation of borehole 106. The drilling information may be associated with a particular depth or another identifiable marker to index collected data. For example, the collected data for borehole 106 may capture drilling information indicating that drilling of the well from 1,000 feet to 1,200 feet occurred at a first rate of penetration (ROP) through a first rock layer with a first WOB, while drilling from 1,200 feet to 1,500 feet occurred at a second ROP through a second rock layer with a second WOB (see also FIG. 2). In some applications, the collected data may be used to virtually recreate the drilling process that created borehole 106 in formation 102, such as by displaying a computer simulation of the drilling process. The accuracy with which the drilling process can be recreated depends on a level of detail and accuracy of the collected data, including collected data from a downhole survey of the well trajectory.

The collected data may be stored in a database that is accessible via a communication network for example. In some embodiments, the database storing the collected data for borehole 106 may be located locally at drilling system 100, at a drilling hub that supports a plurality of drilling systems 100 in a region, or at a database server accessible over the communication network that provides access to the database (see also FIG. 4). At drilling system 100, the collected data may be stored at the surface 104 or downhole in drill string 146, such as in a memory device included with BHA 149 (see also FIG. 10). Alternatively, at least a portion of the collected data may be stored on a removable storage medium, such as using steering control system 168 or BHA 149, which is later coupled to the database in order to transfer the collected data to the database, which may be manually performed at certain intervals, for example.

In FIG. 1, steering control system 168 is located at or near the surface 104 where borehole 106 is being drilled. Steering control system 168 may be coupled to equipment used in drilling system 100 and may also be coupled to the database, whether the database is physically located locally, regionally, or centrally (see also FIGS. 4 and 5). Accordingly, steering control system 168 may collect and record various inputs, such as measurement data from a magnetometer and an accelerometer that may also be included with BHA 149.

Steering control system 168 may further be used as a surface steerable system, along with the database, as described above. The surface steerable system may enable an operator to plan and control drilling operations while drilling is being performed. The surface steerable system may itself also be used to perform certain drilling operations, such as controlling certain control systems that, in turn, control the actual equipment in drilling system 100 (see also FIG. 5). The control of drilling equipment and drilling operations by steering control system 168 may be manual, manual-assisted, semi-automatic, or automatic, in different embodiments.

Manual control may involve direct control of the drilling rig equipment, albeit with certain safety limits to prevent unsafe or undesired actions or collisions of different equipment. To enable manual-assisted control, steering control system 168 may present various information, such as using a graphical user interface (GUI) displayed on a display device (see FIG. 8), to a human operator, and may provide controls that enable the human operator to perform a control operation. The information presented to the user may include live measurements and feedback from the drilling rig and steering control system 168, or the drilling rig itself, and may further include limits and safety-related elements to prevent unwanted actions or equipment states, in response to a manual control command entered by the user using the GUI.

To implement semi-automatic control, steering control system 168 may itself propose or indicate to the user, such as via the GUI, that a certain control operation, or a sequence of control operations, should be performed at a given time. Then, steering control system 168 may enable the user to imitate the indicated control operation or sequence of control operations, such that once manually started, the indicated control operation or sequence of control operations is automatically completed. The limits and safety features mentioned above for manual control would still apply for semi-automatic control. It is noted that steering control system 168 may execute semi-automatic control using a secondary processor, such as an embedded controller that executes under a real-time operating system (RTOS), that is under the control and command of steering control system 168. To implement automatic control, the step of manual starting the indicated control operation or sequence of operations is eliminated, and steering control system 168 may proceed with only a passive notification to the user of the actions taken.

In order to implement various control operations, steering control system 168 may perform (or may cause to be performed) various input operations, processing operations, and output operations. The input operations performed by steering control system 168 may result in measurements or other input information being made available for use in any subsequent operations, such as processing or output operations. The input operations may accordingly provide the input information, including feedback from the drilling process itself, to steering control system 168. The processing operations performed by steering control system 168 may be any processing operation, as disclosed herein. The output operations performed by steering control system 168 may involve generating output information for use by external entities, or for output to a user, such as in the form of updated elements in the GUI, for example. The output information may include at least some of the input information, enabling steering control system 168 to distribute information among various entities and processors.

In particular, the operations performed by steering control system 168 may include operations such as receiving drilling data representing a drill path, receiving other drilling parameters, calculating a drilling solution for the drill path based on the received data and other available data (e.g., rig characteristics), implementing the drilling solution at the drilling rig, monitoring the drilling process to gauge whether the drilling process is within a defined margin of error of the drill path, and calculating corrections for the drilling process if the drilling process is outside of the margin of error.

Accordingly, steering control system 168 may receive input information either before drilling, during drilling, or after drilling of borehole 106. The input information may comprise measurements from one or more sensors, as well as survey information collected while drilling borehole 106. The input information may also include a drill plan, a regional formation history, drilling engineer parameters, downhole toolface/inclination information, downhole tool gamma/resistivity information, economic parameters, and reliability parameters, among various other parameters. Some of the input information, such as the regional formation history, may be available from a drilling hub 410, which may have respective access to a regional drilling database (DB) 412 (see FIG. 4). Other input information may be accessed or uploaded from other sources to steering control system 168. For example, a web interface may be used to interact directly with steering control system 168 to upload the drill plan or drilling parameters.

As noted, the input information may be provided to steering control system 168. After processing by steering control system 168, steering control system 168 may generate control information that may be output to drilling rig 210 (e.g., to rig controls 520 that control drilling equipment 530, see also FIGS. 2 and 5). Drilling rig 210 may provide feedback information using rig controls 520 to steering control system 168. The feedback information may then serve as input information to steering control system 168, thereby enabling steering control system 168 to perform feedback loop control and validation. Accordingly, steering control system 168 may be configured to modify its output information to the drilling rig, in order to achieve the desired results, which are indicated in the feedback information. The output information generated by steering control system 168 may include indications to modify one or more drilling parameters, the direction of drilling, and the drilling mode, among others. In certain operational modes, such as semi-automatic or automatic, steering control system 168 may generate output information indicative of instructions to rig controls 520 to enable automatic drilling using the latest location of BHA 149. Therefore, an improved accuracy in the determination of the location of BHA 149 may be provided using steering control system 168.

Figure 2:
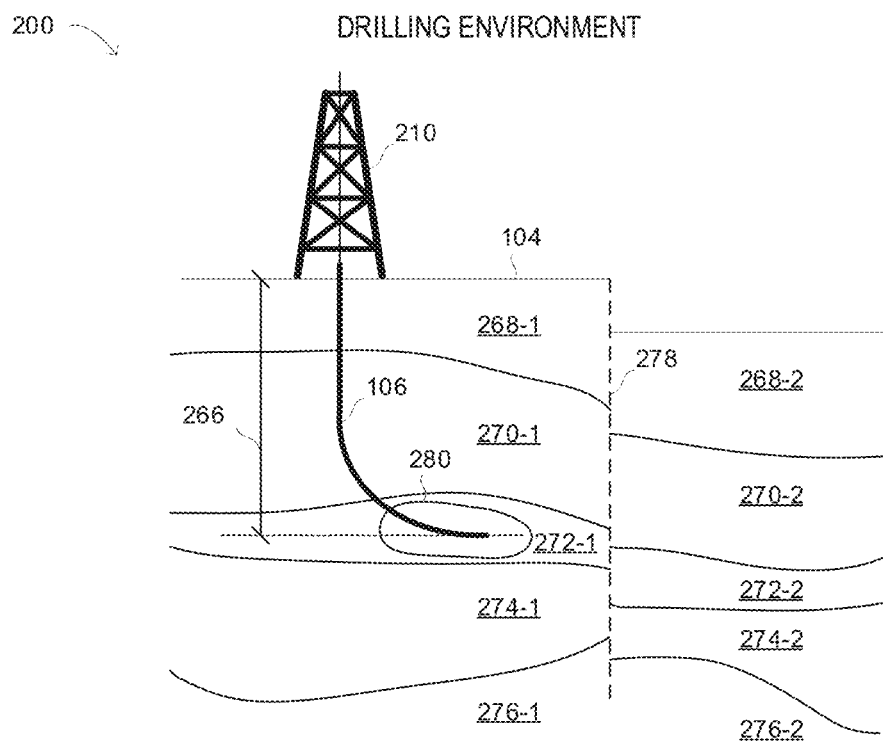
FIG. 2 is a depiction of a drilling environment including the drilling system for drilling a borehole.

Referring now to FIG. 2, a drilling environment 200 is depicted schematically and is not drawn to scale or perspective. In particular, drilling environment 200 may illustrate additional details with respect to formation 102 below the surface 104 in drilling system 100 shown in FIG. 1. In FIG. 2, drilling rig 210 may represent various equipment discussed above with respect to drilling system 100 in FIG. 1 that is located at the surface 104.

In drilling environment 200, it may be assumed that a drill plan (also referred to as a well plan) has been formulated to drill borehole 106 extending into the ground to a true vertical depth (TVD) 266 and penetrating several subterranean strata layers. Borehole 106 is shown in FIG. 2 extending through strata layers 268-1 and 270-1, while terminating in strata layer 272-1. Accordingly, as shown, borehole 106 does not extend or reach underlying strata layers 274-1 and 276-1. A target area 280 specified in the drill plan may be located in strata layer 272-1 as shown in FIG. 2. Target area 280 may represent a desired endpoint of borehole 106, such as a hydrocarbon producing area indicated by strata layer 272-1. It is noted that target area 280 may be of any shape and size and may be defined using various different methods and information in different embodiments. In some instances, target area 280 may be specified in the drill plan using subsurface coordinates, or references to certain markers, which indicate where borehole 106 is to be terminated. In other instances, target area may be specified in the drill plan using a depth range within which borehole 106 is to remain.

For example, the depth range may correspond to strata layer 272-1. In other examples, target area 280 may extend as far as can be realistically drilled. For example, when borehole 106 is specified to have a horizontal section with a goal to extend into strata layer 172 as far as possible, target area 280 may be defined as strata layer 272-1 itself and drilling may continue until some other physical limit is reached, such as a property boundary or a physical limitation to the length of the drill string.

Also visible in FIG. 2 is a fault line 278 that has resulted in a subterranean discontinuity in the fault structure. Specifically, strata layers 268, 270, 272, 274, and 276 have portions on either side of fault line 278. On one side of fault line 278, where borehole 106 is located, strata layers 268-1, 270-1, 272-1, 274-1, and 276-1 are unshifted by fault line 278. On the other side of fault line 278, strata layers 268-2, 270-3, 272-3, 274-3, and 276-3 are shifted downwards by fault line 278.

Current drilling operations frequently include directional drilling to reach a target, such as target area 280. The use of directional drilling has been found to generally increase an overall amount of production volume per well, but also may lead to significantly higher production rates per well, which are both economically desirable. As shown in FIG. 2, directional drilling may be used to drill the horizontal portion of borehole 106, which increases an exposed length of borehole 106 within strata layer 272-1, and which may accordingly be beneficial for hydrocarbon extraction from strata layer 272-1. Directional drilling may also be used alter an angle of borehole 106 to accommodate subterranean faults, such as indicated by fault line 278 in FIG. 2. Other benefits that may be achieved using directional drilling include sidetracking off of an existing well to reach a different target area or a missed target area, drilling around abandoned drilling equipment, drilling into otherwise inaccessible or difficult to reach locations (e.g., under populated areas or bodies of water), providing a relief well for an existing well, and increasing the capacity of a well by branching off and having multiple boreholes extending in different directions or at different vertical positions for the same well. Directional drilling is often not limited to a straight horizontal borehole 106 but may involve staying within a strata layer that varies in depth and thickness as illustrated by strata layer 172. As such, directional drilling may involve multiple vertical adjustments that complicate the trajectory of borehole 106.

Figure 3:
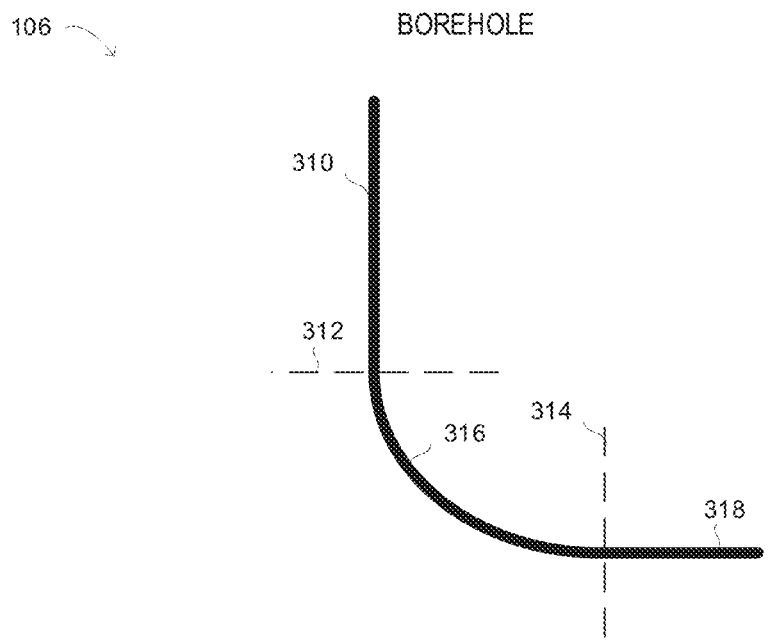
FIG. 3 is a depiction of a borehole generated in the drilling environment.

Referring now to FIG. 3, one embodiment of a portion of borehole 106 is shown in further detail. Using directional drilling for horizontal drilling may introduce certain challenges or difficulties that may not be observed during vertical drilling of borehole 106. For example, a horizontal portion 318 of borehole 106 may be started from a vertical portion 310. In order to make the transition from vertical to horizontal, a curve may be defined that specifies a so-called "build up" section 316. Build up section 316 may begin at a kickoff point 312 in vertical portion 310 and may end at a begin point 314 of horizontal portion 318. The change in inclination in buildup section 316 per measured length drilled is referred to herein as a "build rate" and may be defined in degrees per one hundred feet drilled. For example, the build rate may have a value of 6°/100 ft., indicating that there is a six-degree change in inclination for everyone hundred feet drilled. The build rate for a particular build up section may remain relatively constant or may vary.

The build rate used for any given build up section may depend on various factors, such as properties of the formation (i.e., strata layers) through which borehole 106 is to be drilled, the trajectory of borehole 106, the particular pipe and drill collars/BHA components used (e.g., length, diameter, flexibility, strength, mud motor bend setting, and drill bit), the mud type and flow rate, the specified horizontal displacement, stabilization, and inclination, among other factors. An overly aggressive built rate can cause problems such as severe doglegs (e.g., sharp changes in direction in the borehole) that may make it difficult or impossible to run casing or perform other operations in borehole 106. Depending on the severity of any mistakes made during directional drilling, borehole 106 may be enlarged or drill bit 146 may be backed out of a portion of borehole 106 and redrilled along a different path. Such mistakes may be undesirable due to the additional time and expense involved. However, if the built rate is too cautious, additional overall time may be added to the drilling process because directional drilling generally involves a lower ROP than straight drilling. Furthermore, directional drilling for a curve is more complicated than vertical drilling and the possibility of drilling errors increases with directional drilling (e.g., overshoot and undershoot that may occur while trying to keep drill bit 148 on the planned trajectory).

Two modes of drilling, referred to herein as "rotating" and "sliding," are commonly used to form a borehole 106. Rotating, also called "rotary drilling," uses top drive 140 or rotary table 162 to rotate drill string 146. Rotating may be used when drilling occurs along a straight trajectory, such as for vertical portion 310 of borehole 106. Sliding, also called "steering" or "directional drilling" as noted above, typically uses a mud motor located downhole at BHA 149. The mud motor may have an adjustable bent housing and is not powered by rotation of the drill string. Instead, the mud motor uses hydraulic power derived from the pressurized drilling mud that circulates along borehole 106 to and from the surface 104 to directionally drill borehole 106 in buildup section 316.

Thus, sliding is used in order to control the direction of the well trajectory during directional drilling. A method to perform a slide may include the following operations. First, during vertical or straight drilling, the rotation of drill string 146 is stopped. Based on feedback from measuring equipment, such as from downhole tool 166, adjustments may be made to drill string 146, such as using top drive 140 to apply various combinations of torque, WOB, and vibration, among other adjustments. The adjustments may continue until a toolface is confirmed that indicates a direction of the bend of the mud motor is oriented to a direction of a desired deviation (i.e., build rate) of borehole 106. Once the desired orientation of the mud motor is attained, WOB to the drill bit is increased, which causes the drill bit to move in the desired direction of deviation. Once sufficient distance and angle have been built up in the curved trajectory, a transition back to rotating mode can be accomplished by rotating the drill string again. The rotation of the drill string after sliding may neutralize the directional deviation caused by the bend in the mud motor due to the continuous rotation around a centerline of borehole 106.

Figure 4:
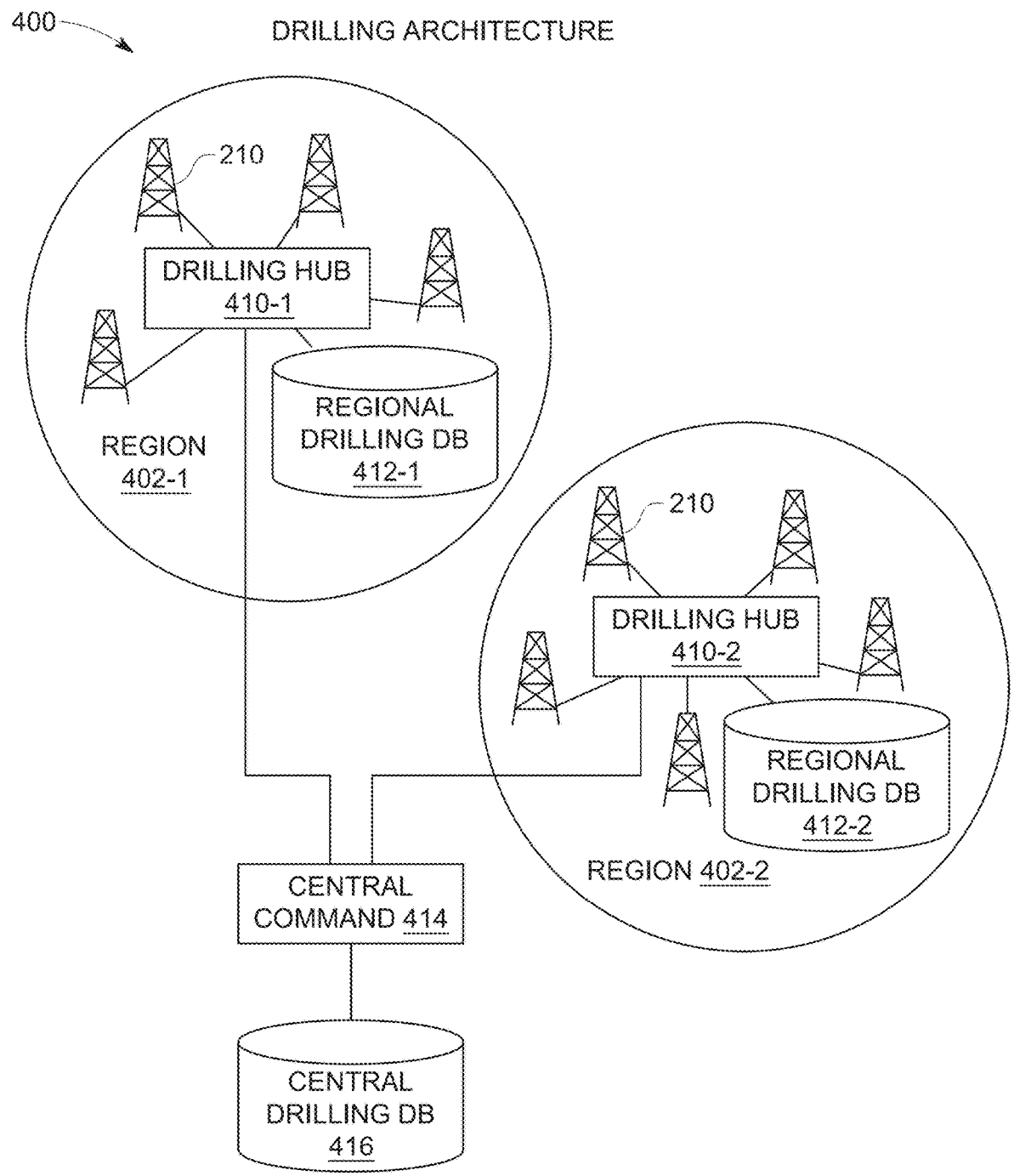
FIG. 4 is a depiction of a drilling architecture including the drilling environment.

Referring now to FIG. 4, a drilling architecture 400 is illustrated in diagram form. As shown, drilling architecture 400 depicts a hierarchical arrangement of drilling hubs 410 and a central command 414, to support the operation of a plurality of drilling rigs 210 in different regions 402. Specifically, as described above with respect to FIGS. 1 and 2, drilling rig 210 includes steering control system 168 that is enabled to perform various drilling control operations locally to drilling rig 210. When steering control system 168 is enabled with network connectivity, certain control operations or processing may be requested or queried by steering control system 168 from a remote processing resource. As shown in FIG. 4, drilling hubs 410 represent a remote processing resource for steering control system 168 located at respective regions 402, while central command 414 may represent a remote processing resource for both drilling hub 410 and steering control system 168.

Specifically, in a region 401-1, a drilling hub 410-1 may serve as a remote processing resource for drilling rigs 210 located in region 401-1, which may vary in number and are not limited to the exemplary schematic illustration of FIG. 4. Additionally, drilling hub 410-1 may have access to a regional drilling DB 412-1, which may be local to drilling hub 410-1. Additionally, in a region 401-2, a drilling hub 410-2 may serve as a remote processing resource for drilling rigs 210 located in region 401-2, which may vary in number and are not limited to the exemplary schematic illustration of FIG. 4. Additionally, drilling hub 410-2 may have access to a regional drilling DB 412-2, which may be local to drilling hub 410-2.

In FIG. 4, respective regions 402 may exhibit the same or similar geological formations. Thus, reference wells, or offset wells, may exist in a vicinity of a given drilling rig 210 in region 402, or where a new well is planned in region 402. Furthermore, multiple drilling rigs 210 may be actively drilling concurrently in region 402 and may be in different stages of drilling through the depths of formation strata layers at region 402. Thus, for any given well being drilled by drilling rig 210 in a region 402, survey data from the reference wells or offset wells may be used to create the drill plan and may be used for improved drilling performance. In some implementations, survey data or reference data from a plurality of reference wells may be used to improve drilling performance, such as by reducing an error in estimating TVD or a position of BHA 149 relative to one or more strata layers, as will be described in further detail herein. Additionally, survey data from recently drilled wells, or wells still currently being drilled, including the same well, may be used for reducing an error in estimating TVD or a position of BHA 149 relative to one or more strata layers.

Also shown in FIG. 4 is central command 414, which has access to central drilling DB 416, and may be located at a centralized command center that is in communication with drilling hubs 410 and drilling rigs 210 in various regions 402. The centralized command center may have the ability to monitor drilling and equipment activity at any one or more drilling rigs 210. In some embodiments, central command 414 and drilling hubs 412 may be operated by a commercial operator of drilling rigs 210 as a service to customers who have hired the commercial operator to drill wells and provide other drilling-related services.

In FIG. 4, it is particularly noted that central drilling DB 416 may be a central repository that is accessible to drilling hubs 410 and drilling rigs 210. Accordingly, central drilling DB 416 may store information for various drilling rigs 210 in different regions 402. In some embodiments, central drilling DB 416 may serve as a backup for at least one regional drilling DB 412 or may otherwise redundantly store information that is also stored on at least one regional drilling DB 412. In turn, regional drilling DB 412 may serve as a backup or redundant storage for at least one drilling rig 210 in region 402. For example, regional drilling DB 412 may store information collected by steering control system 168 from drilling rig 210.

In some embodiments, the formulation of a drill plan for drilling rig 210 may include processing and analyzing the collected data in regional drilling DB 412 to create a more effective drill plan. Furthermore, once the drilling has begun, the collected data may be used in conjunction with current data from drilling rig 210 to improve drilling decisions. As noted, the functionality of steering control system 168 may be provided at drilling rig 210, or may be provided, at least in part, at a remote processing resource, such as drilling hub 410 or central command 414.

As noted, steering control system 168 may provide functionality as a surface steerable system for controlling drilling rig 210. Steering control system 168 may have access to regional drilling DB 412 and central drilling DB 416 to provide the surface steerable system functionality. As will be described in greater detail below, steering control system 168 may be used to plan and control drilling operations based on input information, including feedback from the drilling process itself. Steering control system 168 may be used to perform operations such as receiving drilling data representing a drill trajectory and other drilling parameters, calculating a drilling solution for the drill trajectory based on the received data and other available data (e.g., rig characteristics), implementing the drilling solution at drilling rig 210, monitoring the drilling process to gauge whether the drilling process is within a margin of error that is defined for the drill trajectory, or calculating corrections for the drilling process if the drilling process is outside of the margin of error.

Figure 5:
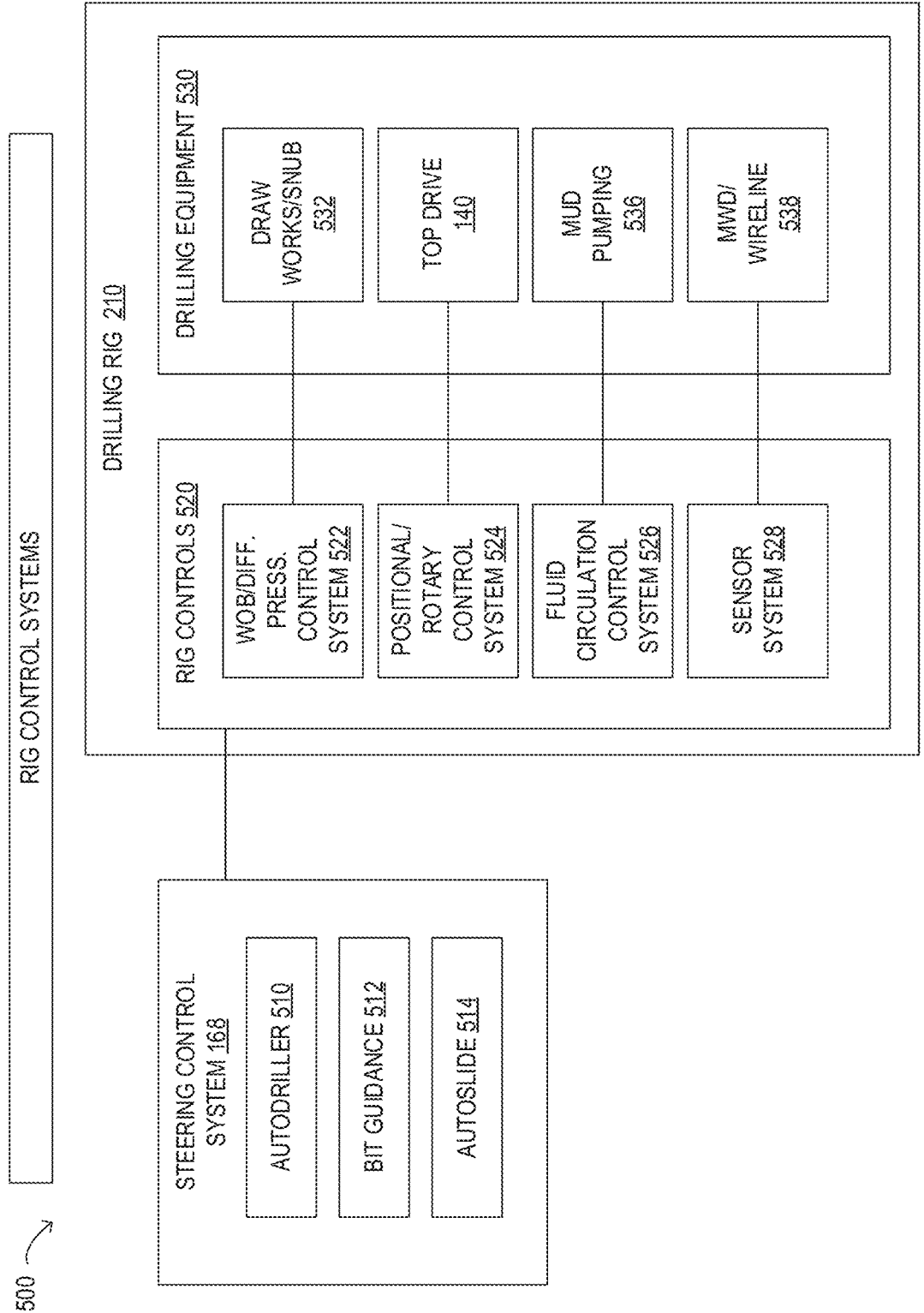
FIG. 5 is a depiction of rig control systems included in the drilling system.

Referring now to FIG. 5, an example of rig control systems 500 is illustrated in schematic form. It is noted that rig control systems 500 may include fewer or more elements than shown in FIG. 5 in different embodiments. As shown, rig control systems 500 includes steering control system 168 and drilling rig 210. Specifically, steering control system 168 is shown with logical functionality including an autodriller 510, a bit guidance 512, and an autoslide 514. Drilling rig 210 is hierarchically shown including rig controls 520, which provide secure control logic and processing capability, along with drilling equipment 530, which represents the physical equipment used for drilling at drilling rig 210. As shown, rig controls 520 include WOB/differential pressure control system 522, positional/rotary control system 524, fluid circulation control system 526, and sensor system 528, while drilling equipment 530 includes a draw works/snub 532, top drive 140, mud pumping equipment 536, and MWD/wireline equipment 538.

Figure 10:
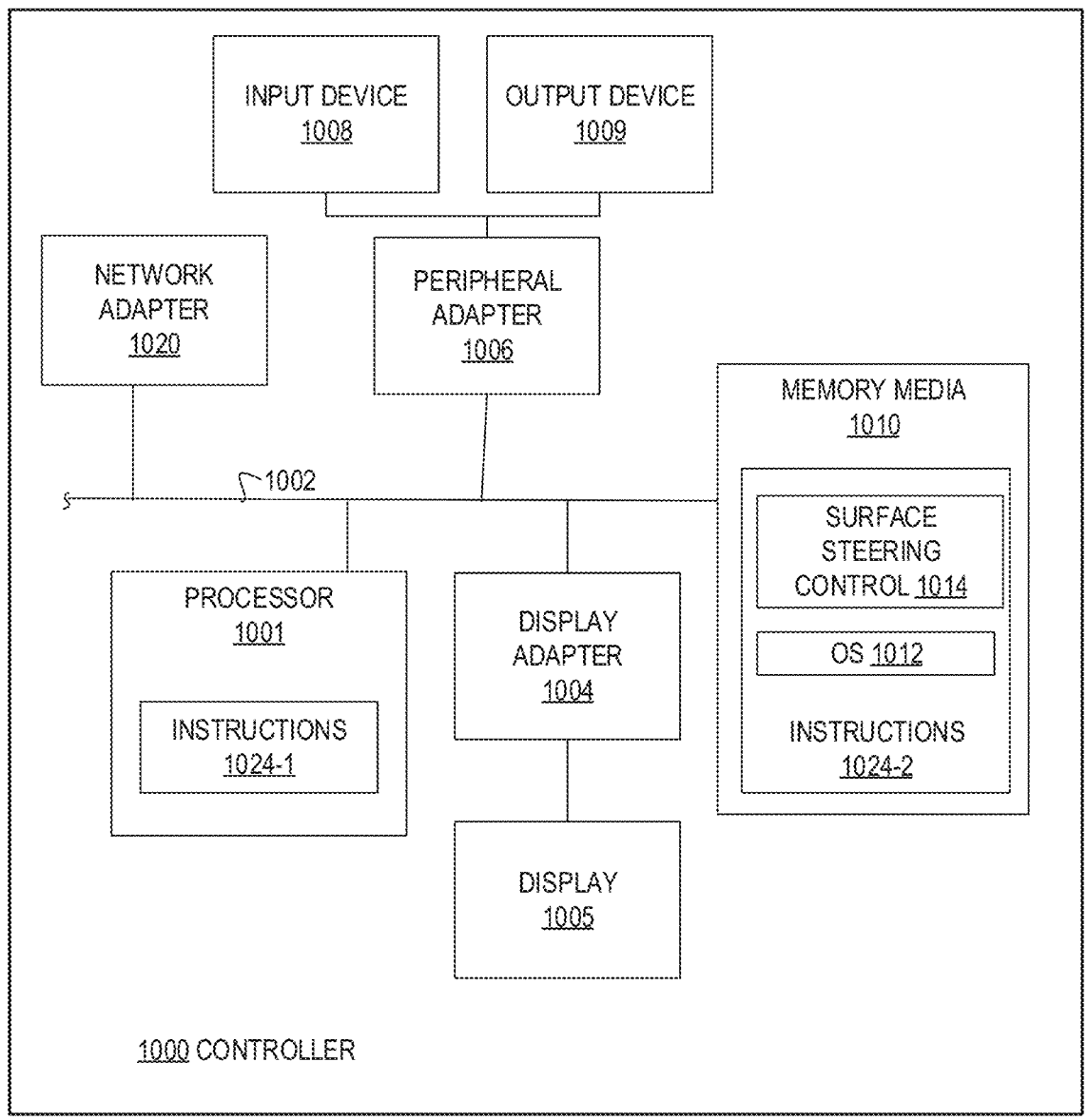
FIG. 10 is a depiction of a controller usable by the rig control systems.

Steering control system 168 represent an instance of a processor having an accessible memory storing instructions executable by the processor, such as an instance of controller 1000 shown in FIG. 10. Also, WOB/differential pressure control system 522, positional/rotary control system 524, and fluid circulation control system 526 may each represent an instance of a processor having an accessible memory storing instructions executable by the processor, such as an instance of controller 1000 shown in FIG. 10, but for example, in a configuration as a programmable logic controller (PLC) that may not include a user interface but may be used as an embedded controller. Accordingly, it is noted that each of the systems included in rig controls 520 may be a separate controller, such as a PLC, and may autonomously operate, at least to a degree. Steering control system 168 may represent hardware that executes instructions to implement a surface steerable system that provides feedback and automation capability to an operator, such as a driller. For example, steering control system 168 may cause autodriller 510, bit guidance 512 (also referred to as a bit guidance system (BGS)), and autoslide 514 (among others, not shown) to be activated and executed at an appropriate time during drilling. In particular implementations, steering control system 168 may be enabled to provide a user interface during drilling, such as the user interface 850 depicted and described below with respect to FIG. 8. Accordingly, steering control system 168 may interface with rig controls 520 to facilitate manual, assisted manual, semi-automatic, and automatic operation of drilling equipment 530 included in drilling rig 210. It is noted that rig controls 520 may also accordingly be enabled for manual or user-controlled operation of drilling and may include certain levels of automation with respect to drilling equipment 530.

In rig control systems 500 of FIG. 5, WOB/differential pressure control system 522 may be interfaced with draw works/snubbing unit 532 to control WOB of drill string 146. Positional/rotary control system 524 may be interfaced with top drive 140 to control rotation of drill string 146. Fluid circulation control system 526 may be interfaced with mud pumping equipment 536 to control mud flow and may also receive and decode mud telemetry signals. Sensor system 528 may be interfaced with MWD/wireline equipment 538, which may represent various BHA sensors and instrumentation equipment, among other sensors that may be downhole or at the surface.

In rig control systems 500, autodriller 510 may represent an automated rotary drilling system and may be used for controlling rotary drilling. Accordingly, autodriller 510 may enable automate operation of rig controls 520 during rotary drilling, as indicated in the drill plan. Bit guidance 512 may represent an automated control system to monitor and control performance and operation drilling bit 148.

In rig control systems 500, autoslide 514 may represent an automated slide drilling system and may be used for controlling slide drilling. Accordingly, autoslide 514 may enable automate operation of rig controls 520 during a slide and may return control to steering control system 168 for rotary drilling at an appropriate time, as indicated in the drill plan. In particular implementations, autoslide 514 may be enabled to provide a user interface during slide drilling to specifically monitor and control the slide. For example, autoslide 514 may rely on bit guidance 512 for orienting a toolface and on autodriller 510 to set WOB or control rotation or vibration of drill string 146.

Figure 6:
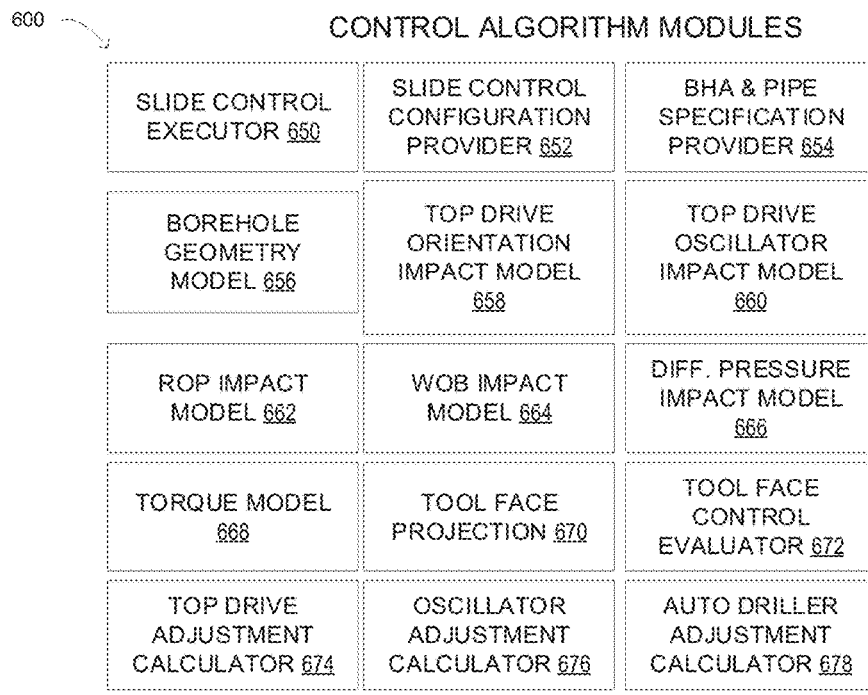
FIG. 6 is a depiction of algorithm modules used by the rig control systems.

FIG. 6 illustrates one embodiment of control algorithm modules 600 used with steering control system 168. The control algorithm modules 600 of FIG. 6 include: a slide control executor 650 that is responsible for managing the execution of the slide control algorithms; a slide control configuration provider 652 that is responsible for validating, maintaining, and providing configuration parameters for the other software modules; a BHA & pipe specification provider 654 that is responsible for managing and providing details of BHA 149 and drill string 146 characteristics; a borehole geometry model 656 that is responsible for keeping track of the borehole geometry and providing a representation to other software modules; a top drive orientation impact model 658 that is responsible for modeling the impact that changes to the angular orientation of top drive 140 have had on the toolface control; a top drive oscillator impact model 660 that is responsible for modeling the impact that oscillations of top drive 140 has had on the toolface control; an ROP impact model 662 that is responsible for modeling the effect on the toolface control of a change in ROP or a corresponding ROP set point; a WOB impact model 664 that is responsible for modeling the effect on the toolface control of a change in WOB or a corresponding WOB set point; a differential pressure impact model 666 that is responsible for modeling the effect on the toolface control of a change in differential pressure (DP) or a corresponding DP set point; a torque model 668 that is responsible for modeling the comprehensive representation of torque for surface, downhole, break over, and reactive torque, modeling impact of those torque values on toolface control, and determining torque operational thresholds; a toolface control evaluator 672 that is responsible for evaluating all factors impacting toolface control and whether adjustments need to be projected, determining whether re-alignment off-bottom is indicated, and determining off-bottom toolface operational threshold windows; a toolface projection 670 that is responsible for projecting toolface behavior for top drive 140, the top drive oscillator, and auto driller adjustments; a top drive adjustment calculator 674 that is responsible for calculating top drive adjustments resultant to toolface projections; an oscillator adjustment calculator 676 that is responsible for calculating oscillator adjustments resultant to toolface projections; and an auto-driller adjustment calculator 678 that is responsible for calculating adjustments to autodriller 510 resultant to toolface projections.

Figure 7:
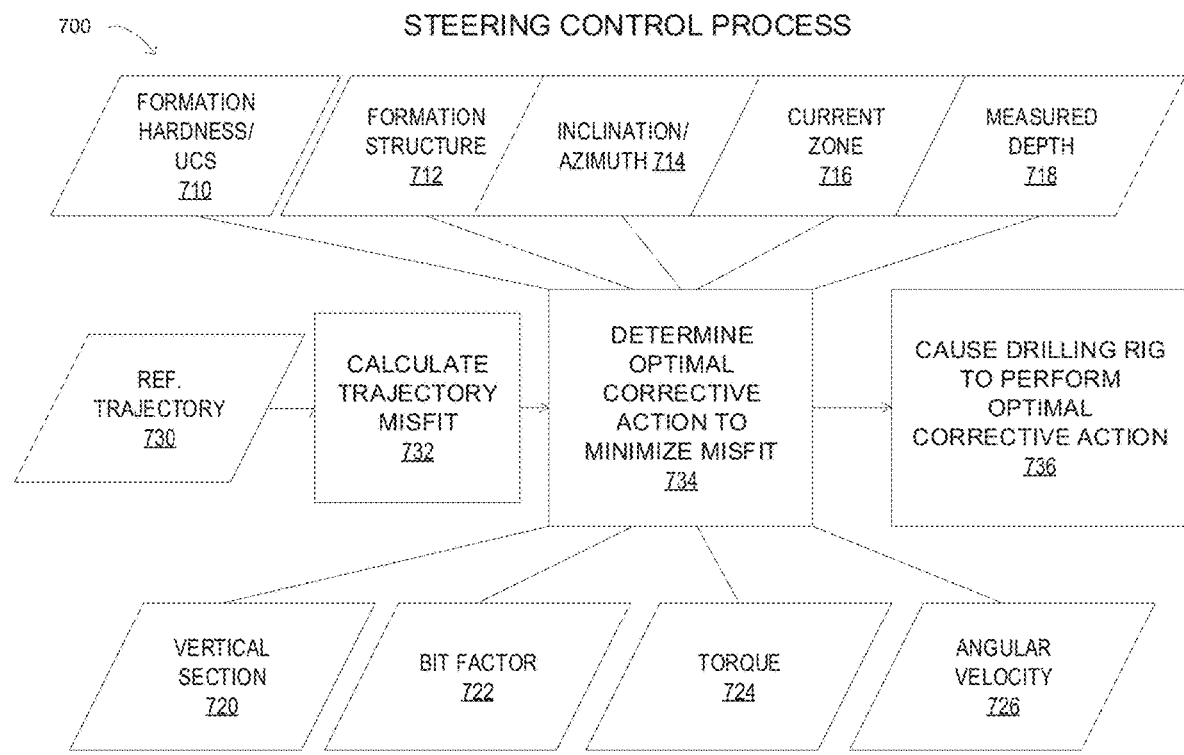
FIG. 7 is a depiction of a steering control process used by the rig control systems.

FIG. 7 illustrates one embodiment of a steering control process 700 for determining an optimal corrective action for drilling. Steering control process 700 may be used for rotary drilling or slide drilling in different embodiments.

Steering control process 700 in FIG. 7 illustrates a variety of inputs that can be used to determine an optimum corrective action. As shown in FIG. 7, the inputs include formation hardness/unconfined compressive strength (UCS) 710, formation structure 712, inclination/azimuth 714, current zone 716, measured depth 718, desired toolface 730, vertical section 720, bit factor 722, mud motor torque 724, reference trajectory 730, and angular velocity 726. In FIG. 7, reference trajectory 730 of borehole 106 is determined to calculate a trajectory misfit in a step 732. Step 732 may output the trajectory misfit to determine an optimal corrective action to minimize the misfit at step 734, which may be performed using the other inputs described above. Then, at step 736, the drilling rig is caused to perform the optimal corrective action.

It is noted that in some implementations, at least certain portions of steering control process 700 may be automated or performed without user intervention, such as using rig control systems 700 (see FIG. 7). In other implementations, the optimal corrective action in step 736 may be provided or communicated (by display, SMS message, email, or otherwise) to one or more human operators, who may then take appropriate action. The human operators may be members of a rig crew, which may be located at or near drilling rig 210 or may be located remotely from drilling rig 210.

Figure 8:
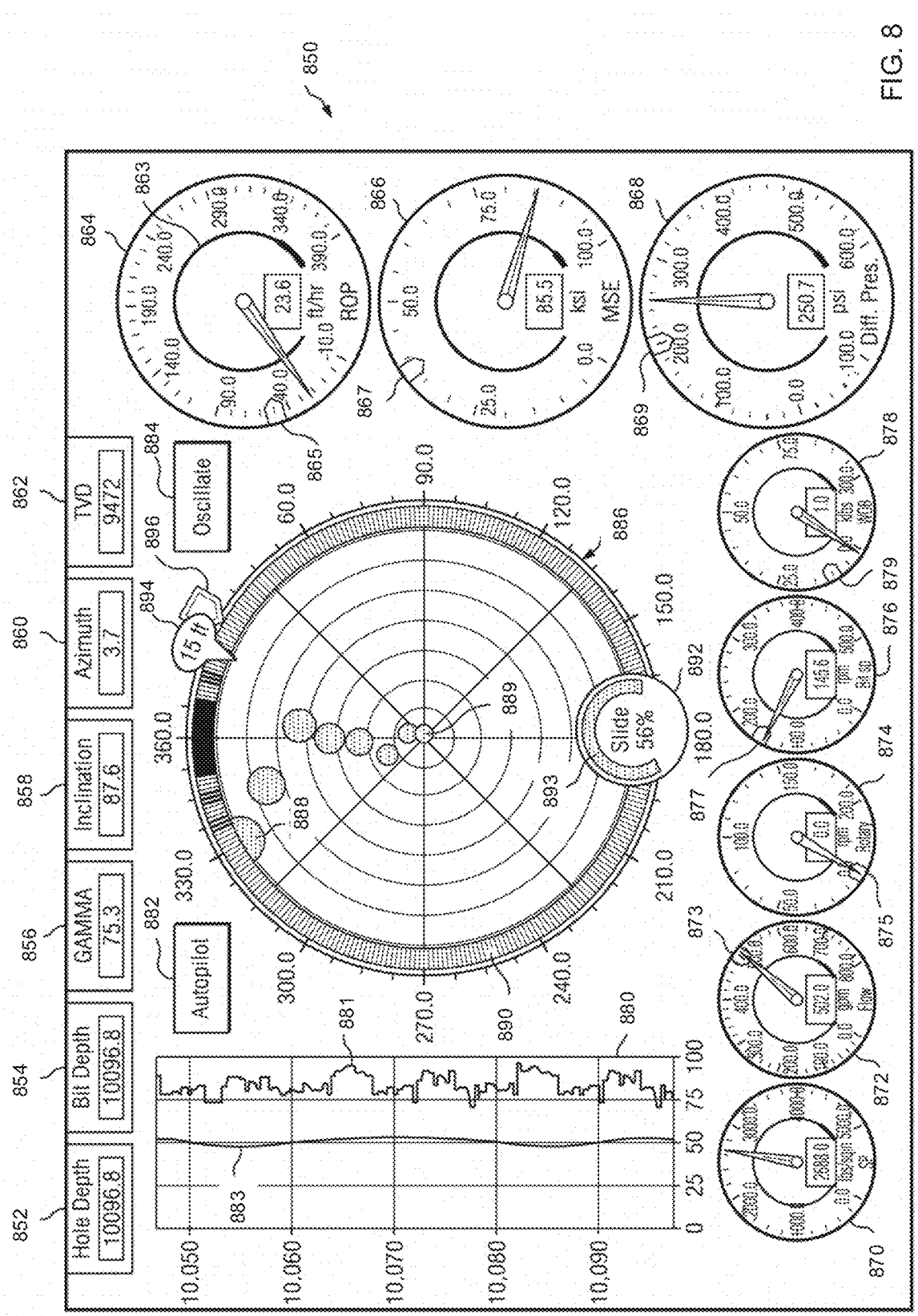
FIG. 8 is a depiction of a graphical user interface provided by the rig control systems.

Referring to FIG. 8, one embodiment of a user interface 850 that may be generated by steering control system 168 for monitoring and operation by a human operator is illustrated. User interface 850 may provide many different types of information in an easily accessible format. For example, user interface 850 may be shown on a computer monitor, a television, a viewing screen (e.g., a display device) associated with steering control system 168. In some embodiments, at least certain portions of user interface 850 may be displayed to and operated by a user of steering control system 168 on a mobile device, such as a tablet or a smartphone (see also FIG. 10). For example, steering control system 168 may support mobile applications that enable user interface 850, or other user interfaces, to be used on the mobile device, for example, within a vicinity of drilling rig 210.

As shown in FIG. 8, a user interface 850 provides visual indicators such as a hole depth indicator 852, a bit depth indicator 854, a GAMMA indicator 856, an inclination indicator 858, an azimuth indicator 860, and a TVD indicator 862. Other indicators may also be provided, including a ROP indicator 864, a mechanical specific energy (MSE) indicator 866, a differential pressure indicator 868, a standpipe pressure indicator 870, a flow rate indicator 872, a rotary RPM (angular velocity) indicator 874, a bit speed indicator 876, and a WOB indicator 878.

In FIG. 8, at least some of indicators 864, 866, 868, 870, 872, 874, 876, and 878 may include a marker representing a target value. For example, markers may be set as certain given values, but it is noted that any desired target value may be used. Although not shown, in some embodiments, multiple markers may be present on a single indicator. The markers may vary in color or size. For example, ROP indicator 864 may include a marker 865 indicating that the target value is 50 feet/hour (or 15 miles/hour). MSE indicator 866 may include a marker 867 indicating that the target value is 37 kilograms per square inch (ksi) (or 255 MPa). Differential pressure indicator 868 may include a marker 869 indicating that the target value is 200 pounds per square inch (psi) (or 1,380 kilo Pascal (kPa)). ROP indicator 864 may include a marker 865 indicating that the target value is 50 feet/hour (or 15 miles/hour). Standpipe pressure indicator 870 may have no marker in the present example. Flow rate indicator 872 may include a marker 873 indicating that the target value is 500 gallons per minute (gpm) (or 31.5 liters per second (L/s)). Rotary RPM indicator 874 may include a marker 875 indicating that the target value is 0 RPM (e.g., due to sliding). Bit speed indicator 876 may include a marker 877 indicating that the target value is 150 RPM. WOB indicator 878 may include a marker 879 indicating that the target value is 10 klbs (or 4,500 kg). Each indicator may also include a colored band, or another marking, to indicate, for example, whether the respective gauge value is within a safe range (e.g., indicated by a green color), within a caution range (e.g., indicated by a yellow color), or within a danger range (e.g., indicated by a red color).

In FIG. 8, a log chart 880 may visually indicate depth versus one or more measurements (e.g., may represent log inputs relative to a progressing depth chart). For example, log chart 880 may have a Y-axis representing depth and an X-axis representing a measurement such as GAMMA count 881 (as shown), ROP 883 (e.g., empirical ROP and normalized ROP), or resistivity. An autopilot button 882 and an oscillate button 884 may be used to control activity. For example, autopilot button 882 may be used to engage or disengage autodriller 510, while oscillate button 884 may be used to directly control oscillation of drill string 146 or to engage/disengage an external hardware device or controller.

In FIG. 8, a circular chart 886 may provide current and historical toolface orientation information (e.g., which way the bend is pointed). For purposes of illustration, circular chart 886 represents three hundred and sixty degrees. A series of circles within circular chart 886 may represent a timeline of toolface orientations, with the sizes of the circles indicating the temporal position of each circle. For example, larger circles may be more recent than smaller circles, so a largest circle 888 may be the newest reading and a smallest circle 889 may be the oldest reading. In other embodiments, circles 889, 888 may represent the energy or progress made via size, color, shape, a number within a circle, etc. For example, a size of a particular circle may represent an accumulation of orientation and progress for the period of time represented by the circle. In other embodiments, concentric circles representing time (e.g., with the outside of circular chart 886 being the most recent time and the center point being the oldest time) may be used to indicate the energy or progress (e.g., via color or patterning such as dashes or dots rather than a solid line).

In user interface 850, circular chart 886 may also be color coded, with the color coding existing in a band 890 around circular chart 886 or positioned or represented in other ways. The color coding may use colors to indicate activity in a certain direction. For example, the color red may indicate the highest level of activity, while the color blue may indicate the lowest level of activity. Furthermore, the arc range in degrees of a color may indicate the amount of deviation. Accordingly, a relatively narrow (e.g., thirty degrees) arc of red with a relatively broad (e.g., three hundred degrees) arc of blue may indicate that most activity is occurring in a particular toolface orientation with little deviation. As shown in user interface 850, the color blue may extend from approximately 22-337 degrees, the color green may extend from approximately 15-22 degrees and 337-345 degrees, the color yellow may extend a few degrees around the 13- and 345-degree marks, while the color red may extend from approximately 347-10 degrees. Transition colors or shades may be used with, for example, the color orange marking the transition between red and yellow or a light blue marking the transition between blue and green. This color coding may enable user interface 850 to provide an intuitive summary of how narrow the standard deviation is and how much of the energy intensity is being expended in the proper direction. Furthermore, the center of energy may be viewed relative to the target. For example, user interface 850 may clearly show that the target is at 90 degrees, but the center of energy is at 45 degrees.

In user interface 850, other indicators, such as a slide indicator 892, may indicate how much time remains until a slide occurs or how much time remains for a current slide. For example, slide indicator 892 may represent a time, a percentage (e.g., as shown, a current slide may be 56% complete), a distance completed, or a distance remaining. Slide indicator 892 may graphically display information using, for example, a colored bar 893 that increases or decreases with slide progress. In some embodiments, slide indicator 892 may be built into circular chart 886 (e.g., around the outer edge with an increasing/decreasing band), while in other embodiments slide indicator 892 may be a separate indicator such as a meter, a bar, a gauge, or another indicator type. In various implementations, slide indicator 892 may be refreshed by autoslide 514.

In user interface 850, an error indicator 894 may indicate a magnitude and a direction of error. For example, error indicator 894 may indicate that an estimated drill bit position is a certain distance from the planned trajectory, with a location of error indicator 894 around the circular chart 886 representing the heading. For example, FIG. 8 illustrates an error magnitude of 15 feet and an error direction of 15 degrees. Error indicator 894 may be any color but may be red for purposes of example. It is noted that error indicator 894 may present a zero if there is no error. Error indicator may represent that drill bit 148 is on the planned trajectory using other means, such as being a green color. Transition colors, such as yellow, may be used to indicate varying amounts of error. In some embodiments, error indicator 894 may not appear unless there is an error in magnitude or direction. A marker 896 may indicate an ideal slide direction. Although not shown, other indicators may be present, such as a bit life indicator to indicate an estimated lifetime for the current bit based on a value such as time or distance.

It is noted that user interface 850 may be arranged in many different ways. For example, colors may be used to indicate normal operation, warnings, and problems. In such cases, the numerical indicators may display numbers in one color (e.g., green) for normal operation, may use another color (e.g., yellow) for warnings, and may use yet another color (e.g., red) when a serious problem occurs. The indicators may also flash or otherwise indicate an alert. The gauge indicators may include colors (e.g., green, yellow, and red) to indicate operational conditions and may also indicate the target value (e.g., an ROP of 100 feet/hour). For example, ROP indicator 864 may have a green bar to indicate a normal level of operation (e.g., from 10-300 feet/hour), a yellow bar to indicate a warning level of operation (e.g., from 300-360 feet/hour), and a red bar to indicate a dangerous or otherwise out of parameter level of operation (e.g., from 360-390 feet/hour). ROP indicator 864 may also display a marker at 100 feet/hour to indicate the desired target ROP.

Furthermore, the use of numeric indicators, gauges, and similar visual display indicators may be varied based on factors such as the information to be conveyed and the personal preference of the viewer. Accordingly, user interface 850 may provide a customizable view of various drilling processes and information for a particular individual involved in the drilling process. For example, steering control system 168 may enable a user to customize the user interface 850 as desired, although certain features (e.g., standpipe pressure) may be locked to prevent a user from intentionally or accidentally removing important drilling information from user interface 850. Other features and attributes of user interface 850 may be set by user preference. Accordingly, the level of customization and the information shown by the user interface 850 may be controlled based on who is viewing user interface 850 and their role in the drilling process.

Figure 9:
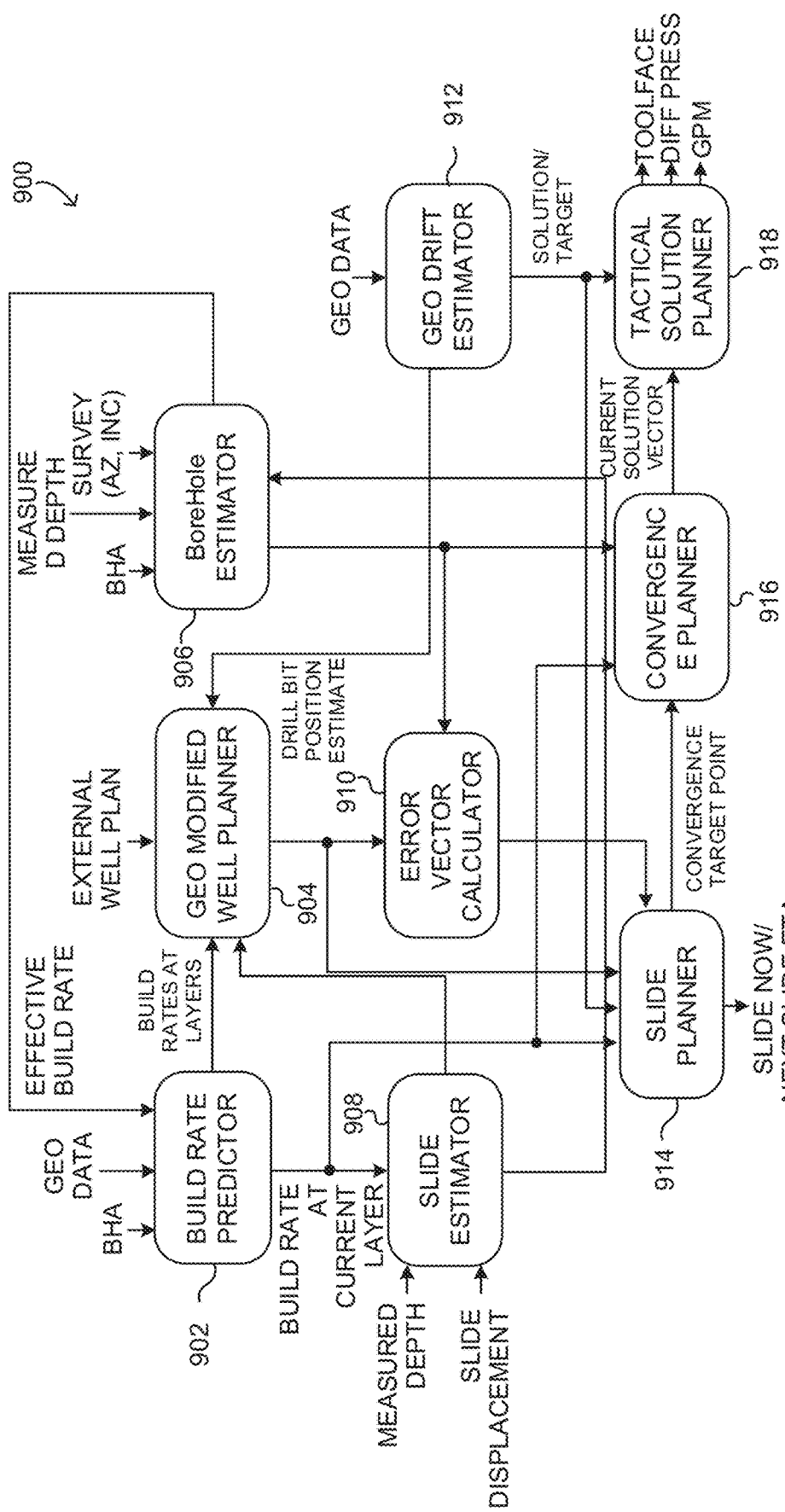
FIG. 9 is a depiction of a guidance control loop performed by the rig control systems.

Referring to FIG. 9, one embodiment of a guidance control loop (GCL) 900 is shown in further detail GCL 900 may represent one example of a control loop or control algorithm executed under the control of steering control system 168. GCL 900 may include various functional modules, including a build rate predictor 902, a geo modified well planner 904, a borehole estimator 906, a slide estimator 908, an error vector calculator 910, a geological drift estimator 912, a slide planner 914, a convergence planner 916, and a tactical solution planner 918. In the following description of GCL 900, the term "external input" refers to input received from outside GCL 900, while "internal input" refers to input exchanged between functional modules of GCL 900.

In FIG. 9, build rate predictor 902 receives external input representing BHA information and geological information, receives internal input from the borehole estimator 906, and provides output to geo modified well planner 904, slide estimator 908, slide planner 914, and convergence planner 916. Build rate predictor 902 is configured to use the BHA information and geological information to predict drilling build rates of current and future sections of borehole 106. For example, build rate predictor 902 may determine how aggressively a curve will be built for a given formation with BHA 149 and other equipment parameters.

In FIG. 9, build rate predictor 902 may use the orientation of BHA 149 to the formation to determine an angle of attack for formation transitions and build rates within a single layer of a formation. For example, if a strata layer of rock is below a strata layer of sand, a formation transition exists between the strata layer of sand and the strata layer of rock. Approaching the strata layer of rock at a 90-degree angle may provide a good toolface and a clean drill entry, while approaching the rock layer at a 45-degree angle may build a curve relatively quickly. An angle of approach that is near parallel may cause drill bit 148 to skip off the upper surface of the strata layer of rock. Accordingly, build rate predictor 902 may calculate BHA orientation to account for formation transitions. Within a single strata layer, build rate predictor 902 may use the BHA orientation to account for internal layer characteristics (e.g., grain) to determine build rates for different parts of a strata layer. The BHA information may include bit characteristics, mud motor bend setting, stabilization, and mud motor bit to bend distance. The geological information may include formation data such as compressive strength, thicknesses, and depths for formations encountered in the specific drilling location. Such information may enable a calculation-based prediction of the build rates and ROP that may be compared to both results obtained while drilling borehole 106 and regional historical results (e.g., from the regional drilling DB 412) to improve the accuracy of predictions as drilling progresses. Build rate predictor 902 may also be used to plan convergence adjustments and confirm in advance of drilling that targets can be achieved with current parameters.

In FIG. 9, geo modified well planner 904 receives external input representing a drill plan, internal input from build rate predictor 902 and geo drift estimator 912 and provides output to slide planner 914 and error vector calculator 910. Geo modified well planner 904 uses the input to determine whether there is a more optimal trajectory than that provided by the drill plan, while staying within specified error limits. More specifically, geo modified well planner 904 takes geological information (e.g., drift) and calculates whether another trajectory solution to the target may be more efficient in terms of cost or reliability. The outputs of geo modified well planner 904 to slide planner 914 and error vector calculator 910 may be used to calculate an error vector based on the current vector to the newly calculated trajectory and to modify slide predictions. In some embodiments, geo modified well planner 904 (or another module) may provide functionality needed to track a formation trend. For example, in horizontal wells, a geologist may provide steering control system 168 with a target inclination as a set point for steering control system 168 to control. For example, the geologist may enter a target to steering control system 168 of 90.5-91.0 degrees of inclination for a section of borehole 106. Geo modified well planner 904 may then treat the target as a vector target, while remaining within the error limits of the original drill plan. In some embodiments, geo modified well planner 904 may be an optional module that is not used unless the drill plan is to be modified. For example, if the drill plan is marked in steering control system 168 as non-modifiable, geo modified well planner 904 may be bypassed altogether or geo modified well planner 904 may be configured to pass the drill plan through without any changes.

In FIG. 9, borehole estimator 906 may receive external inputs representing BHA information, measured depth information, survey information (e.g., azimuth and inclination), and may provide outputs to build rate predictor 902, error vector calculator 910, and convergence planner 916. Borehole estimator 906 may be configured to provide an estimate of the actual borehole and drill bit position and trajectory angle without delay, based on either straight-line projections or projections that incorporate sliding. Borehole estimator 906 may be used to compensate for a sensor being physically located some distance behind drill bit 148 (e.g., 50 feet) in drill string 146, which makes sensor readings lag the actual bit location by 50 feet. Borehole estimator 906 may also be used to compensate for sensor measurements that may not be continuous (e.g., a sensor measurement may occur every 100 feet). Borehole estimator 906 may provide the most accurate estimate from the surface to the last survey location based on the collection of survey measurements. Also, borehole estimator 906 may take the slide estimate from slide estimator 908 (described below) and extend the slide estimate from the last survey point to a current location of drill bit 148. Using the combination of these two estimates, borehole estimator 906 may provide steering control system 168 with an estimate of the drill bit's location and trajectory angle from which guidance and steering solutions can be derived. An additional metric that can be derived from the borehole estimate is the effective build rate that is achieved throughout the drilling process.

In FIG. 9, slide estimator 908 receives external inputs representing measured depth and differential pressure information, receives internal input from build rate predictor 902, and provides output to borehole estimator 906 and geo modified well planner 904. Slide estimator 908 may be configured to sample toolface orientation, differential pressure, measured depth (MD) incremental movement, MSE, and other sensor feedback to quantify/estimate a deviation vector and progress while sliding.

Traditionally, deviation from the slide would be predicted by a human operator based on experience. The operator would, for example, use a long slide cycle to assess what likely was accomplished during the last slide. However, the results are generally not confirmed until the downhole survey sensor point passes the slide portion of the borehole, often resulting in a response lag defined by a distance of the sensor point from the drill bit tip (e.g., approximately 50 feet). Such a response lag may introduce inefficiencies in the slide cycles due to over/under correction of the actual trajectory relative to the planned trajectory.

In GCL 900, using slide estimator 908, each toolface update may be algorithmically merged with the average differential pressure of the period between the previous and current toolface readings, as well as the MD change during this period to predict the direction, angular deviation, and MD progress during the period. As an example, the periodic rate may be between 10 and 60 seconds per cycle depending on the toolface update rate of downhole tool 166. With a more accurate estimation of the slide effectiveness, the sliding efficiency can be improved. The output of slide estimator 908 may accordingly be periodically provided to borehole estimator 906 for accumulation of well deviation information, as well to geo modified well planner 904. Some or all of the output of the slide estimator 908 may be output to an operator, such as shown in the user interface 850 of FIG. 8.

In FIG. 9, error vector calculator 910 may receive internal input from geo modified well planner 904 and borehole estimator 906. Error vector calculator 910 may be configured to compare the planned well trajectory to an actual borehole trajectory and drill bit position estimate. Error vector calculator 910 may provide the metrics used to determine the error (e.g., how far off) the current drill bit position and trajectory are from the drill plan. For example, error vector calculator 910 may calculate the error between the current bit position and trajectory to the planned trajectory and the desired bit position. Error vector calculator 910 may also calculate a projected bit position/projected trajectory representing the future result of a current error.

In FIG. 9, geological drift estimator 912 receives external input representing geological information and provides outputs to geo modified well planner 904, slide planner 914, and tactical solution planner 918. During drilling, drift may occur as the particular characteristics of the formation affect the drilling direction. More specifically, there may be a trajectory bias that is contributed by the formation as a function of ROP and BHA 149. Geological drift estimator 912 is configured to provide a drift estimate as a vector that can then be used to calculate drift compensation parameters that can be used to offset the drift in a control solution.

In FIG. 9, slide planner 914 receives internal input from build rate predictor 902, geo modified well planner 904, error vector calculator 910, and geological drift estimator 912, and provides output to convergence planner 916 as well as an estimated time to the next slide. Slide planner 914 may be configured to evaluate a slide/drill ahead cost equation and plan for sliding activity, which may include factoring in BHA wear, expected build rates of current and expected formations, and the drill plan trajectory. During drill ahead, slide planner 914 may attempt to forecast an estimated time of the next slide to aid with planning. For example, if additional lubricants (e.g., fluorinated beads) are indicated for the next slide, and pumping the lubricants into drill string 146 has a lead time of 30 minutes before the slide, the estimated time of the next slide may be calculated and then used to schedule when to start pumping the lubricants. Functionality for a loss circulation material (LCM) planner may be provided as part of slide planner 914 or elsewhere (e.g., as a stand-alone module or as part of another module described herein). The LCM planner functionality may be configured to determine whether additives should be pumped into the borehole based on indications such as flow-in versus flow-back measurements. For example, if drilling through a porous rock formation, fluid being pumped into the borehole may get lost in the rock formation. To address this issue, the LCM planner may control pumping LCM into the borehole to clog up the holes in the porous rock surrounding the borehole to establish a more closed-loop control system for the fluid.

In FIG. 9, slide planner 914 may also look at the current position relative to the next connection. A passageway may happen every 90 to 100 feet (or some other distance or distance range based on the particulars of the drilling operation) and slide planner 914 may avoid planning a slide when close to a passageway or when the slide would carry through the connection. For example, if the slide planner 914 is planning a 50-foot slide but only 20 feet remain until the next connection, slide planner 914 may calculate the slide starting after the next passageway and make any changes to the slide parameters to accommodate waiting to slide until after the next connection. Such flexible implementation avoids inefficiencies that may be caused by starting the slide, stopping for the connection, and then having to reorient the toolface before finishing the slide. During slides, slide planner 914 may provide some feedback as to the progress of achieving the desired goal of the current slide. In some embodiments, slide planner 914 may account for reactive torque in the drill string. More specifically, when rotating is occurring, there is a reactional torque wind up in drill string 146. When the rotating is stopped, drill string 146 unwinds, which changes toolface orientation and other parameters. When rotating is started again, drill string 146 starts to wind back up. Slide planner 914 may account for the reactional torque so that toolface references are maintained, rather than stopping rotation and then trying to adjust to an optimal toolface orientation. While not all downhole tools may provide toolface orientation when rotating, using one that does supply such information for GCL 900 may significantly reduce the transition time from rotating to sliding.

In FIG. 9, convergence planner 916 receives internal inputs from build rate predictor 902, borehole estimator 906, and slide planner 914, and provides output to tactical solution planner 918. Convergence planner 916 is configured to provide a convergence plan when the current drill bit position is not within a defined margin of error of the planned well trajectory. The convergence plan represents a path from the current drill bit position to an achievable and optimal convergence target point along the planned trajectory. The convergence plan may take account the amount of sliding/ drilling ahead that has been planned to take place by slide planner 914. Convergence planner 916 may also use BHA orientation information for angle of attack calculations when determining convergence plans as described above with respect to build rate predictor 902. The solution provided by convergence planner 916 defines a new trajectory solution for the current position of drill bit 148. The solution may be immediate without delay or planned for implementation at a future time that is specified in advance.

In FIG. 9, tactical solution planner 918 receives internal inputs from geological drift estimator 912 and convergence planner 916 and provides external outputs representing information such as toolface orientation, differential pressure, and mud flow rate. Tactical solution planner 918 is configured to take the trajectory solution provided by convergence planner 916 and translate the solution into control parameters that can be used to control drilling rig 210. For example, tactical solution planner 918 may convert the solution into settings for control systems 522, 524, and 526 to accomplish the actual drilling based on the solution. Tactical solution planner 918 may also perform performance optimization to optimizing the overall drilling operation as well as optimizing the drilling itself (e.g., how to drill faster).

Other functionality may be provided by GCL 900 in additional modules or added to an existing module. For example, there is a relationship between the rotational position of the drill pipe on the surface and the orientation of the downhole toolface. Accordingly, GCL 900 may receive information corresponding to the rotational position of the drill pipe on the surface. GCL 900 may use this surface positional information to calculate current and desired toolface orientations. These calculations may then be used to define control parameters for adjusting the top drive 140 to accomplish adjustments to the downhole toolface in order to steer the trajectory of borehole 106.

For purposes of example, an object-oriented software approach may be utilized to provide a class-based structure that may be used with GCL 900, or other functionality provided by steering control system 168. In GCL 900, a drilling model class may be defined to capture and define the drilling state throughout the drilling process. The drilling model class may include information obtained without delay. The drilling model class may be based on the following components and sub-models: a drill bit model, a borehole model, a rig surface gear model, a mud pump model, a/differential pressure model, a positional/rotary model, an MSE model, an active drill plan, and control limits. The drilling model class may produce a control output solution and may be executed via a main processing loop that rotates through the various modules of GCL 900. The drill bit model may represent the current position and state of drill bit 148. The drill bit model may include a three-dimensional (3D) position, a drill bit trajectory, BHA information, bit speed, and toolface (e.g., orientation information). The 3D position may be specified in north-south (NS), east-west (EW), and true vertical depth (TVD). The drill bit trajectory may be specified as an inclination angle and an azimuth angle. The BHA information may be a set of dimensions defining the active BHA. The borehole model may represent the current path and size of the active borehole. The borehole model may include hole depth information, an array of survey points collected along the borehole path, a gamma log, and borehole diameters. The hole depth information is for current drilling of borehole 106. The borehole diameters may represent the diameters of borehole 106 as drilled over current drilling. The rig surface gear model may represent pipe length, block height, and other models, such as the mud pump model, WOB/differential pressure model, positional/ rotary model, and MSE model. The mud pump model represents mud pump equipment and includes flow rate, standpipe pressure, and differential pressure. The WOB/ differential pressure model represents draw works or other WOB/differential pressure controls and parameters, including WOB. The positional/rotary model represents top drive or other positional/rotary controls and parameters including rotary RPM and spindle position. The active drill plan represents the target borehole path and may include an external drill plan and a modified drill plan. The control limits represent defined parameters that may be set as maximums and/or minimums. For example, control limits may be set for the rotary RPM in the top drive model to limit the maximum RPMs to the defined level. The control output solution may represent the control parameters for drilling rig 210.

Each functional module of GCL 900 may have behavior encapsulated within a respective class definition. During a processing window, the individual functional modules may have an exclusive portion in time to execute and update the drilling model. For purposes of example, the processing order for the functional modules may be in the sequence of geo modified well planner 904, build rate predictor 902, slide estimator 908, borehole estimator 906, error vector calculator 910, slide planner 914, convergence planner 916, geological drift estimator 912, and tactical solution planner 918. It is noted that other sequences may be used in different implementations.

In FIG. 9, GCL 900 may rely on a programmable timer module that provides a timing mechanism to provide timer event signals to drive the main processing loop. While steering control system 168 may rely on timer and date calls driven by the programming environment, timing may be obtained from other sources than system time. In situations where it may be advantageous to manipulate the clock (e.g., for evaluation and testing), a programmable timer module may be used to alter the system time. For example, the programmable timer module may enable a default time set to the system time and a time scale of 1.0, may enable the system time of steering control system 168 to be manually set, may enable the time scale relative to the system time to be modified, or may enable periodic event time requests scaled to a requested time scale.

Referring now to FIG. 10, a block diagram illustrating selected elements of an embodiment of a controller 1000 for performing steering methods and systems for improved drilling performance according to the present disclosure. In various embodiments, controller 1000 may represent an implementation of steering control system 168. In other embodiments, at least certain portions of controller 1000 may be used for control systems 510, 512, 514, 522, 524, and 526 (see FIG. 5).

In the embodiment depicted in FIG. 10, controller 1000 includes processor 1001 coupled via shared bus 1002 to storage media collectively identified as memory media 1010.

Controller 1000, as depicted in FIG. 10, further includes network adapter 1020 that interfaces controller 1000 to a network (not shown in FIG. 10). In embodiments suitable for use with user interfaces, controller 1000, as depicted in FIG. 10, may include peripheral adapter 1006, which provides connectivity for the use of input device 1008 and output device 1009. Input device 1008 may represent a device for user input, such as a keyboard or a mouse, or even a video camera. Output device 1009 may represent a device for providing signals or indications to a user, such as loudspeakers for generating audio signals.

Controller 1000 is shown in FIG. 10 including display adapter 1004 and further includes a display device 1005. Display adapter 1004 may interface shared bus 1002, or another bus, with an output port for one or more display devices, such as display device 1005. Display device 1005 may be implemented as a liquid crystal display screen, a computer monitor, a television, or the like. Display device 1005 may comply with a display standard for the corresponding type of display. Standards for computer monitors include analog standards such as video graphics array (VGA), extended graphics array (XGA), etc., or digital standards such as digital visual interface (DVI), definition multimedia interface (HDMI), among others. A television display may comply with standards such as NTSC (National Television System Committee), PAL (Phase Alternating Line), or another suitable standard. Display device 1005 may include an output device 1009, such as one or more integrated speakers to play audio content, or may include an input device 1008, such as a microphone or video camera.

In FIG. 10, memory media 1010 encompasses persistent and volatile media, fixed and removable media, and magnetic and semiconductor media. Memory media 1010 is operable to store instructions, data, or both. Memory media 1010 as shown includes sets or sequences of instructions 1024-2, namely, an operating system 1012 and steering control 1014. Operating system 1012 may be a UNIX or UNIX-like operating system, a Windows® family operating system, or another suitable operating system. Instructions 1024 may also reside, completely or at least partially, within processor 1001 during execution thereof. It is further noted that processor 1001 may be configured to receive instructions 1024-1 from instructions 1024-2 via shared bus 1002. In some embodiments, memory media 1010 is configured to store and provide executable instructions for executing GCL 900, as mentioned previously, among other methods and operations disclosed herein.

As noted previously, steering control system 168 may support the display and operation of various user interfaces, such as in a client/server architecture. For example, steering control 1014 may be enabled to support a web server for providing the user interface to a web browser client, such as on a mobile device or on a personal computer device. In another example, steering control 1014 may be enabled to support an app server for providing the user interface to a client app, such as on a mobile device or on a personal computer device. It is noted that in the web server or the app server architecture, surface steering control 1014 may handle various communications to rig controls 520 while simultaneously supporting the web browser client or the client app with the user interface.

Systems and Methods for Drilling a Geothermal Well

Geothermal energy is heat derived within the sub-surface of the earth. Heated fluids like water, brine, and/or steam can carry the geothermal energy to the Earth's surface. Depending on its characteristics, geothermal energy can be used for heating and cooling purposes or can be harnessed to generate clean electricity, such as by providing the heated fluid to a turbine generator. However, for electricity generation high or medium temperature resources are needed, which are usually located close to tectonically active regions.

Conventional geothermal power plants typically use hydrothermal resources that have both water (hydro) and heat (thermal). Such geothermal power plants typically require high-temperature (e.g., 300° F. to 700° F.) hydrothermal resources that come from either dry steam wells or from hot water wells. People use these resources by drilling wells into the earth and then piping steam or hot water to the surface. The hot water or steam can power a turbine that generates electricity. Some geothermal wells are as much as two miles deep.

There are three basic types of geothermal power plants: dry steam plants, flash steam plants, and binary cycle power plants. Dry steam plants use steam directly from a geothermal reservoir to turn generator turbines. Flash steam plants take high-pressure hot water from deep inside the earth and convert it to steam to drive generator turbines. When the steam cools, it condenses to water and is injected back into the ground to be used again. Most geothermal power plants are flash steam plants. Binary cycle power plants transfer the heat from geothermal hot water to another liquid. The heat causes the second liquid to turn to steam, which is used to drive a generator turbine.

Geothermal power generation can provide several advantages. Geothermal energy can be more environmentally friendly than conventional fuel sources. Geothermal energy can be a source of renewable energy. The number of exploitable geothermal resources is expected to increase with ongoing research and development in the industry. Geothermal energy is a sustainable source of energy that can be consistently available unlike some other renewable energy sources (e.g., wind and solar power). Geothermal energy can be a reliable source of energy and it can be easier to predict the power output from a geothermal plant with a high degree of accuracy. No additional fuel may be required for geothermal energy. New technologies are being created to improve the energy process as a result of increase in exploration. Geothermal energy production can result in much lower pollution levels as compared to fossil fuels.

A major disadvantage of geothermal energy is that it is location specific. For example, geothermal energy may be economic in places like Iceland, Alaska, and East Asia, but these locations have access to a shallow heat source. Deeper wells are required elsewhere and thus cost much more. Additional disadvantages can include the release of gasses into the atmosphere during digging. Some geothermal wells can present a risk of triggering earthquakes. Currently, geothermal energy can be expensive to exploit with high upfront costs ranging from around $2 million to $7 million for a plant with a 1-megawatt capacity. Another disadvantage can include that the energy fluid can be required to be pumped back into the underground reservoirs faster than it is depleted. Management can be required to maintain sustainability.

In order to offset various disadvantages and improve the efficiency of geothermal wells, several techniques and devices have been developed. These techniques can determine the most cost-effective way of exposing maximum circulation to maximum heat. These techniques can adapt existing oil and gas technologies for maximum benefit of geothermal energy systems. These techniques can reduce drilling time to a minimum while simultaneously maximizing heat production (and thus energy generation) over time.

Some current implementations of a geothermal well require the drilling of two vertical wells. One of the vertical wells can be used for injection and the other vertical well can be used for the recovery of the hot water or steam. However, the cost of drilling two vertical wells for use for geothermal power generation can be cost prohibitive, especially in location where a deeper well is required to access a geothermal heat source. Therefore, techniques that only require the drilling of a single vertical well that can be used for both injection and recovery would reduce drilling costs and be more economically feasible.

Figure 11A:
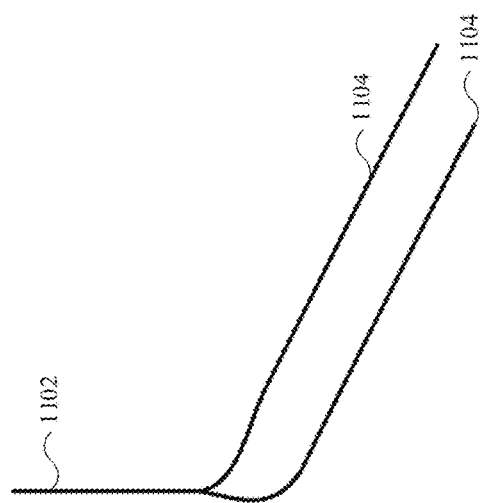
FIGS. 11A-11C illustrate various stages of an exemplary "radiator" well.

FIG. 11 illustrates various stages of an exemplary "radiator" well. In FIG. 11A, a vertical borehole 1102 can be drilled down to a target location (e.g., a target depth). The target location can be determined by geological surveys which indicate sufficient potential for sufficient heating to make geothermal energy production economically realistic. The target location can depend on location of the drilling site, the formation(s) to be drilled, and other considerations.

At the target location (e.g., a target depth), multiple lateral boreholes 1104 can be drilled. The lateral boreholes 1104 can be parallel to each other as shown in FIG. 11A. Any number of lateral boreholes 1104 can be drilled from the vertical portion 1102 of the well and this disclosure is not limited to two parallel lateral boreholes 1104 as shown in FIG. 11A. In one embodiment, one of the lateral boreholes 1104 can be used as the injector well and the other one of the lateral boreholes 1104 can be used as the recovery well. In alternative embodiments, three lateral boreholes 1104 can be drilled. In the case of three lateral boreholes 1104, a center or middle lateral borehole can be used as the recovery well and the outer lateral boreholes can both be used as an injector well. The lateral boreholes 1104 can be connected at one end to the vertical borehole 1102.

Figure 11B:
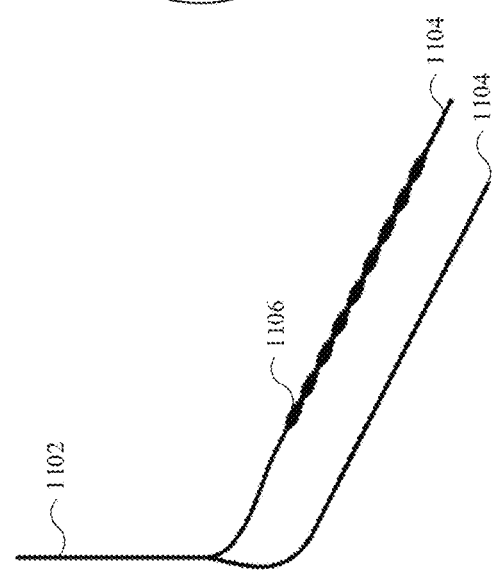

FIG. 11B illustrates chambering out a plurality of chamber points 1106 in one of the lateral boreholes. While there are nine chamber points 1106 illustrated in FIG. 11B, any number of chamber points 1106 may be generated in one of the lateral boreholes 1104. The generating of the chambers allows for drilling a passageway (or rung) from one of the lateral boreholes 1104 to a second lateral borehole. The generating of chambers allows for exposing the maximum possible area of rock to the circuit of water from the injectors. The chambering process can make the target hole larger and easier to drill. Moreover, the chambers 1106 make it easier to drill or generate the fluid pathways connecting the lateral wellbores 1104.

The process for generating the chambers 1106 can be done by at least one or more of targeted jetting techniques, applying acid slugs, washing out the chamber point 1106, or drilling with asymmetric drill bits, or combinations thereof. In various embodiments, the target points can be chambered out until a diameter at the target points of 36 inches. The chambering process allows for errors in positioning the passageway (or rungs). For example, at 50-foot separation between the first lateral borehole and the second lateral borehole, the diameter at the target point can be 1.5 foot across. This can allow for +/−1.7 degrees in error when drilling the fluid passageway (or rung). The distance between the two or more lateral portions can be more or less than 50 feet, such as 25 feet, 75 feet, 100 feet, or more.

In various embodiments, the generating of chambers 1106 comprises generating chambers having at least a predetermined diameter or shape. In various embodiments, the chamber points 1106 can be chambered out to form a pea-pod shape.

Drilling techniques can provide very accurate measured depth accuracy. For example, techniques can allow for vertical depth accuracy on the order of 0.2% or approximately 2 feet per 1000 feet depth. So, if the target depth was 20,000 feet, it should be relatively achievable using temperature connection, stretch connections, and the drill pipe to connect lines at the desired depths.

However, azimuthal accuracy can be more difficult to achieve. If the two lateral boreholes are 50 to 100 feet apart, and the azimuth was out by one degree, the accuracy may be off plus or minus two feet in azimuth. The longer the fluid passageway (or rung), the more accurate the azimuth needs to be to ensure the injection well is connected to the recovery well.

Figure 11C:
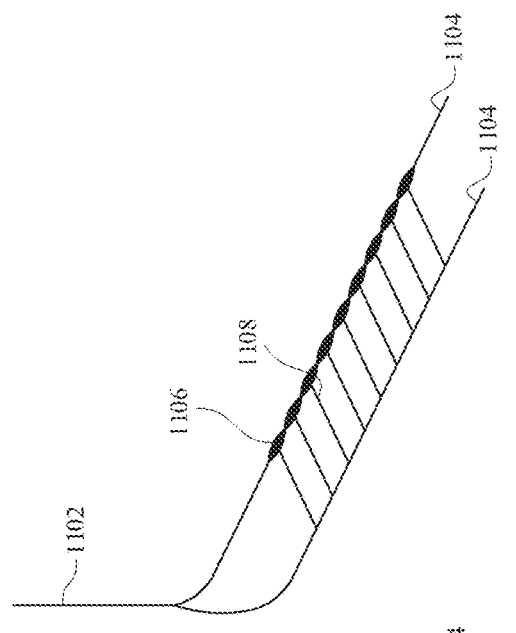

FIG. 11C illustrates a plurality of passageways 1106 (or rungs) that can drill between the plurality of lateral boreholes 1104. The passageways 1106 each provide fluid communication between one of the plurality of chambers in a first of the plurality of lateral boreholes 1104 and the second lateral borehole 1104.

Current techniques for drilling the passageway (or rung) 1106 can involve the use of coil tubing and going in through the primary well, carving into a lateral and water jetting using coil tubing. The use of coiled tubing can be a very expensive process. In addition, coil tubing can be very difficult to steer and control.

A propellant can be used to blast through the small drain holes and wash out the required diameter. For example, a first drill hole can have a half an inch diameter and after abrasive fluids go through the passages 1106 the hole sizes can be increased. The passages 1106 can be flushed with water after the desired diameter is achieved.

In various embodiments, one of the first lateral borehole and the second lateral borehole is located vertically above the other. In various embodiments, there is a 90-degree angle between the passageway and the various lateral boreholes. The 90-degree angle should reduce the cost in drilling and minimizes the potential for error. It should be noted that a 90-degree angle, however, is not required. The angle of the passageway from a first lateral borehole may be anywhere from about 10 degrees to about 85 degrees. Moreover, the various passageways may have the same or varying angles with respect to the lateral. In addition, the passageways need not be straight lines, but may be curved, serpentine, or other shapes if desired.

FIGS. 12A-12C illustrate various stages of a second exemplary "radiator" well. In FIG. 12A, a vertical borehole 1202 can be drilled down to a target location (e.g., a target depth or a location with a target temperature). The target location can be determined by geological surveys which indicate sufficient potential for sufficient heating to make geothermal energy production economically realistic. The target location can depend on location of the drilling site, the formation(s) to be drilled, and other considerations.

At the target location (e.g., a target depth), multiple lateral boreholes 1204 can be drilled from a single vertical borehole. The lateral boreholes 1204 can be parallel to each other as shown in FIG. 12A. Any number of lateral boreholes 1204 can be drilled from the vertical portion 1202 of the well and this disclosure is not limited to two parallel lateral boreholes

1204 as shown in FIG. 12A. In one embodiment, one of the lateral boreholes 1204 can be used as the injector well and the other one of the lateral boreholes 1204 can be used as the recovery well. In alternative embodiments, three lateral boreholes 1204 can be drilled. In the case of three lateral boreholes 1204, a center or middle lateral borehole can be used as the recovery well and the outer lateral boreholes can both be used as an injector well, or one of the outer lateral boreholes may be used as the recovery well. The lateral boreholes 1204 can be connected at one end to the vertical borehole 1202.

In various embodiments, two lateral boreholes can be drilled at the same target vertical depth or one above the other. The lateral boreholes can be separated a predetermined distance, which may be the same or may vary along the length of the two lateral boreholes. Drilling the two lateral boreholes in the same vertical plane should reduce the cost for drilling. In addition, the cutting head can be directed by gravity with no accelerometers and no azimuth worries when creating the connecting fluid passageways 1208. Various drilling features (e.g., vertical hold) can be used to drill the passageways 1208 of this embodiment. The lateral boreholes may, but need not be, horizontal, and may, but need not extend from the vertical borehole at an angle other than 90 degrees, which angle may (but need not) be anywhere from 10 degrees to 80 degrees with respect to the vertical portion of the vertical borehole.

FIG. 12B illustrates chambering out a plurality of chamber points 1206 in one of the lateral boreholes. While there are nine chamber points 1206 illustrated in FIG. 12B, any number of chamber points 1206 may be generated in one of the lateral boreholes 1204. The generating of the chambers allows for more easily creating a fluid passageway (or rung) from one of the lateral boreholes 1204 to a second lateral borehole. The generating of chambers allows for exposing the maximum possible area of rock to the circuit of water from the injectors. The chambering process can make the target hole larger and easier to create. Moreover, the chambers 1206 make it easier to drill or generate the fluid pathways connecting the lateral wellbores 1204.

The process for generating the chambers 1206 can be done by at least one or more of targeted jetting techniques, applying acid slugs, washing out the chamber point 1206, or drilling with asymmetric drill bits, or combinations thereof. In various embodiments, the target points can be chambered out until a diameter at the target points of 36 inches. The chambering process allows for errors in positioning the passageway (or rungs). For example, at 50-foot separation between the first lateral borehole and the second lateral borehole, the diameter at the target point can be 1.5 foot across. This can allow for +/−1.7 degrees in error when drilling the fluid passageway (or rung). The distance between the two or more lateral portions can be more or less than 50 feet, such as 25 feet, 75 feet, 100 feet, 200 feet, 300 feet, 500 feet, or more.

In various embodiments, the generating of chambers 1206 comprises generating chambers having at least a predetermined diameter or shape. In various embodiments, the chamber points 1206 can be chambered out to form a pea-pod shape.

Drilling techniques can provide very accurate measured depth accuracy. For example, techniques can allow for vertical depth accuracy on the order of 0.2% or approximately 2 feet per 1000 feet depth. So, if the target depth was 20,000 feet, it should be relatively achievable using temperature connection, stretch connections, and the drill pipe to connect lines at the desired depths.

However, azimuthal accuracy can be more difficult to achieve. If the two lateral boreholes are 50 to 100 feet apart, for example, and the azimuth was out by one degree, the accuracy may be off plus or minus two feet in azimuth. The longer the fluid passageway (or rung), the more accurate the azimuth needs to be to ensure the injection well is connected to the recovery well.

FIG. 12C illustrates a plurality of passageways 1206 (or rungs) that can drill between the plurality of lateral boreholes 1204. The passageways 1206 each provide fluid communication between one of the plurality of chambers in a first of the plurality of lateral boreholes 1204 and the second lateral borehole 1204. By providing a number of fluid pathways between the lateral boreholes 1204, the combination of boreholes and pathways provides a greater amount of surface area by which the heating fluid (e.g., water or brine), is exposed to the heated target location without the need for drilling even more lateral boreholes 1204 or vertical boreholes.

Techniques for creating the passageways (or rungs) 1206 can involve the use of coil tubing and going in through the primary well, carving into a lateral and water jetting using coil tubing. The use of coiled tubing can be a very expensive process. In addition, coil tubing can be very difficult to steer and control.

A propellant can be used to blast through the small drain holes and wash out the required diameter. For example, a first drill hole can have a half an inch diameter and after abrasive fluids go through the passages 1206 the hole sizes can be increased. The passages 1206 can be flushed with water after the desired diameter is achieved.

In various embodiments, one of the first lateral borehole and the second lateral borehole is located vertically above the other. In various embodiments, there is an approximately 90-degree angle between each passageway and the various lateral boreholes. This 90-degree angle should reduce the cost in drilling and minimizes the potential for error. It should be noted that a 90-degree angle, however, is not required. If the passageway extends from the lateral borehole at an angle other than 90 degrees, there will be an acute angle and an obtuse angle defined between the passageway's longitudinal centerline and the centerline of the lateral borehole. The acute angle of the passageway extending from a first lateral borehole may be anywhere from 0 degrees to about 90 degrees, and more particularly from about 5 degrees to 85 degrees, 30 degrees to 60 degrees, or about 45 degrees. Moreover, the various passageways may have the same or varying angles with respect to the lateral borehole. In addition, the passageways need not be straight lines, but may be curved, serpentine, or other shapes if desired.

Although it is expected that a passageway drilled from an existing lateral borehole 1204 will be most economically efficient, a series of boreholes drilled perpendicular to the lateral boreholes from multiple surface locations or from a single vertical borehole could also be used. The lateral boreholes 1204, for example, could be drilled in a manner that is not straight but instead weave together to create the passageways could be employed.

Figure 13:
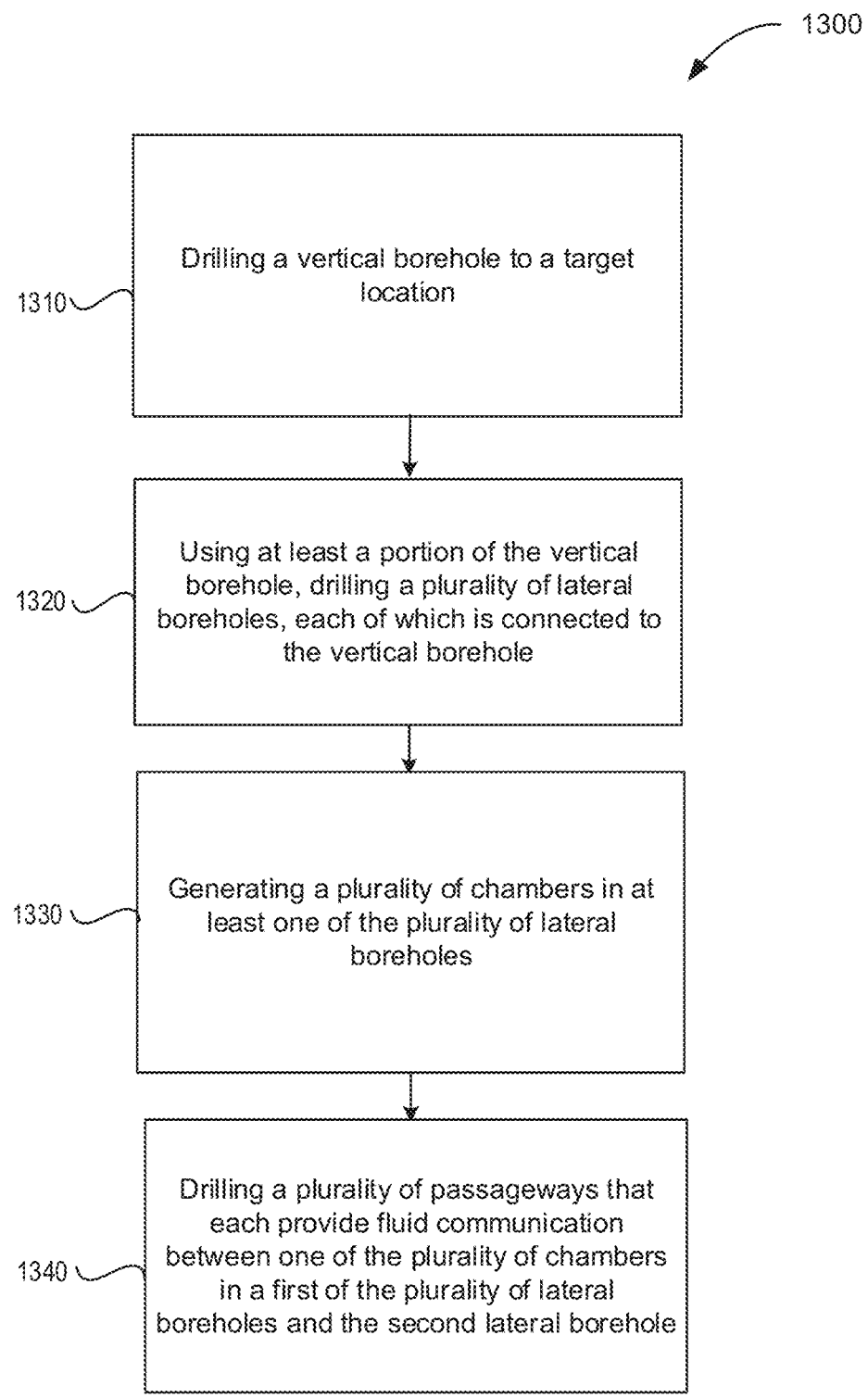
FIG. 13 illustrates a flowchart of an example process for drilling a geothermal "radiator" well according to an embodiment of the disclosure.

FIG. 13 illustrates a flowchart of an example process 1300 for drilling a geothermal radiator well according to an embodiment of the disclosure. In some implementations, one or more of the process blocks of FIG. 13 may be performed by the controller 1000. In some implementations, one or more process blocks of FIG. 13 may be performed by another device, or a group of devices separate from or including the controller 1000. Additionally, or alternatively, one or more process blocks of FIG. 13 may be performed by one or more components of the controller 1000, such as processor 1002, memory/media 1010, input device 1008, output device 1009, computer instructions 1024, a display 1005, and a bus 1002.

At block 1310, the process 1300 can include drilling a vertical borehole to a target location. The target location can be a target depth. The target depth can be determined from a geological survey based on proximity to one or more heat source locations.

At block 1320, the process 1300 can include using at least a portion of the vertical borehole, drilling a plurality of lateral boreholes from the same vertical borehole section. Each of the plurality of lateral borehole can be connected to the vertical borehole. In various embodiments, the lateral boreholes can be drilled using directional drilling techniques. In various embodiments, the lateral boreholes can be parallel. In various embodiments, one lateral borehole can be vertically located above or below the other lateral borehole. In some embodiments additional lateral wellbores can be drilled from the vertical section, and/or a plurality of vertical and lateral wellbores may be connected at or near the surface.

At block 1330, the process 1300 can include generating a plurality of chambers in at least one of the plurality of lateral boreholes. In various embodiments, propellant can be used to generate the plurality of chambers. The chambers can be peapod shaped. In various embodiments, the chambers can be generated with a predetermined diameter, which may be 12, 24, 36, or 48 inches, or some other size.

At block 1340, the process 1300 can include drilling a plurality of passageways that each provide fluid communication between one of the plurality of chambers in a first of the plurality of lateral boreholes and the second lateral borehole. In various embodiments, directional drilling techniques can be used to drill the plurality of passageways. The passageway can allow the flow of a fluid (e.g., water, brine, steam, or a combination thereof) from the injection borehole to the recovery borehole. The passageways allow for maximum exposure of fluid to the heat source.

It will be appreciated that process 1300 is illustrative, and variations and modifications are possible. Steps described as sequential may be executed in parallel, order of steps may be varied, and steps may be modified, combined, added, or omitted. As noted, a controller 1000 or computer system 168 may be used to control the steps of the processes described herein.

Figure 14:
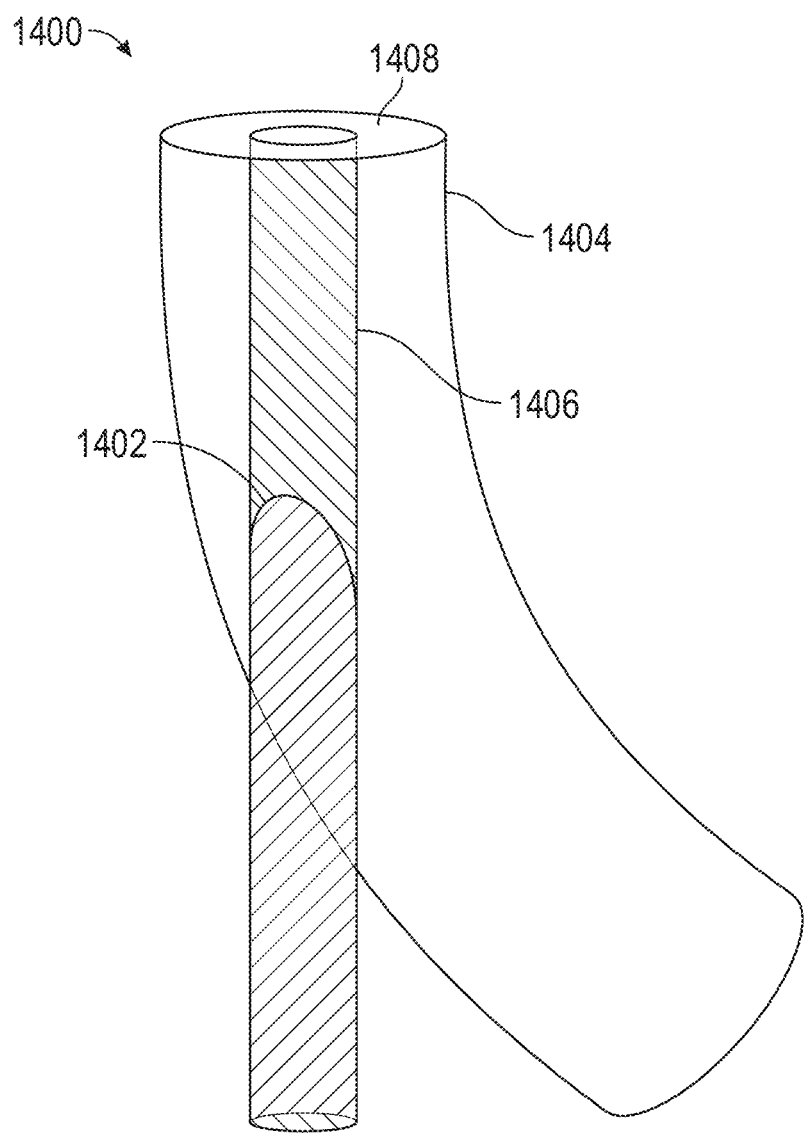
FIG. 14 illustrates an exemplary connector for connecting the injection borehole and recovery borehole to a single vertical well.

FIG. 14 illustrates an exemplary circuit connector 1400 for connecting the injection borehole and recovery borehole to a single vertical well. The circuit connector 1400 can be constructed by drilling a first gauge hole in the vertical borehole at a first location of the first parallel lateral well. Next, the curve in one of the lateral boreholes can be cased at the first location. The casing can be further milled for a second gauge hole 1402. The second gauge hole 1402 can be a small gauge sidetrack. A pipe 1406 can be placed in the second gauge hole to form an annulus 1408 between an inside of the first gauge hole 1404 and an outside of the pipe 1406. In various embodiments, a heated fluid (e.g., hot water or steam) can flow up the annulus 1408. In various embodiments, injection fluid (e.g., water) can flow through the pipe 1406 into the injection borehole.

Figure 15:
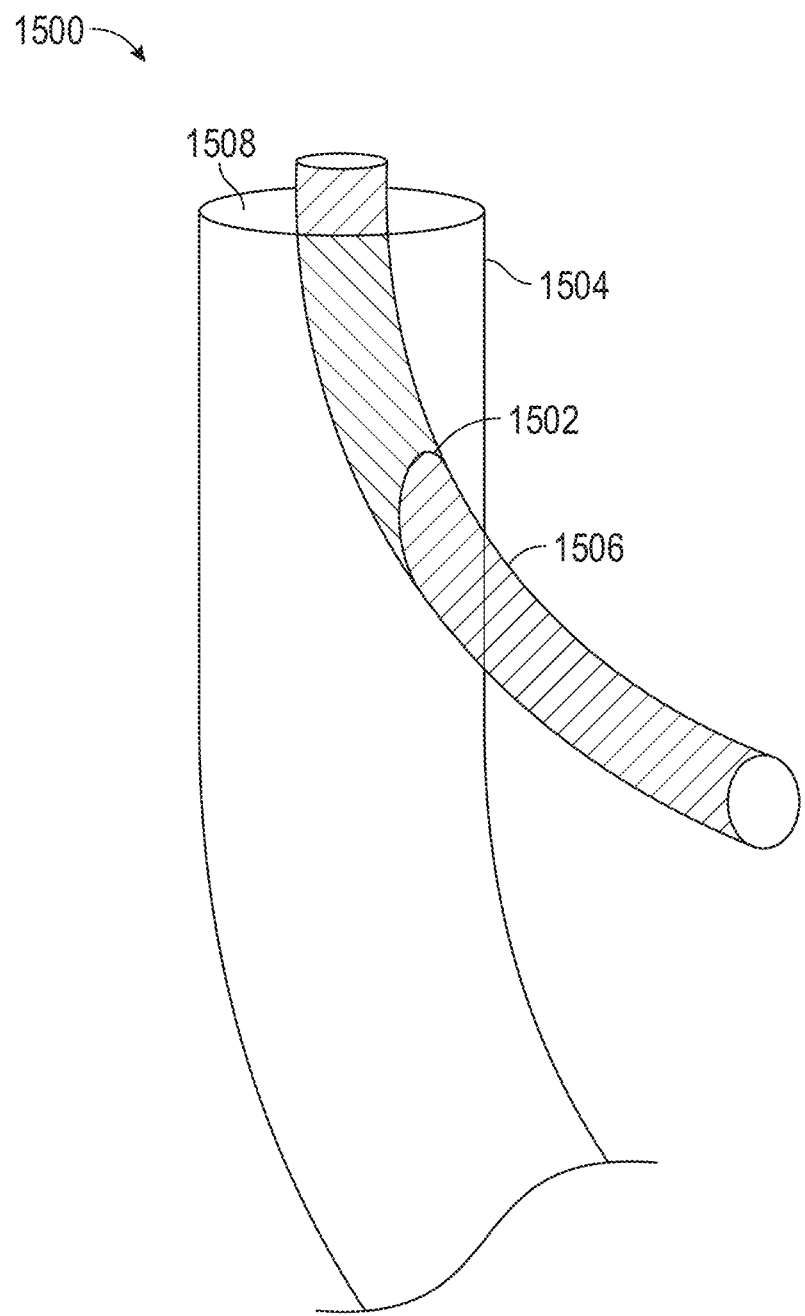
FIG. 15 illustrates a second exemplary connector for connecting the injection borehole and recovery borehole to a single vertical well.

FIG. 15 illustrates an exemplary circuit connector 1500 for connecting the injection borehole and recovery borehole to a single vertical well. The circuit connector 1500 can be constructed by drilling a first gauge hole in the vertical borehole at a first location of the first parallel lateral well. Next, the curve in one of the lateral boreholes can be cased at the first location. The casing can be further milled for a second gauge hole 1502. The second gauge hole 1502 can be a small gauge sidetrack. A pipe 1506 can be placed in the second gauge hole to form an annulus 1508 between an inside of the first gauge hole 1504 and an outside of the pipe 1506. In various embodiments, a heated fluid (e.g., hot water, brine, and/or steam) can flow up the annulus 1508. In various embodiments, injection fluid (e.g., water, brine, etc.) can flow through the pipe 1506 into the injection borehole.

In various embodiments, the vertical borehole and the first lateral borehole can be reinforced well beyond the curve.

Figure 16:
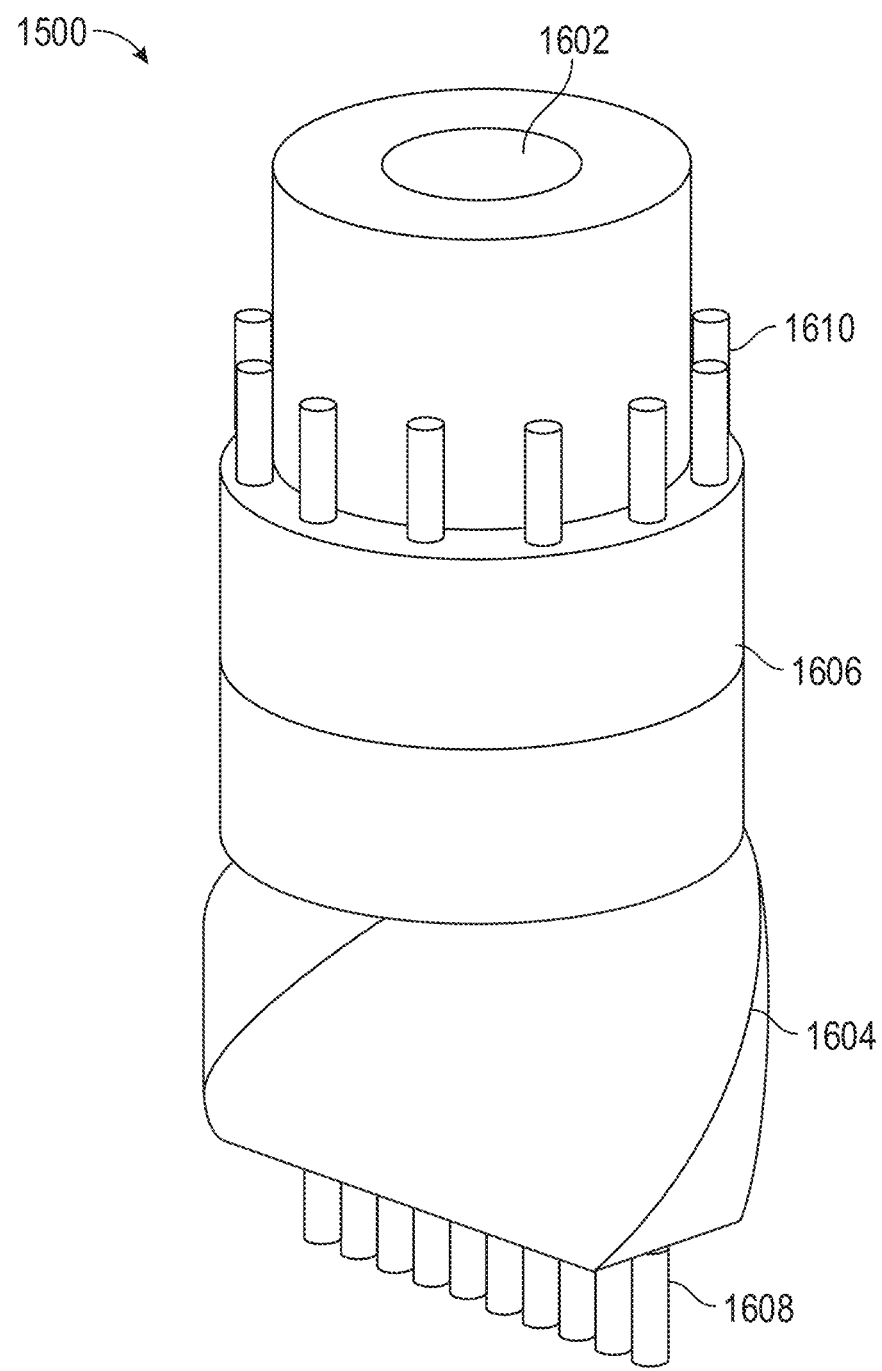
FIG. 16 illustrates an apparatus for drilling the passageways of a geothermal well.

FIG. 16 illustrates an apparatus 1600 for drilling the passageways of a geothermal well. In an aspect, the apparatus 1600 can include a propellant feed line 1602 coupled to a proximate end of rotating head 1604 via a bearing assembly 1606. The rotating head 1604 can include one or more cutting nozzles 1608 affixed to a distal end of the rotating head 1604. One or more thrust nozzles 1610 can be coupled to a proximate end of the bearing assembly 1606. One or more interior passageways can connect the propellant feed line 1602 to the one or more thrust nozzles 1610. In various embodiments, the rotating head 1604 can be helix shaped so as to naturally cause it to rotate without having to generate a power source to rotate the head.

Figure 17:
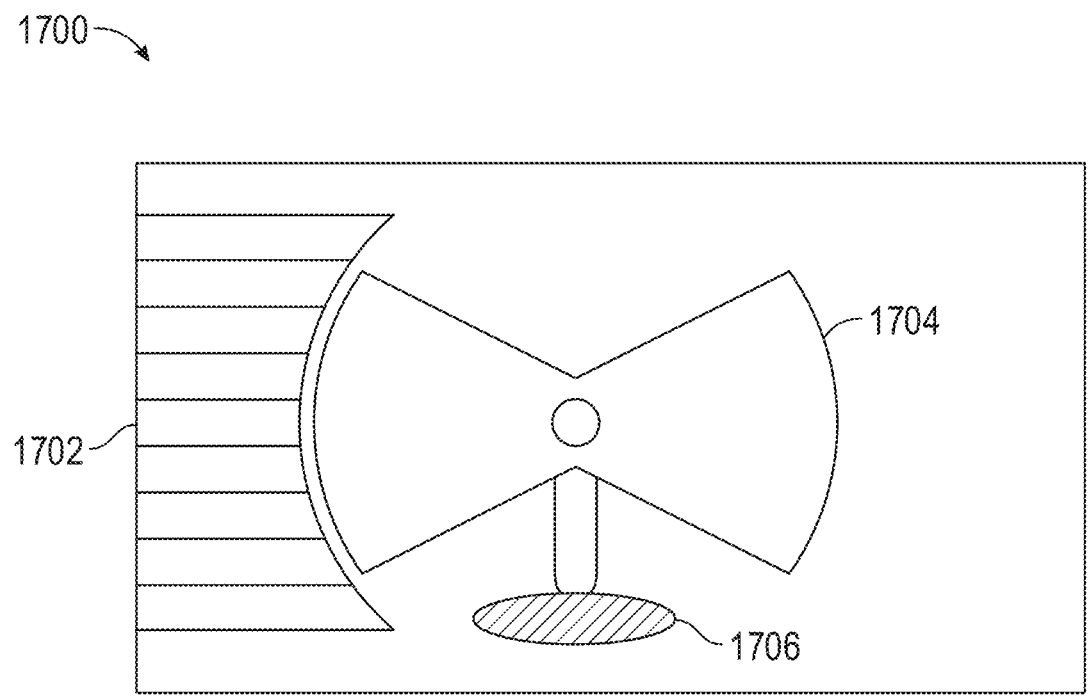
FIG. 17 illustrates various elements of an apparatus for drilling the passageways of a geothermal well.

FIG. 17 illustrates various elements of an apparatus 1700 for drilling the passageways of a geothermal well. In various embodiments, the apparatus 1700 can include a gravity sensor to detect an orientation of the apparatus and direct jetting of propellant.

In various embodiments, the apparatus 1700 can include one or more nozzle feeds 1702 for the one or more cutting nozzles 1608 of FIG. 16. The apparatus 1700 can include a pendulum block 1704 to direct a flow of propellant from a propellant chamber 1706 of the apparatus 1700 to the one or more nozzle feeds 1706.

Figure 18:
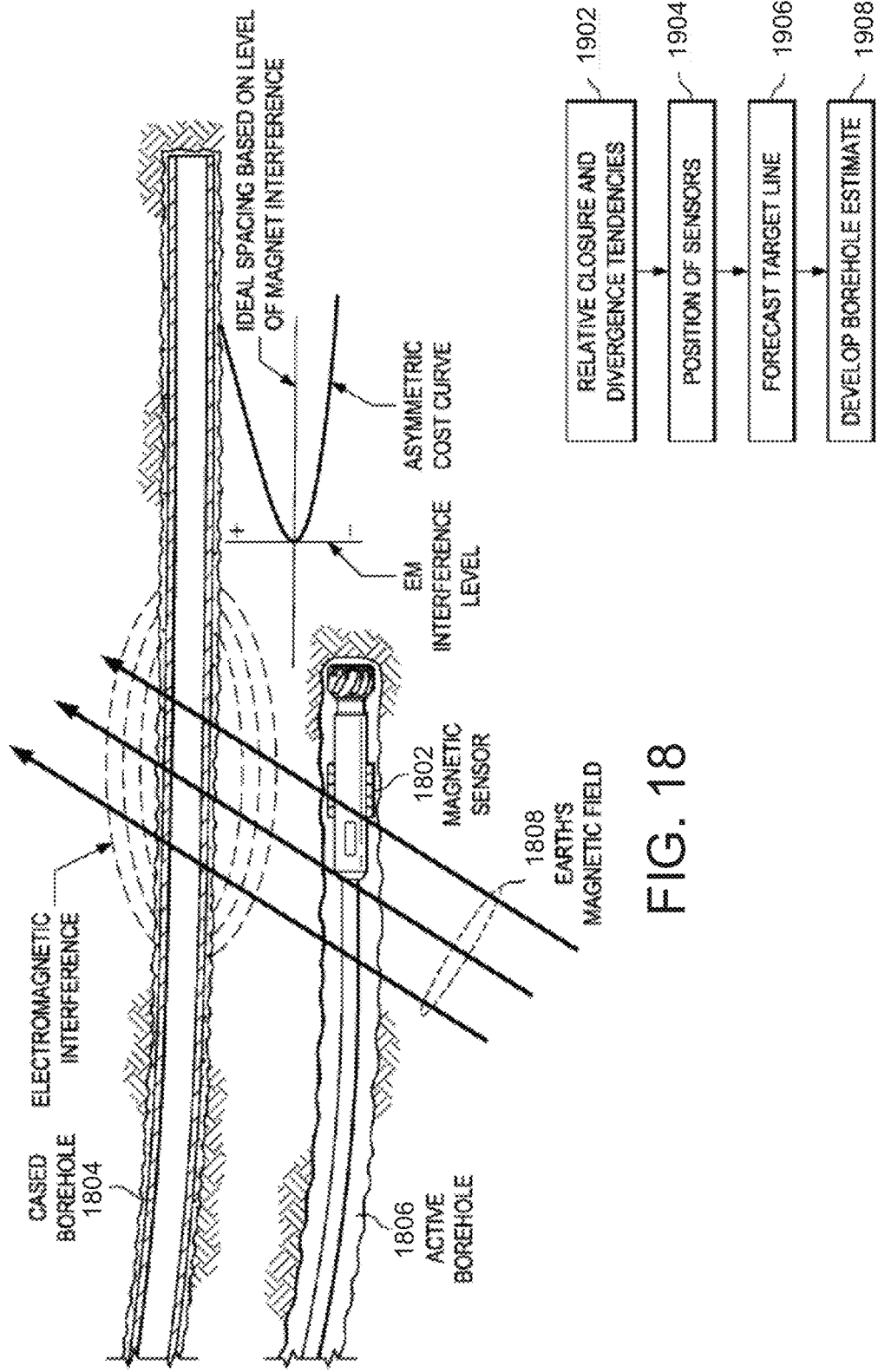
FIG. 18 illustrates the use of an iterative planning function for determining a well plan for wells in a common area.
Figure 19:
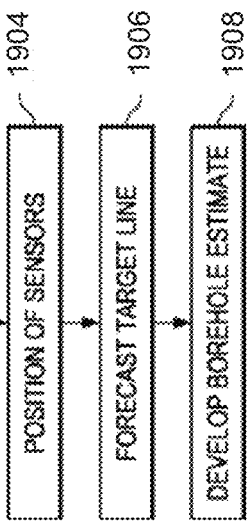
FIG. 19 is a flow diagram of a process for forecasting a future ideal spacing path.

In some oil and gas drilling activities such as SAGD, Steam-Assisted Gravity Drainage, drilling, spacing is of paramount importance. SAGD techniques can be used to drill the injection and recovery wells in close proximity to each other. Similar to the examples given above, the surface steerable system 214 can be leveraged to maintain spacing more accurately as well as account for variations of production value and collision risk with adjacent wells. Spacing is of paramount importance with SAGD wells and it is common to ignore survey special referencing and steer a well purely on magnetic ranging as illustrated in FIG. 18. In this process, a first well 1804 is drilled and the well bore cased with a ferrous casing. The second well 1806 can be either the production or the steam or heated injection well. Spacing of the second well 1806 relative to the first well 1804 can be managed by the surface steerable system 164 by applying a cost curve to identify the driving cost factor or rules to maintain spacing close to the initial well but not so close to risk collision. This can be accomplished using dimensional referencing using sensor information from magnetic sensor 1802. This can also be accomplished by referencing magnetic intensity ranges provided by downhole sensors caused by the Earth's magnetic field 1808. By establish value curves relative to magnetic intensity ranges the surface steerable system 214 can evaluate convergence plans as being more or less valuable or preferable as a whole or on a foot-by-foot basis. In this way, the steering decision becomes automated to maintain proper spacing over a well utilizing the surface steerable system.

For purposes of evaluating future cost/value impact due to spacing variation to the cased hole 1804 in a SAGD application, a geometric reference to anchor the cost curve may be established in 3D space. To forecast the future ideal spacing path (FIG. 17), it is necessary to project relative closure and divergence tendencies based on recent trajectories of the current wellbore 1806 and the survey trajectories of the pre-existing well bore or well bores 1804 at step 1902. For example, if the most recent survey and/or bit projection for the currently being drilled hole is at 92 degrees inclination and the survey for the pre-existing well is at 90 degrees, the surface steerable system 214 can forecast that the wells will be diverging in the vertical plane. The same can be done with azimuthal trajectory or by referencing 3D trajectory as a common spacing vector.

Using the most recent mag ranged distance between the active and the previous wells, a position of the sensors relative to the ideal distance or spacing can be established at step 1904. With this spacing reference and the historical trajectory reference, a parallel, ideally spaced target line can be forecast at step 1906 relative to the existing cased whole surveys. The length of forecasting can be programmable from relatively short lengths to full extension to the end of the well, as needed. The intent is to provide a geometric path longer than the convergence plan solutions so that the relative position cost curves can be anchored to a position in relative space, and the foot-by-foot value driven by the relative spacing cost curves can be calculated for a wide variety of convergence plans to establish the optimal path.

If data is available from drilling the previously cased whole 1804, the surface steerable system 214 has the ability to rerun the data to develop at step 1908 a borehole estimation of the actual wellbore path rather than being constrained to the minimum curvature path defined by historical surveys. This provides a higher resolution path to develop the parallel path used for future ideal mag ranging and spacing.

There can be multiple or single cost curves for mag ranging. One for left right spacing and one for up down spacing is one approach that allows for a variation of TVD and azimuthal correction and spacing, but in some cases, a pure 3D closest distance similar to anti-collision calculations can be used. In both two dimensional and three-dimensional spacing applications, an ideal spacing position is used to reference or anchor the curve.

All relative spacing cost curves can be used in conjunction with or instead of other well plan anchored cost curves or trajectory cost curves. Relative spacing cost curves, as with all other cost curves, can be asymmetrical in nature. In a SAGD well, it might be preferable to ere on the side of being further away from the adjacent wellbore than to get dangerously close to colliding with the previous drilled wellbore, and thus, the cost curves can bias the selection of plans that are close to the ideal location but have a higher probability of being further away than being too close.

As with other drilling with the surface steerable system 214, the projections and plans considered take into account the rotary build and drift tendencies of the wellbore being drilled when forecasting future convergence plan options.

It should be noted that the techniques described above that may be useful for SAGD applications may be of use in connection with efforts to place one lateral borehole close to another lateral borehole, including when one is located vertically above or below the other. It should be further appreciated that multiple lateral boreholes may be drilled one above the other in a substantially vertical plane. For example, one vertical wellbore could be used to drill several offset lateral wellbores, each at a different depth and two located a desired distance or range below the third lateral borehole. Moreover, the spacing of the lateral boreholes would not necessarily need to be uniform, especially if the porosity or permeability of the rock layers differs, among other things. In such a three-lateral borehole configuration, the top two laterals could be used to receive the heat fluid (e.g., water, brine, or the like), with the third and bottom lateral borehole serving as the receiving borehole by which the heated fluid (e.g., heated water, brine, steam, or a combination thereof) is returned to the surface for use to generate electricity or otherwise provide heat. It should be further noted that the lateral boreholes may but need not be of the same diameter and may be of different diameters.

In addition to the systems and methods described above for drilling a borehole in a particular location, which may be relative to a formation, heat zone, one or more other, previously drilled boreholes, or combinations thereof, we believe that additional systems and methods may be useful for drilling one or more boreholes for a geothermal well as described herein. In one embodiment, a guiding device may be used to help guide and direct the drill bit drilling a borehole towards a heat source. For example, a device such as a bottom hole assembly may include one or more portions or components that comprise one or more thermomechanical actuators. Such thermomechanical actuators may comprise thermal expansion portions or components that respond to a heat source and/or a heat differential and direct the drill bit towards the heat source. In one such approach, the drill string and/or BHA may include one or more portions or components that comprise amplified metal thermal expansion materials, such as bimetallic thermal actuators, pseudo bimorph thermal actuators, and/or may use geometric constraints to obtain the desired actuation towards a heat source. In one such an embodiment, the BHA or drill string components or portions that are heated more (e.g., are closer to a geothermal heat source) expand at a first rate responsive to their material's first thermal coefficient and due to the exposure to the heat, while other components or portions made from a second material with a different thermal coefficient expand at a different rate. The different expansion rates of the two materials of the components or portions thus can be used to direct or steer the drill bit towards the geothermal heat source. Such systems and methods may be used in addition to any or all of the sensors, control systems, and techniques described above for directional drilling of a borehole.

Referring now to FIGS. 20 and 21, additional examples of possible configurations of a "radiator" well in accordance with this disclosure are provided. In FIG. 20, a central borehole 2005 is shown. Located around and proximal to the central borehole 2005 are six peripheral boreholes 2010, each of which is connected to the central borehole 2005 by a fluid pathway 2015. As noted above, the boreholes may, but need not, be the same size or may be different sizes. Similarly, the distances between the central borehole 2005 and each of the peripheral boreholes 2010 may be the same or may differ. In FIG. 20, boreholes 2005 and 2010 may be lateral boreholes, each extending from a single vertical well section, or may be connected to a plurality of vertical well boreholes. In FIG. 21, an alternative arrangement of a plurality of lateral boreholes in accordance with this disclosure is shown. In FIG. 21, there are two primary boreholes 2120A and 2120B, and three secondary boreholes 2110, with the five boreholes shown as substantially aligned in a horizontal plane. Each of the secondary boreholes 2110 is connected to at least one of the two primary boreholes 2120A and 2120B by fluid pathways 2125. As previously noted, although the boreholes shown in FIG. 21 are of different sizes, they can, but need not, have the same size.

Similarly, the spacing between and among the boreholes may be the same or may vary.

FIG. 22 illustrates a geothermal energy generator facility 2200. The facility 2200 can include a first wellbore 2202, a portion of which is located proximal a geothermal heat source. The facility 2200 can include a second wellbore 2204. At least a portion of the second wellbore 2204 can be proximal and in fluid communication with the first wellbore 2202 though a plurality of fluid pathways 2206 extending between the first wellbore 2202 and the second wellbore 2204. A fluid can be provided from a surface location to the first wellbore 2202, flow through the first wellbore 2202 and through the plurality of fluid pathways 2206, and return to the surface location as steam, heated liquid, or a combination thereof through the second wellbore 2202. The facility 2200 can include a cooling system 2212. The cooling system 2212 can include one or more cooling towers. A cooling tower can be an integrated part of any geothermal power plant because waste heat from turbine exhaust steam must be continuously rejected to make the plants operate. According to the heat dump choice, the cooling system can be classified as wet cooling or dry cooling. Dry cooling towers conduct heat transfer through air-cooled heat exchanger that separates the working fluid from the cooling air. In a dry cooling tower, air can be introduced by either mechanical draft fans or by natural draft tall tower to move the air across the air-cooled heat exchangers.

In various embodiments, a generator 2210 at the surface location adapted to receive the steam, liquid, or combination thereof and generate electricity therefrom, which can be supplied by the facility to a power grid.

In various embodiments, the first wellbore 2202 and the second wellbore 2204 are in fluid communication with a vertical wellbore 2208.

In various embodiments, at least a portion of the second wellbore 2204 is located under a portion of the first wellbore 2202.

In various embodiments, a flow divider located in the vertical wellbore 2208 divides an input flow and an output flow in the vertical wellbore 2208.

In various embodiments, the vertical wellbore 2208 comprises a first portion adapted to receive an input flow of a liquid to at least one of the first wellbore 2202 and the second wellbore 2204. A second portion can be adapted to receive an output flow of the liquid from the other of the first wellbore 2202 and the second wellbore 2204.

In various embodiments the geothermal facility 2200 can include a control system. The control system can be located at the facility 2200 or remote from the facility. The control system can be in communication with various sensors (e.g., temperature sensors, pressure sensors, seismic sensors (seismometers) and vibration sensors (seismoscope). The one or more sensors can send data via wired or wireless means to the control system. The control system can monitor and control injection flow, steam/water output, fluid flow rates, turbine speed, turbine power output and power demand. The control system can determine if one or more conditions exist based on the sensor data to trigger a response by the control system. In various embodiments, the response may be automated. For example, if seismic sensors detect an earthquake above a predetermined threshold and/or a predetermined frequency, the control system can execute one or more actions (e.g., possibly shutdown) for the geothermal facility 2200.

In various embodiments, a regional system can include one or more geothermal facilities 2200. In various embodiments, each geothermal facility 2200 in the regional system can include separate turbines, cooling systems but share one or more control systems. In various embodiments of a regional system, one or more of the components of a geothermal facility 2200 (e.g., generators, cooling systems) may be shared between the various geothermal facilities. In addition, the one or more facilities 2200 may be connected to a power grid and/or to one or more energy using machines, equipment, or facilities. For example, the geothermal facility may be connected to and a part of a MicroGrid system such as described in U.S. Provisional Patent Application No. 63/112,083, U.S. Provisional Patent Application No. 63/114,336, and U.S. Patent Provisional Application No. 63/191,809, each of which is hereby incorporated by reference as if fully set forth herein.

FIG. 23A illustrates a first stage for a geothermal well design. In the first stage, a first borehole 2402 can be drilled having a large diameter. The first borehole 2402 can be drilled to just below a heat zone. The borehole can be conventionally cased. After the borehole is cased, a smaller second diameter borehole 2404 can be drilled to the deepest practical depth in the heat zone (or hydrothermal resource).

When the temperature of a hydrothermal resource is around 220 Fahrenheit and up, it can be used to generate electricity. Most electricity-producing geothermal resources have temperatures from 300 to 700 degrees Fahrenheit, but geothermal reservoirs can reach nearly 1,000 degrees Fahrenheit.

Hot water geothermal reservoirs can be used for the generation of electricity. In a liquid-dominated reservoir, the hot water has not vaporized into steam because the reservoir is saturated with water and is under pressure. To generate electricity, the hot water is piped from geothermal wells to one or more separators where the pressure is lowered and the water flashes into steam. The steam then propels a turbine generator to produce electricity. The steam can be cooled and condensed and either used in the plant's cooling system or injected back into the geothermal reservoir.

A binary cycle power plant is used when the water in a hot water reservoir is not hot enough to flash into steam. Instead, the lower-temperature hot water is used to heat a fluid that expands when warmed. The turbine is powered from the expanded, pressurized fluid. Afterwards, the fluid is cooled and recycled to be heated over and over again.

FIG. 23B illustrates a second stage for the geothermal well design. In the second stage, the second diameter borehole 2304 can be sidetracked below the casing in a fixed direction (e.g., North). A first sidetrack well 2308 can be built to a fixed inclination angle 2306 with a practical dogleg severity. The fixed inclination angle 2306 can be held to almost a half-way point 2310 to the true vertical depth (TVD) 2312 of the second diameter borehole 2308 such that there is enough depth before the half-way point 2310 to allow a return to vertical.

For example, if the build rate was 3 degrees per 100 feet with a maximum angle of 30 degrees, the equivalent radius can be approximately 1910 feet and the build section can use up to 955 feet of TVD. That is the same TVD needed to return to vertical before the half-way point 2310. After returning to vertical, it can be built in the opposite direction to the same maximum angle and start returning to vertical in time to arrive just before the terminal depth 2312.

This exemplary geothermal design can have several advantages. First, the well path uncertainty when returning to the same x, y position can be minimized by the fact that any systematic azimuth errors can be cancelled out on the return leg.

Second, access can be available to the second diameter borehole 2304 well such that a high accuracy magnetic ranging technique can be deployed (e.g., WellSpot, Rotating Magnetic System (RMS), or Seismic While Drilling (SWD) system can be used to guide the return to the second diameter hole 2304 from the sidetrack well 2308 easily.

Third, the directional drilling can be reduced to a single curvature at all curves in the profile and the straight sections can be long thereby reducing the complexity and the cost of the drilling.

Fourth, the drop to vertical at the end means the nudge to intersect only requires the toolface to be set correctly and the consequent azimuth to the intersection point can be achieved immediately.

FIG. 23C illustrates a third stage of the geothermal well design. In this stage, a second sidetrack well 2314 can be drilled in a different direction from the first sidetrack well. In FIG. 23, the second sidetrack well can be opposite the first sidetrack well 2308, but this is merely exemplary. In various embodiments, each sidetrack well can be started at a different total vertical depth to ease the steering of the kick-off portion of the sidetrack well. Therefore, the vertical depth of the second half-way point 2316 for the second sidetrack well 2314 may be at the same or a different depth of the half-way point 2310 for the first sidetrack well 2308.

FIG. 23C illustrates a fourth stage of the geothermal well design. In the stage additional sidetrack wells (e.g., a third sidetrack well 2318, a fourth sidetrack well 2320, a fifth sidetrack well 2322, and a sixth sidetrack well 2324) can be drilled in different directions of the first sidetrack well 2308 and second sidetrack well 2314. In various embodiments, each sidetrack well can be started at different total vertical depths to ease the steering of the kick-off portions of the sidetrack well.

Figure 24:
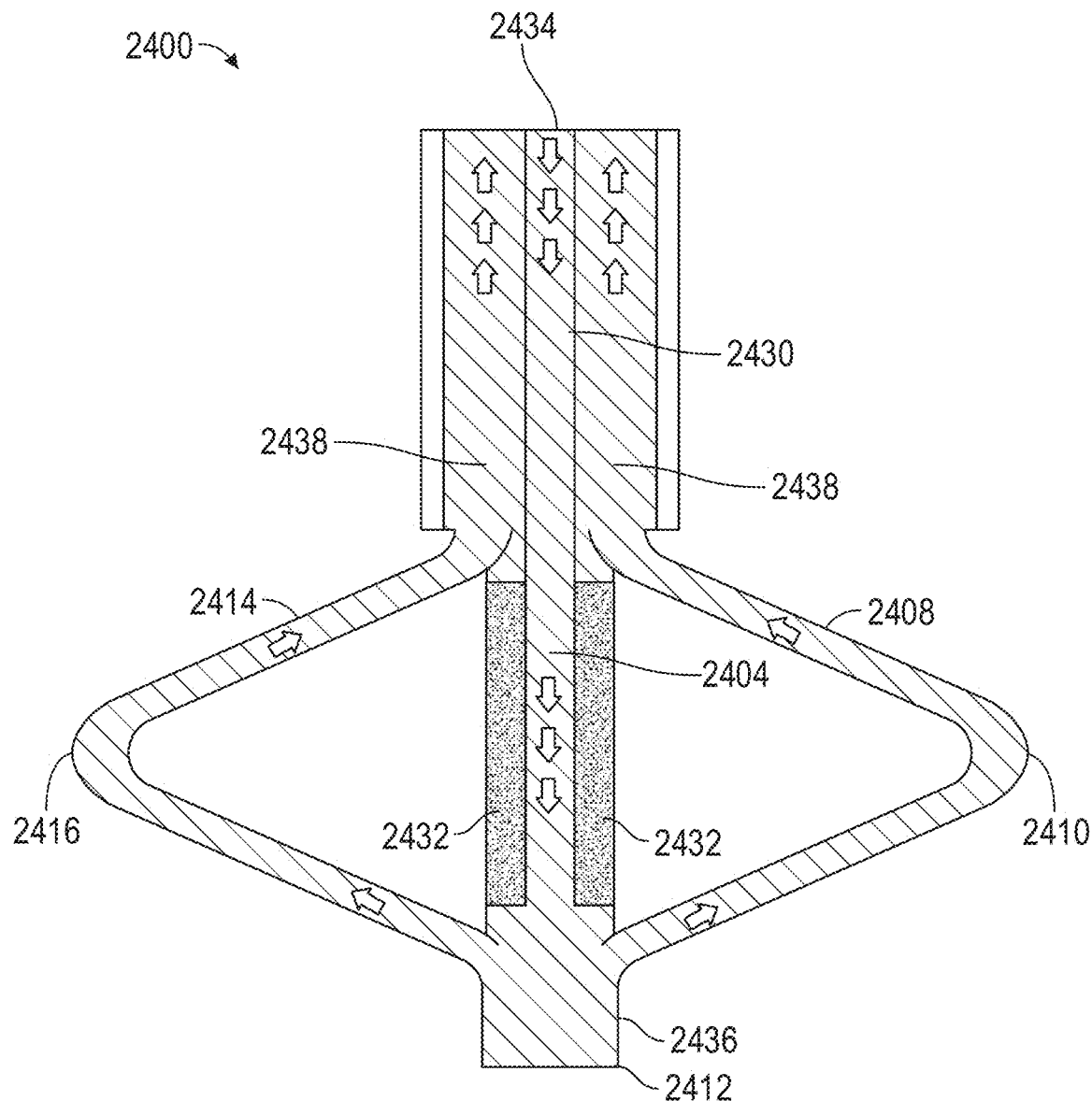
FIG. 24 illustrates an exemplary geothermal wellbore configuration.

FIG. 24 illustrated an improved design for a geothermal well 2400.

After the sidetrack wells (e.g., first sidetrack well 2408 and second sidetrack well 2414) have been completed, a secondary casing 2430 can be hung in the second diameter hole 2404. The secondary casing 2430 can be cemented (e.g., using concrete 2432) in place below the sidetrack wells (e.g., first sidetrack well 2408 and second sidetrack well 2414). This can provide a circuit where water can be injected into a top portion 2434 of the secondary casing 2430 into the inner casing to terminal depth 2412. A bottom portion 2436 of the second diameter borehole 2404 can be widened to facilitate heat exchange in geothermal reservoir portion of the well. The heated water can return through the sidetrack wells (e.g., first sidetrack well 2408 and second sidetrack well 2414) to the annulus of the larger vertical well an exit the wellbore to a power generation turbine.

Figure 25:
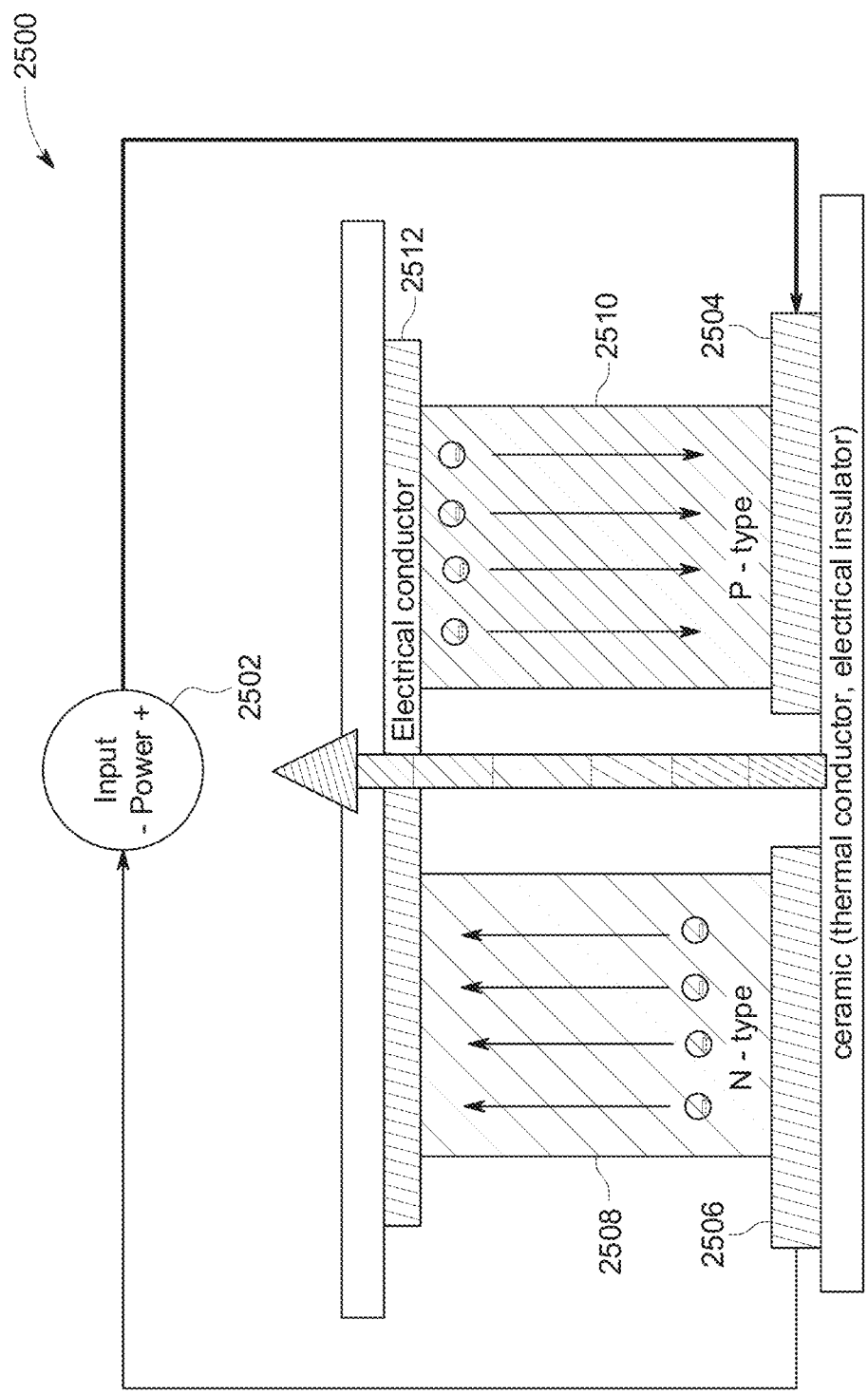
FIG. 25 illustrates an exemplary Peltier Heat pump.

FIG. 25 illustrates an exemplary thermoelectric heat pump 2500. The thermoelectric heat pump 2500 can be a solid-state device which transfers heat from one side of the device to the other, with consumption of electrical energy, depending on the direction of the electrical current. Thermoelectric heat pump 2500 operates using the Peltier effect. When an electric current is passed through a circuit of a thermocouple, heat can be generated at one junction and absorbed at the other junction. The presence of heating or cooling at an electrified junction of two different conductors can be known as the Peltier effect. When a current is made to flow through a junction between two conductors, A and B, heat may be generated or removed at the junction. The Peltier heat generated at the junction per unit time can be calculated using the following equation:

$$\text{Heat transferred} = (\pi_A - \pi_B)I$$

where $\pi_A$ and $\pi_B$ are the Peltier coefficients and I is the electrical current from A to B.

The thermoelectric heat pump 2500 can include two sides, and when a direct current (DC) electric current flows through the device, it brings heat from one side to the other, so that one side gets cooler while the other gets hotter. The "hot" side can be attached to a heat sink so that it remains at ambient temperature, while the cool side goes below room temperature. In special applications, multiple coolers can be cascaded or staged together for lower temperature, but overall efficiency (COP) drops significantly. The maximum COP of any refrigeration cycle can be ultimately limited by the difference between the desired (cold side) and ambient (hot side) temperature (the temperature of the heat sink). The higher the temperature difference (delta), the lower the maximum theoretical COP.

The thermoelectric heat pump 2500 can include a direct current (DC) power source 2502. The direct current power source can be connected to a first electrical contact 2504 and a second electrical contact 2506. One or more conductive materials can be disposed between the first electrical contact 2504 and the second electrical contact 2506. The conductive materials can include semiconductors that include doping to modify the electrical properties of the conductive material.

For example, two unique semiconductors, one n-type 2508 and one p-type 2510, can be used because they need to have different electron densities. The alternating p-type and n-type semiconductor pillars can be placed thermally in parallel to each other and electrically in series using an electrical conductor 2512 and then joined with a thermally conducting plate on each side, usually ceramic removing the need for a separate insulator. When a voltage from the DC power source 2502 is applied to the free ends of the two semiconductors (2508, 2510) there is a flow of DC current across the junction of the semiconductors, causing a temperature difference.

The side with the cooling plate absorbs heat which is then transported by the semiconductor to the other side of the device. The cooling ability of the total unit is then proportional to the total cross section of all the pillars, which are often connected in series electrically to reduce the current needed to practical levels. The length of the pillars can be a balance between longer pillars, which will have a greater thermal resistance between the sides and allow a lower temperature to be reached but produce more resistive heating, and shorter pillars, which will have a greater electrical efficiency but let more heat leak from the hot to cold side by thermal conduction. For large temperature differences, longer pillars are far less efficient than stacking separate, progressively larger modules; the modules get larger as each layer must remove both the heat moved by the above layer and the waste heat of the layer. The direction of the heat flow can be easily reversed by reversing the DC input power polarity.

Figure 26:
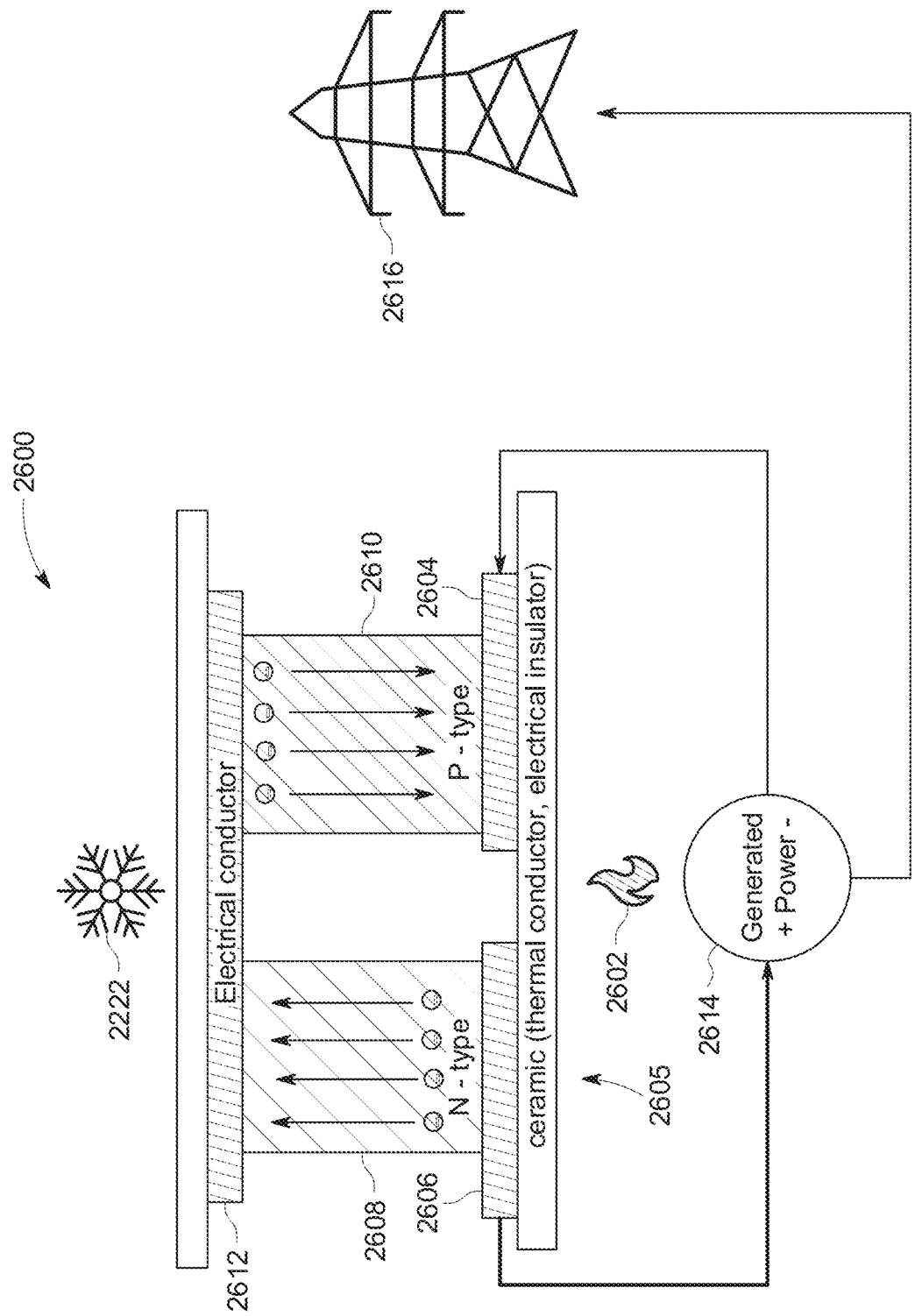
FIG. 26 illustrates an exemplary thermoelectric device or Seebeck generator.

FIG. 26 illustrates an exemplary thermoelectric device or Seebeck generator 2600. While FIG. 25 illustrates the use of the Peltier effect in a thermal heat pump 2600, the same principles can be applied to generate electrical current by applying a heat source 2602 to a thermal conductor 2605 having a first electrical contact 2604 and a second electrical contact 2606 while a cold source 2622 is applied to the electrical conductor 2612. One or more conductive materials can be disposed between the first electrical contact 2604 and the second electrical contact 2606. The conductive materials can include semiconductors that include doping to modify the electrical properties of the conductive material.

For example, two unique semiconductors, one n-type 2608 and one p-type 2610, can be used because they need to have different electron densities. The alternating p-type and n-type semiconductor pillars can be placed thermally in parallel to each other and electrically in series using an electrical conductor 2612 and then joined with a thermally conducting plate on each side, usually ceramic removing the need for a separate insulator. When a heat source 2602 is applied to the conductive plate 2605 and a cold source 2622 is applied to the electrical conductor 2612 there is a flow of DC current across the junction of the semiconductors (2608, 2610) that can be output to an electrical output 2614. The electrical current can be output to an electrical distribution system 2616.

Figure 27:
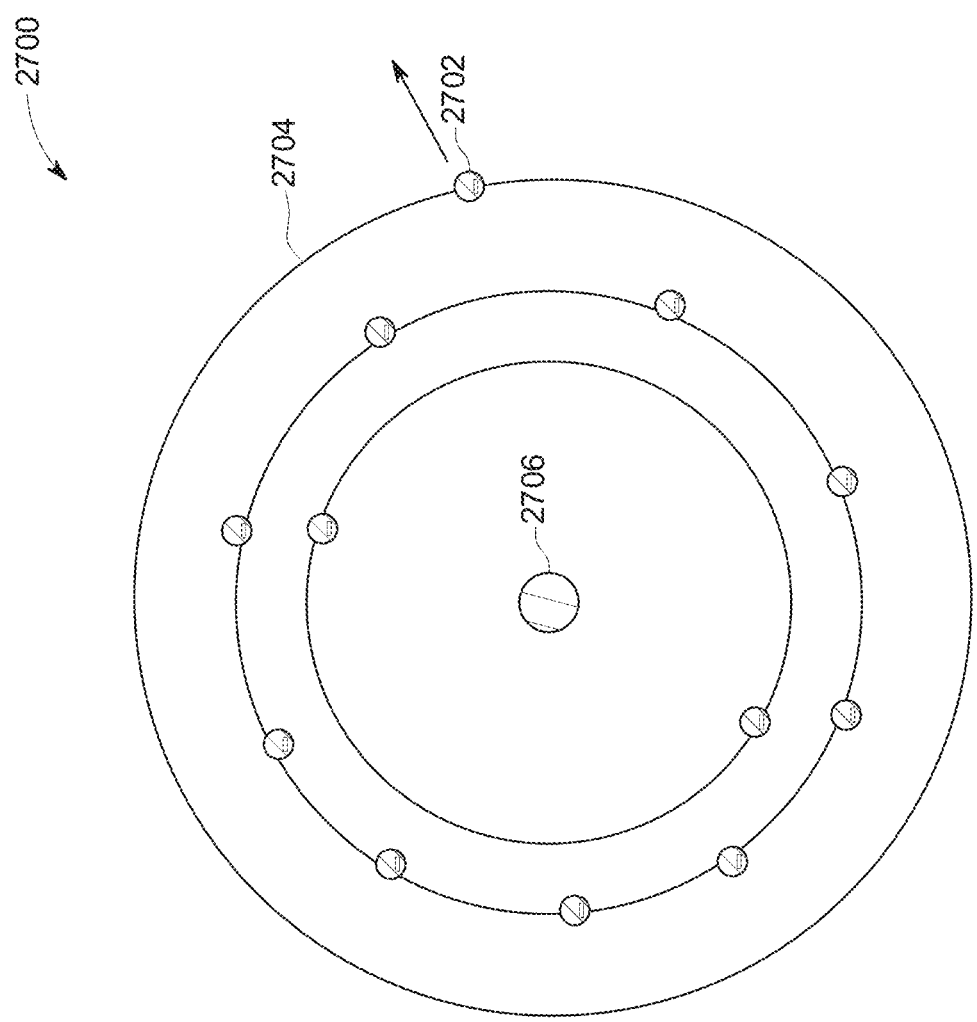
FIG. 27 illustrates an exemplary atomic structure of a N-type doped material.

FIG. 27 illustrates an exemplary atomic structure 2700 of a n-type doped material. The exemplary atomic structure 2700 can include a nucleus 2706 containing protons and neutrons and various shells of electrons. Materials with molecules that have spare valence electrons 2702 from the valence shell 2704 that can easily escape to the conduction space between atoms that are called n-type. N-type materials can be included to shed excess valence electrons 2702 away from warmer to colder atoms when heated. Therefore, the Seebeck coefficient for n-type materials can be negative.

Figure 28:
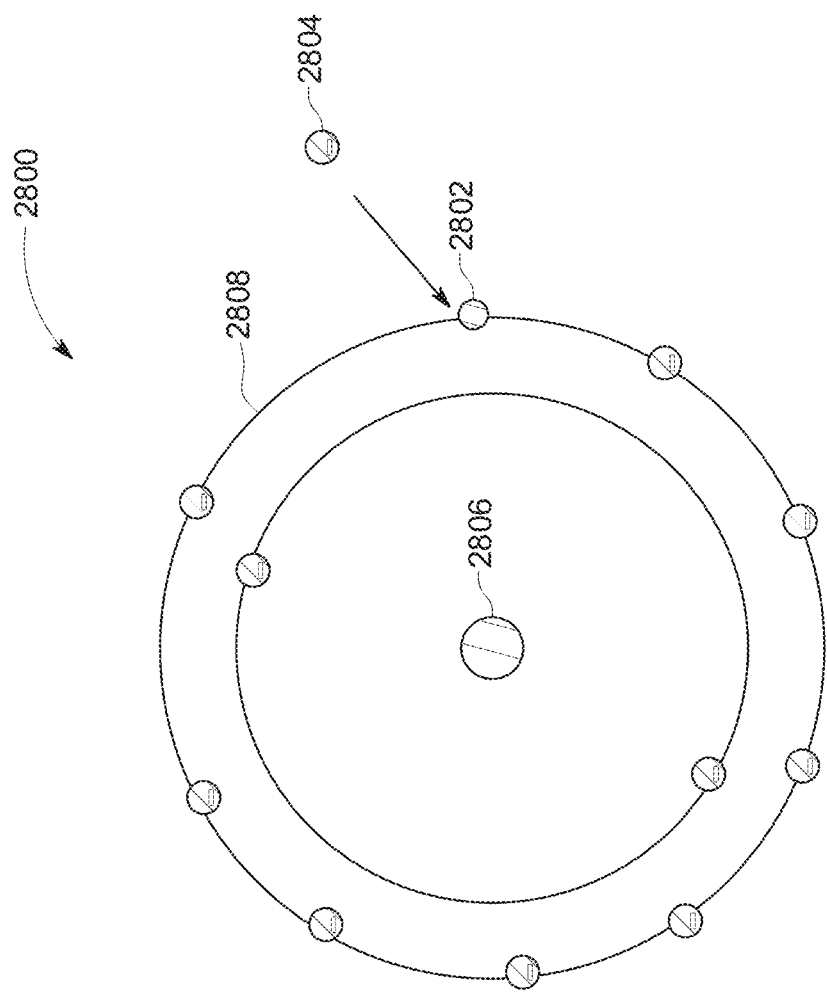
FIG. 28 illustrates an exemplary atomic structure of a P-typed doped material.

FIG. 28 illustrates an exemplary atomic structure 2800 of a p-type doped material. The exemplary atomic structure 2800 can include a nucleus 2806 containing protons and neutrons and various shells of electrons. Materials with modules that have gaps 2802 or "holes" in valence orbital 2808 that can easily accept free electrons 2804 from the conduction space between atoms are called p-type. P-type materials can be inclined to pick up excess electrons from cooler neighboring atoms when heated. Therefore, the Seebeck coefficient of p-type doped materials can be positive.

Figure 29:
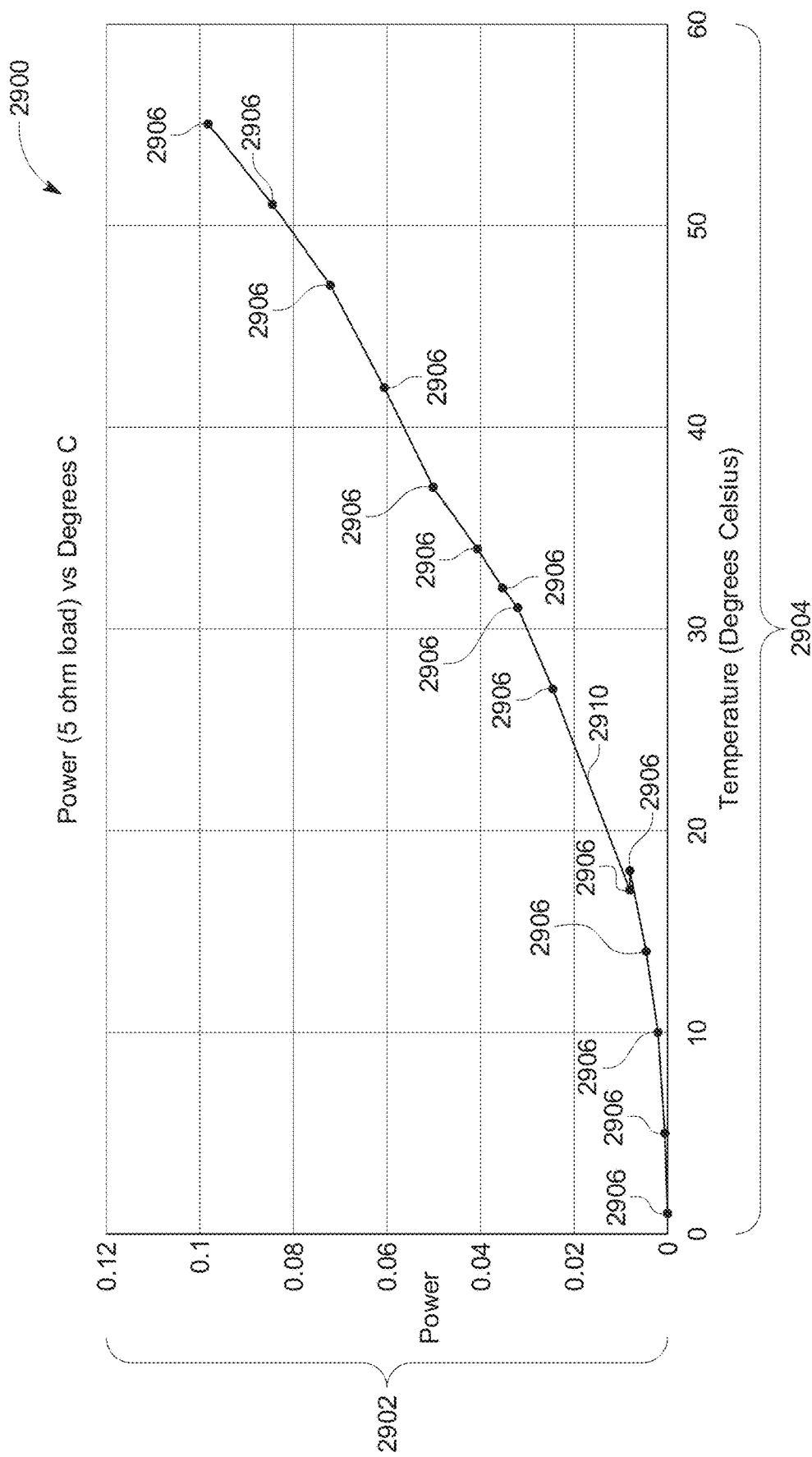
FIG. 29 illustrates an exemplary graph of a temperature gradient of power versus temperature for an exemplary thermoelectric device or Seebeck generator.

FIG. 29 illustrates an exemplary graph 2900 of a temperature gradient of power versus temperature for an exemplary thermoelectric or Seebeck generator. FIG. 29 illustrates a plot of power output 2902 in watts of a 5-ohm load versus temperature 2904 (in degrees C.). Various points 2906 can be plotted for different combination of power 2902 and temperature 2904. The various points 2906 can be interpolated to generate a line 2910 estimating the relationship between temperature 2904 and electrical power 2902.

Figure 30:
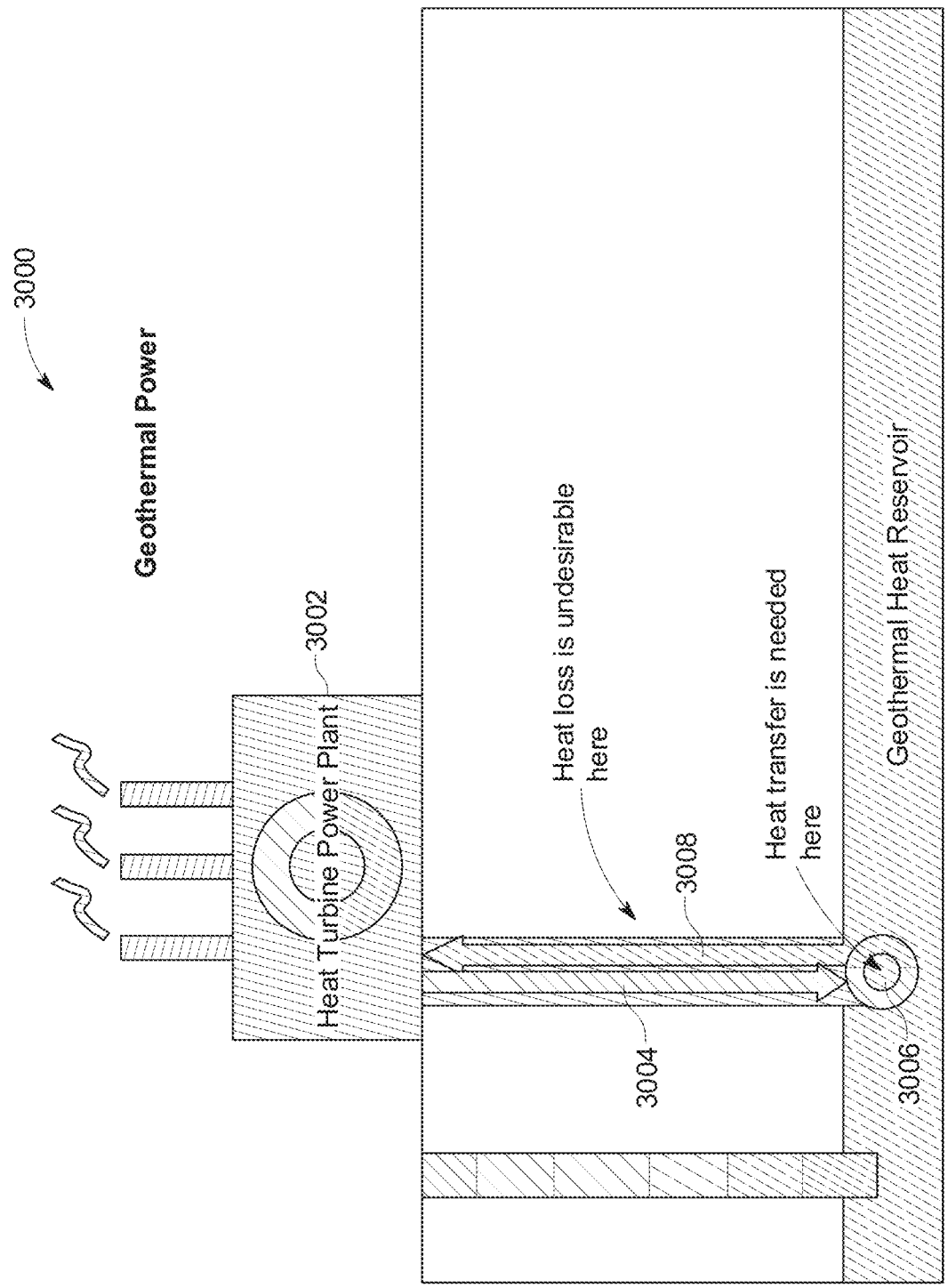
FIG. 30 illustrates an exemplary geothermal power plant.

FIG. 30 illustrates an exemplary geothermal power plant 3000. In a traditional geothermal plant 3000, a heat turbine power plant 3002 can be located at a surface. A fluid can be pumped into a borehole 3004. The fluid is transferred to a geothermal heat reservoir source 3006. Heat transfer can occur at the geothermal heat reservoir source 3006 and the heated fluid can be travel up a second borehole 3008 to the heat turbine plant. Heat loss in the heated fluid as it travels up from the geothermal heat reservoir source 3006 to the input to the heat turbine power plant 3002 can be undesirable as the heated fluid travels to the surface. In addition, the time to charge the heat fluid can be considered waste.

An exemplary thermoelectric heat pump can be a solid-state device that can generate a current with no moving parts. The output of the thermoelectric heat pump can be DC current with similar principles as Solar PV modules. The devices can utilize the Seebeck effect in between inner and outer sections of a pipe.

Pressure can be used to charge the fluid to concentrate heat delivery in Geothermal. This pressurization also increases the heat gradient downhole before being delivered.

The need to insulate pipes from heat loss is complimentary to optimizing heat generation. The surface area of the pipe can be a sunk cost of geothermal well construction. The surface area can be beneficial to Seebeck generation as the contact area between temperature gradients increases energy production regions.

Figure 31:
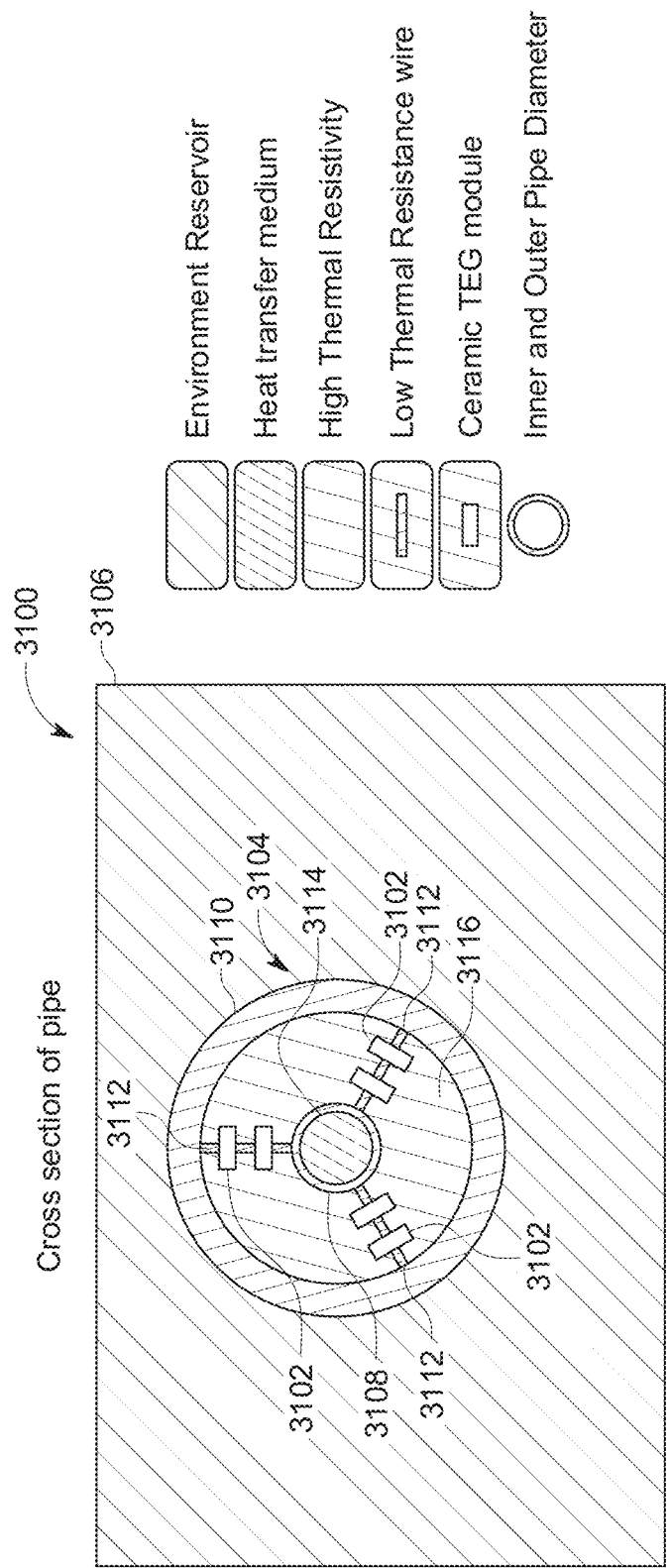
FIG. 31 illustrates an exemplary cross-sectional view for placement of temperature gradient devices in a pipe.

FIG. 31 illustrates an exemplary cross-sectional view 3100 of placement of temperature gradient devices 3102 in a pipe 3104. The pipe 3104 can be disposed within an environmental reservoir 3106. The pipe 3104 can have an inner pipe diameter 3108 and an outer pipe diameter 3110. An objective of this design can be to control a long-lasting temperature gradient to the surface of the temperature gradient devices 3102 and insulated elsewhere.

A low thermal resistance wire 3112 can connect the temperature gradient devices 3102 with a heat transfer medium 3114. The heat transfer medium 3114 can be surrounded at least in part by a high thermal resistivity material 3316. Heat can pass from the heat transfer medium 3114 via the low thermal resistance wire 3112 to the temperature gradient devices 3102. The temperature gradient devices 3102 can generate electrical energy and be used by devices down the borehole or can be transferred out of the borehole to devices on the surface.

In various embodiments, the temperature gradient devices 3102 can be radially distributed around the pipe 3104. In various embodiments, the temperature gradient devices 3102 can be distributed between the inner pipe diameter 3108 and the outer pipe diameter 3110. While three legs of the low the low thermal resistance wire 3112 are illustrated, each leg having two temperature gradient devices 3102, any number of legs and temperature gradient devices 3102 can be implemented.

Figure 32:
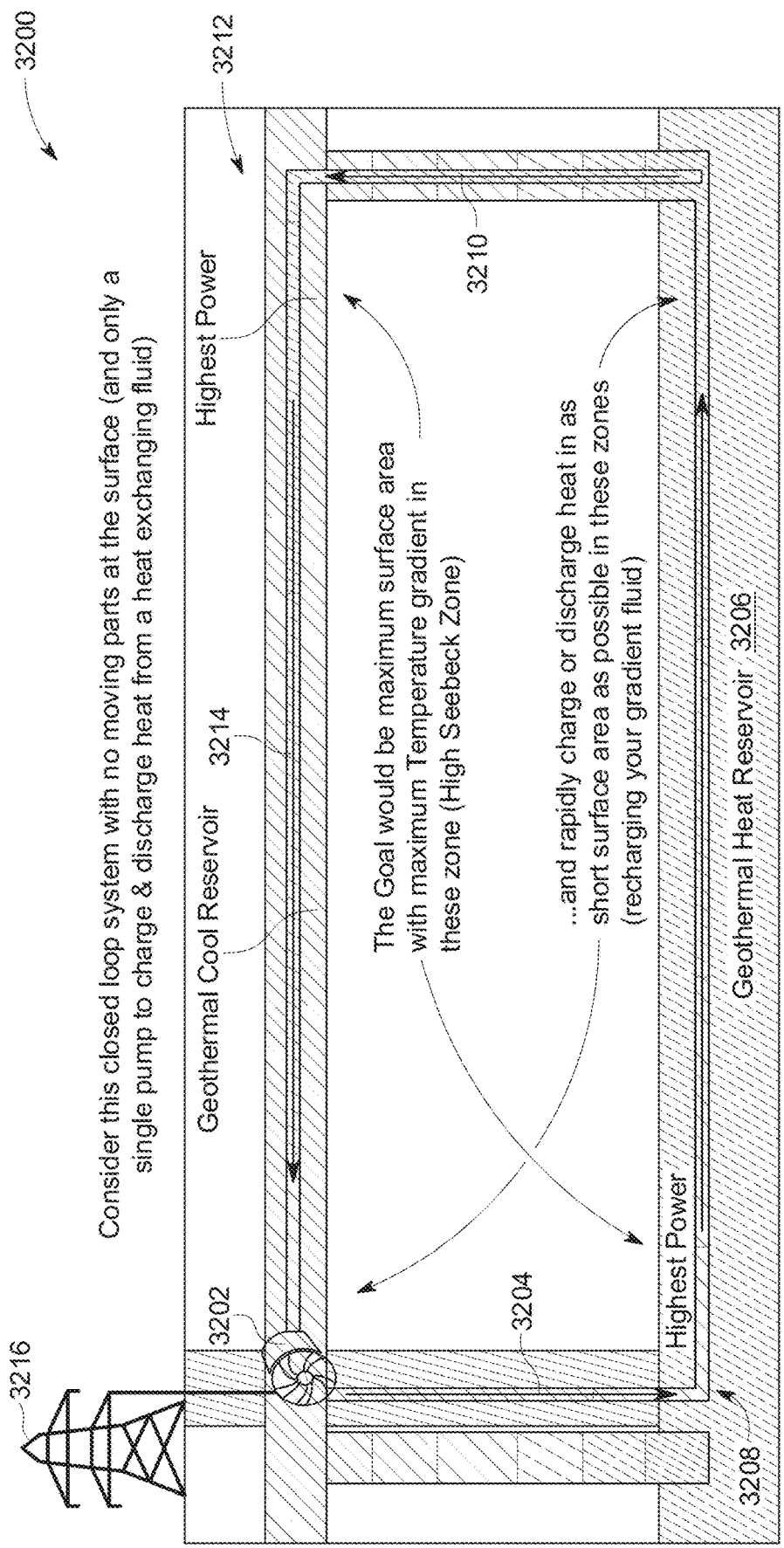
FIG. 32 illustrates an exemplary use case for a geothermal power plant design.

FIG. 32 illustrates an exemplary closed loop system 3200 for a geothermal power plant design. The closed loop system 3200 may have no moving parts at the surface and can be used exclusively in places where heat turbines are not practical. The closed loop system 3200 can have a single pump 3202 in which fluid is pumped down a first borehole 3204 to the geothermal heat reservoir 3206. A first zone 3208 where the cool fluid enters the geothermal heat reservoir 3206 can be known as the high Seebeck zone having a high temperature gradient. The first zone 3208 can be the highest power zone and would have the maximum temperature gradient.

The heated fluid can travel up a second borehole 3210 to a second zone where the heated fluid comes in thermal contact with a geothermal cool reservoir 3214. The second zone 3112 can also be a region having a high temperature gradient. The areas with highest temperature gradient can be the areas in which the most power can be generated. Temperature gradient devices 3102 as shown in FIG. 31 can be disposed in these areas. Electrical power can be output to an electrical distribution system 3216. Another objective can be to rapidly charge or discharge heat in as short a surface area as possible to minimize heat losses and maximize efficiencies.

Figure 33:
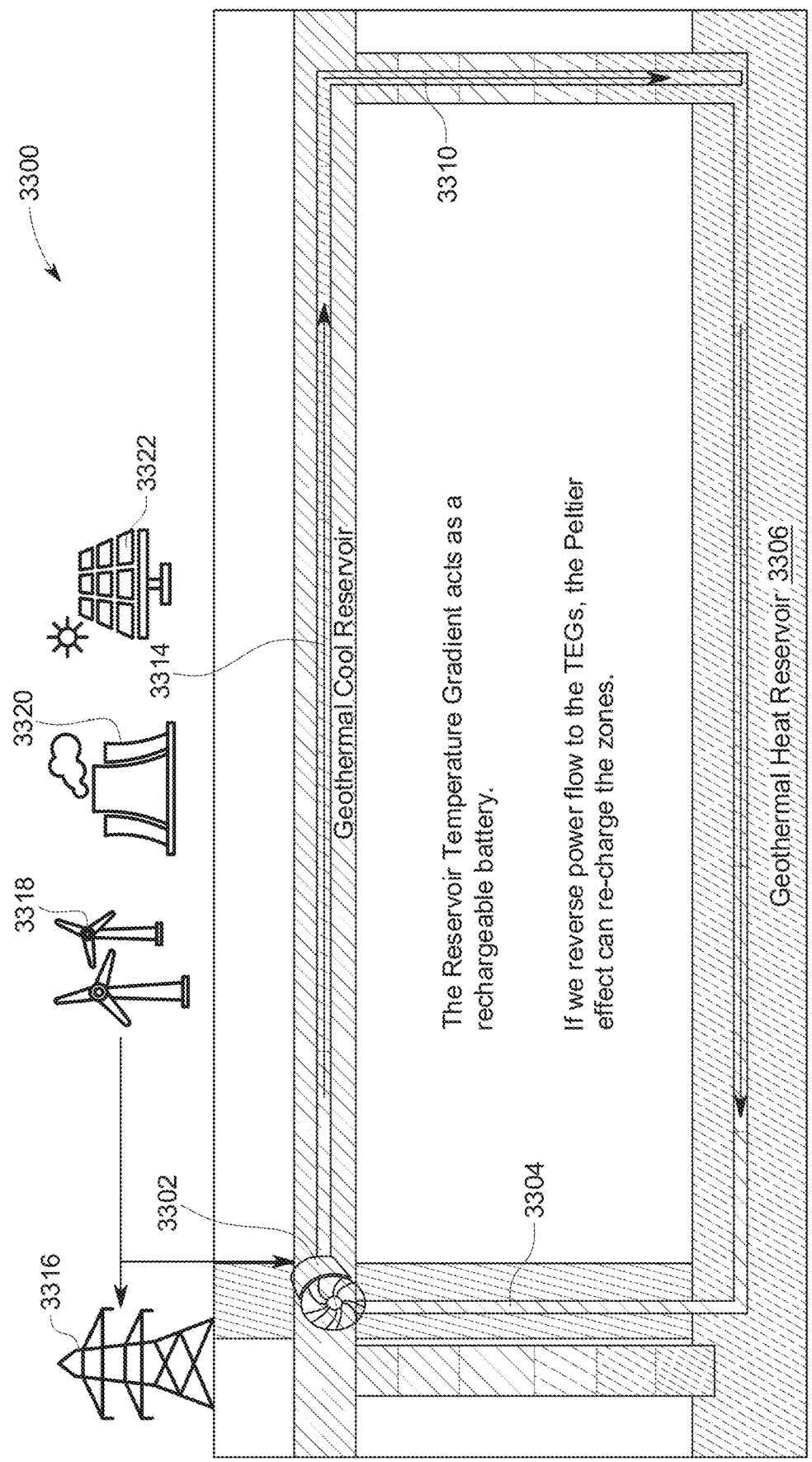
FIG. 33 illustrates an exemplary reversible geothermal generation process.

FIG. 33 illustrates an exemplary reversible geothermal generation process 3300. The geothermal generation process 3300 can have a pump 3302 in which fluid is pumped down a first borehole 3304 to the geothermal heat reservoir 3306. The reservoir temperature gradient can act as a rechargeable battery. As the fluid flows in one direction from the pump 3302 down the borehole 3304, past the geothermal heat reservoir 3306 heat energy can be converted to electrical power for the electrical distribution system 3316. In various cases, the power can be received from other electrical generation sources (e.g., wind turbine generators 3318, arbitrary power sources 3320 (e.g., conventional power plant (gas or coal), a hydroelectric, or a nuclear power plant), or solar power sources 3322). The reverse power flow can flow to the temperature gradient devices 3102, as shown in FIG. 31, that can re-charge the geothermal zones and be stored for future use.

Figure 34:
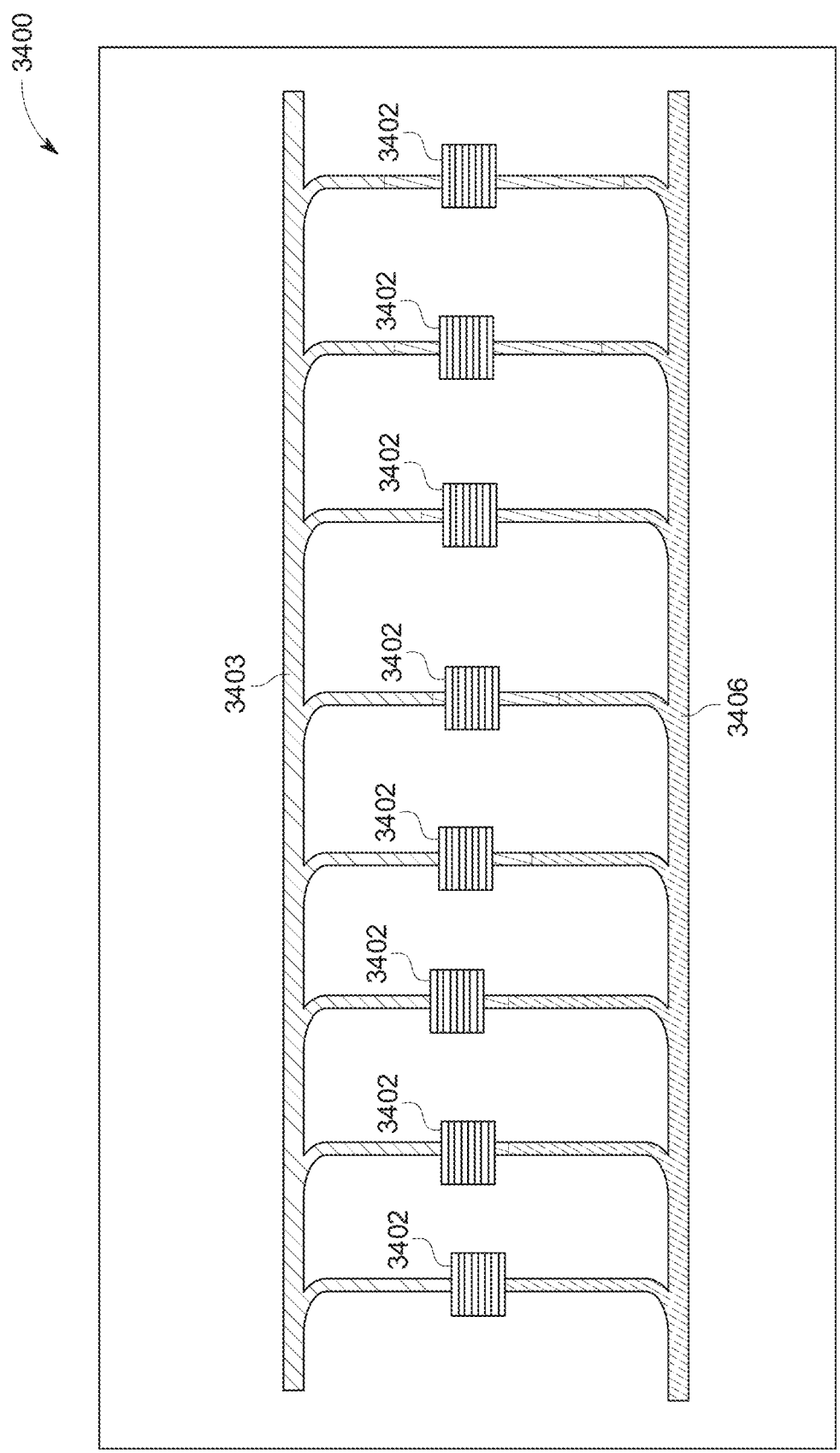
FIG. 34 illustrates an exemplary configuration of a geothermal well employing energy storage modules.

FIG. 34 illustrates an exemplary configuration of a geothermal well 3400 employing energy storage modules 3402. The energy storage modules 3402 can be between a first borehole configuration 3404 holding a cooling fluid and a second borehole configuration 3406 holding a heating fluid. The heating fluid can be from a geothermal source. As the energy storage module can 3402 can be positioned between a temperature gradient, they can employ temperature gradient devices 3102 as shown in FIG. 31 to convert heat to electrical power. This exemplary process can be used to charge zones. The modules can be staged and can transfer heat without moving a heat transfer fluid.

Figure 35:
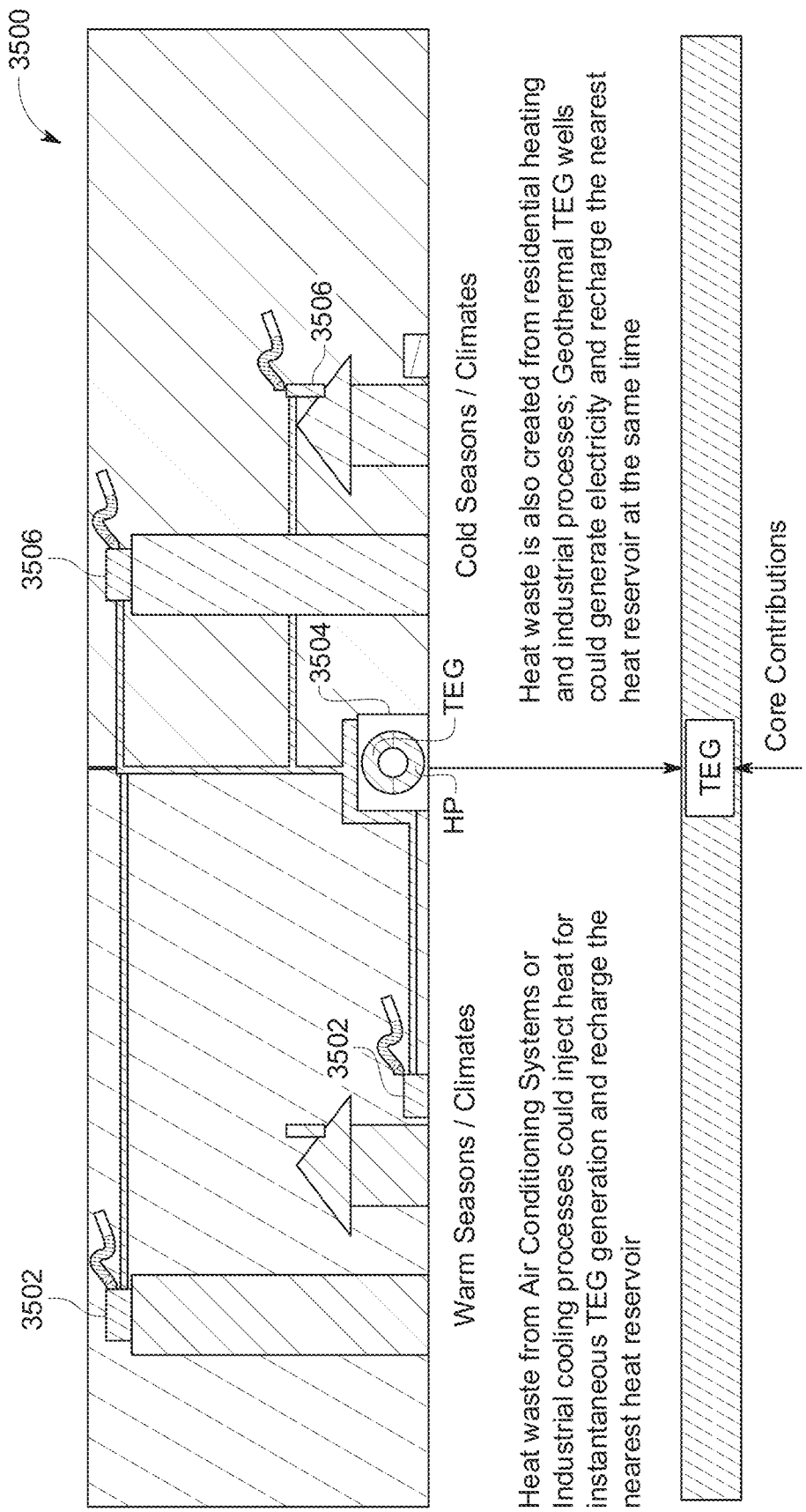
FIG. 35 illustrates an exemplary energy thermal electric generation process.

FIG. 35 illustrates an exemplary energy thermal electric generation process 3500. Recycled heat can be used in re-charging electrical devices and temperature gradient devices 3102 as shown in FIG. 31 can be used to offset costs. Modern buildings and homes can include large scale heating, cooling, and industrial application where waste heat can be harvested and saved instead of discarded into the environment. Small scale temperature gradient devices 3102 can be used for this purpose to improve efficiency.

During warm seasons or in warm climates heat waste from air conditioning systems 3502 or industrial cooling processes could inject heat for instantaneous TEG generation and recharge the nearest heat reservoir 3504.

During cold seasons or during cold climates heat waste 3506 can also be generated from residential heating and industrial processes. Geothermal TEG wells 3504 can generate electricity and recharge the nearest heat reservoir 3502 at the same time.

Figure 36:
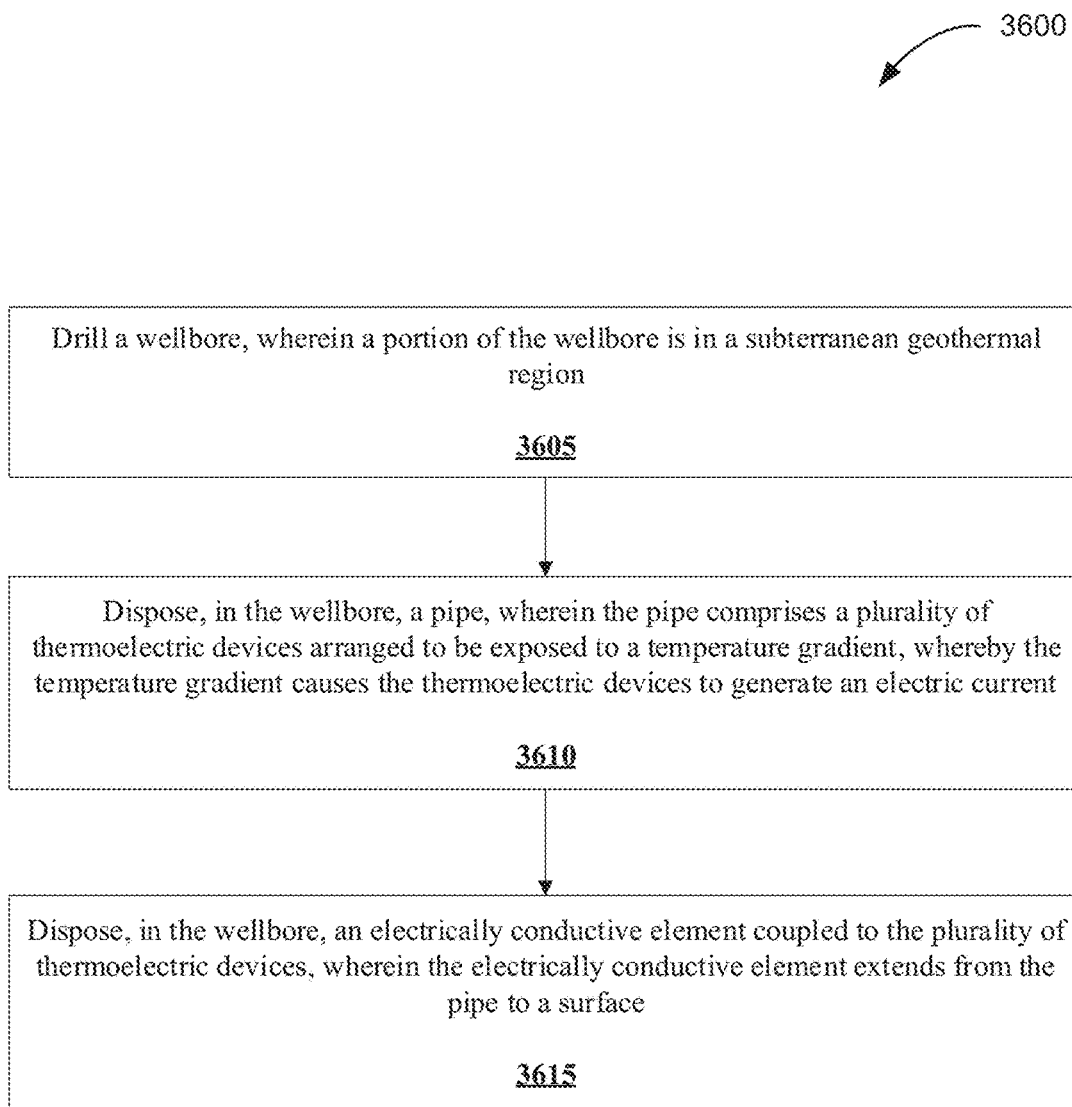
FIG. 36 illustrates a process for generating electrical power.

FIG. 36 illustrates a process for generating electrical power. FIG. 36 is an exemplary flow chart of a process 3600, according to an example of the present disclosure. According to an example, one or more process blocks of FIG. 36 may be performed by a drilling system.

At block 3605, process 3600 may include drilling a wellbore, where a portion of the wellbore is in a subterranean geothermal region. For example, a drilling system may drill a wellbore, where a portion of the wellbore is in a subterranean geothermal region, as described above.

At block 3610, process 3600 may include disposing, in the wellbore, a pipe, where the pipe may include a plurality of thermoelectric devices arranged to be exposed to a temperature gradient, where the temperature gradient causes the thermoelectric devices to generate an electric current. For example, device may dispose, in the wellbore, a pipe, where the pipe may include a plurality of thermoelectric devices arranged to be exposed to a temperature gradient, where the temperature gradient causes the thermoelectric devices to generate an electric current, as described above.

At block 3615, process 3600 may include disposing, in the wellbore, an electrically conductive element coupled to the plurality of thermoelectric devices, where the electrically conductive element extends from the pipe to a surface. For example, device may dispose, in the wellbore, an electrically conductive element coupled to the plurality of thermoelectric devices, where the electrically conductive element extends from the pipe to a surface, as described above.

Process 3600 may include additional implementations, such as any single implementation or any combination of implementations described below and/or in connection with one or more other processes described elsewhere herein. In a first implementation, a plurality of pipes, each having a plurality of thermoelectric devices, is disposed in the wellbore.

In a second implementation, alone or in combination with the first implementation, each of the plurality of pipes may include an insulation layer with a first thermal coefficient and a conduction element with a second thermal coefficient, where the first thermal coefficient is lower than the second thermal coefficient.

In a third implementation, alone or in combination with the first and second implementation, the conduction element may include a metallic element.

In a fourth implementation, alone or in combination with one or more of the first through third implementations, the plurality of thermoelectric devices in at least one pipe are connected in series.

In a fifth implementation, alone or in combination with one or more of the first through fourth implementations, the plurality of thermoelectric devices in at least one pipe are connected in parallel.

In a sixth implementation, alone or in combination with one or more of the first through fifth implementations, the subterranean geothermal region may include a region having a temperature of at least 100 C.

In a seventh implementation, alone or in combination with one or more of the first through sixth implementations, the subterranean geothermal region may include a region having a temperature of at least 200 C.

In an eighth implementation, alone or in combination with one or more of the first through seventh implementations, the subterranean geothermal region may include a region having a temperature of between 100 C and 500 C.

In a ninth implementation, alone or in combination with one or more of the first through eighth implementations, the wellbore may include a plurality of lateral wellbores each extending from a vertical wellbore portion.

It should be noted that while FIG. 36 shows example blocks of process 3600, in some implementations, process 3600 may include additional blocks, fewer blocks, different blocks, or differently arranged blocks than those depicted in FIG. 36. Additionally, or alternatively, two or more of the blocks of process 3600 may be performed in parallel.

It should be noted that the thermoelectric devices described and disclosed herein may be incorporated into drilling tools which may be used for drilling. For example, a plurality of thermoelectric devices may be located in and/or on a bottom hole assembly and/or one or more pipes or stands in a drill string coupled to a rig that is drilling a wellbore. In such an embodiment (not shown in the figures), the thermoelectric devices may be coupled to one or more sensors to provide an electrical current to one or more of the sensors using a temperature gradient between the drilling mud flowing through the central portion of the drill string and the mud returning in the opening between the drill string and the wellbore. In addition, one or more thermoelectric devices like those described herein may be coupled to one or more control systems to act as a switch. Once a particular temperature gradient exists that is proximal to a thermoelectric device, the device will generate an electric current, and the start of that current may be used as a control signal to initiate or to stop a drilling operation. Likewise, the absence of a current from a thermoelectric device in such a configuration may be used as a control signal: once the temperature gradient falls below a particular value, the thermoelectric device will stop generating a current. Thus, the absence of the current will occur when the temperature gradient falls below a certain amount. By locating the thermoelectric devices in one or more desired positions in the BHA and/or drillstring, and by determining in advance the desired temperature differential (or lack thereof), the thermoelectric device can be adapted to operate as a switch and the existence or absence of a current from the thermoelectric device may be used by a control system to initiate, monitor, modify, or cease one or more drilling operations.

In various implementations thermoelectric devices may be utilized to provide cooling relative to components in a downhole assembly. Such cooling may be particularly beneficial for downhole assemblies and/or components thereof that are sensitive to heat and/or that are utilized in geothermal applications, for example.

Figure 37:
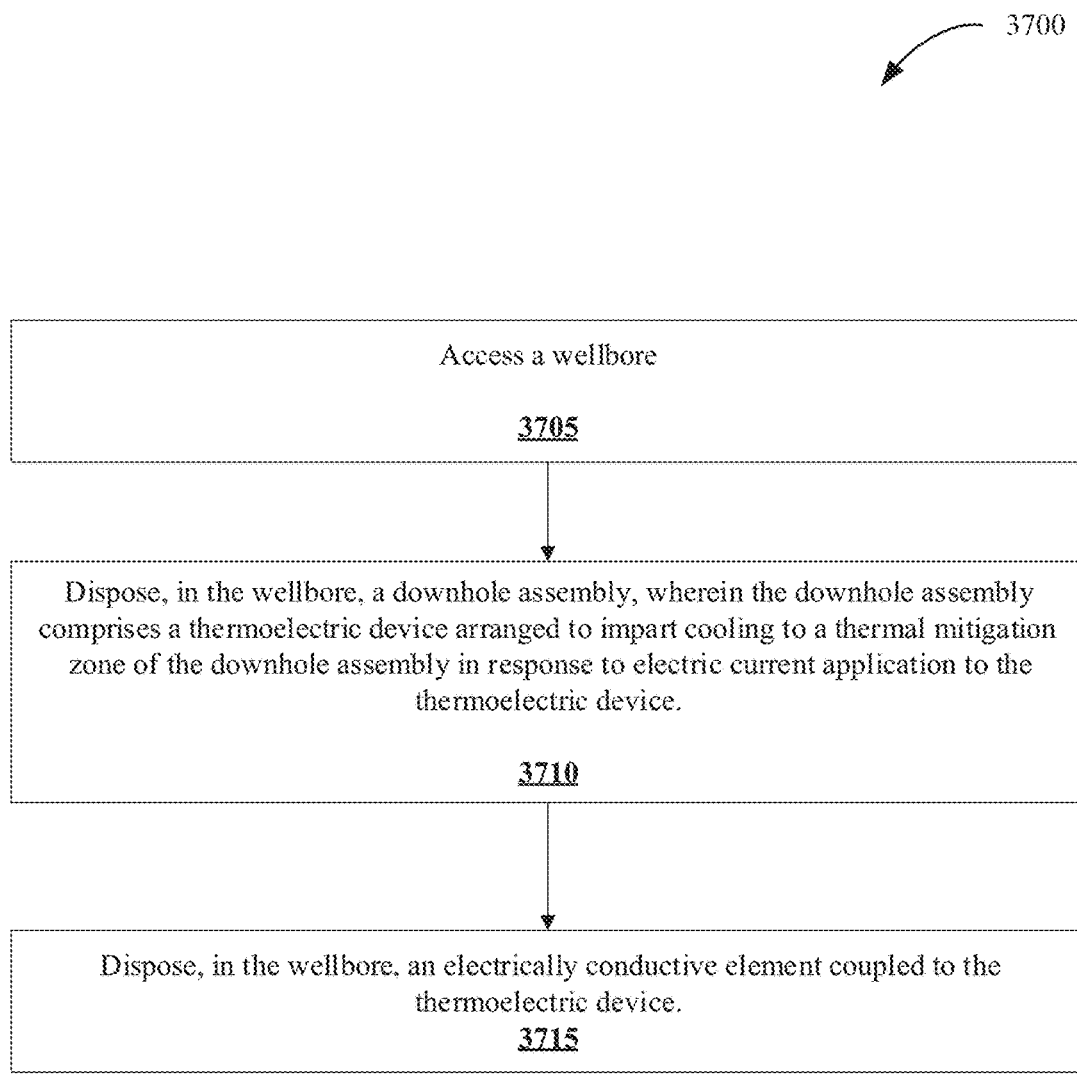
FIG. 37 illustrates a process for managing wellbore thermal loads.

FIG. 37 illustrates a process for managing wellbore thermal loads. FIG. 37 is an exemplary flow chart of a process 3700, according to an example of the present disclosure. According to an example, one or more process blocks of FIG. 37 may be performed by a drilling system or other downhole assembly and/or components thereof.

At block 3705, process 3700 may include accessing a wellbore. A portion of the wellbore may be in a subterranean geothermal region. For example, a drilling system may drill a wellbore, where a portion of the wellbore is in a subterranean geothermal region, as described above. Additionally or alternatively, the wellbore may be accessed by a downhole assembly that may be introduced separately and/or subsequently to drilling.

At block 3710, process 3700 may include disposing, in the wellbore, a downhole assembly, where the downhole assembly may include a thermoelectric device. The thermoelectric device may be provided in a set of one or more thermoelectric devices, such as provided individually or as part of a plurality. The thermoelectric device can be arranged to impart cooling to a thermal mitigation zone of the down hole assembly in response to electric current application to the thermoelectric device. For example, the thermoelectric device may be configured as a thermoelectric heat pump, as described above. A bottom hole assembly typically includes a number of components, including sensors for measurement while drilling and/or logging while drilling, one or more batteries, one or more processors and associated electronics, and the like. Some or all of these components may be sensitive to the temperatures encountered during drilling, and during drilling of a geothermal well.

At block 3715, process 3700 may include disposing, in the wellbore, an electrically conductive element coupled to the thermoelectric device. The electrically conductive element may extend from the downhole assembly to a surface or to another suitable source of electric current, or may be from a power source located within the bottom hole assembly. For example, the BHA may include a mud motor, and may use the drilling mud to generate electricity, which can then be used to provide power to one or more thermoelectric devices. In addition, or alternatively, the BHA may include one or more batteries, which may provide power to the thermoelectric devices. For example, the electrically conductive element may be suitable for providing electric current to the thermoelectric device to cause the thermoelectric device to extract heat and/or impart cooling relative to a thermal mitigation zone of the downhole assembly.

It should be noted that while FIG. 37 shows example blocks of process 3700, in some implementations, process 3700 may include additional blocks, fewer blocks, different blocks, or differently arranged blocks than those depicted in FIG. 37. Additionally, or alternatively, two or more of the blocks of process 3700 may be performed in parallel.

Figure 38:
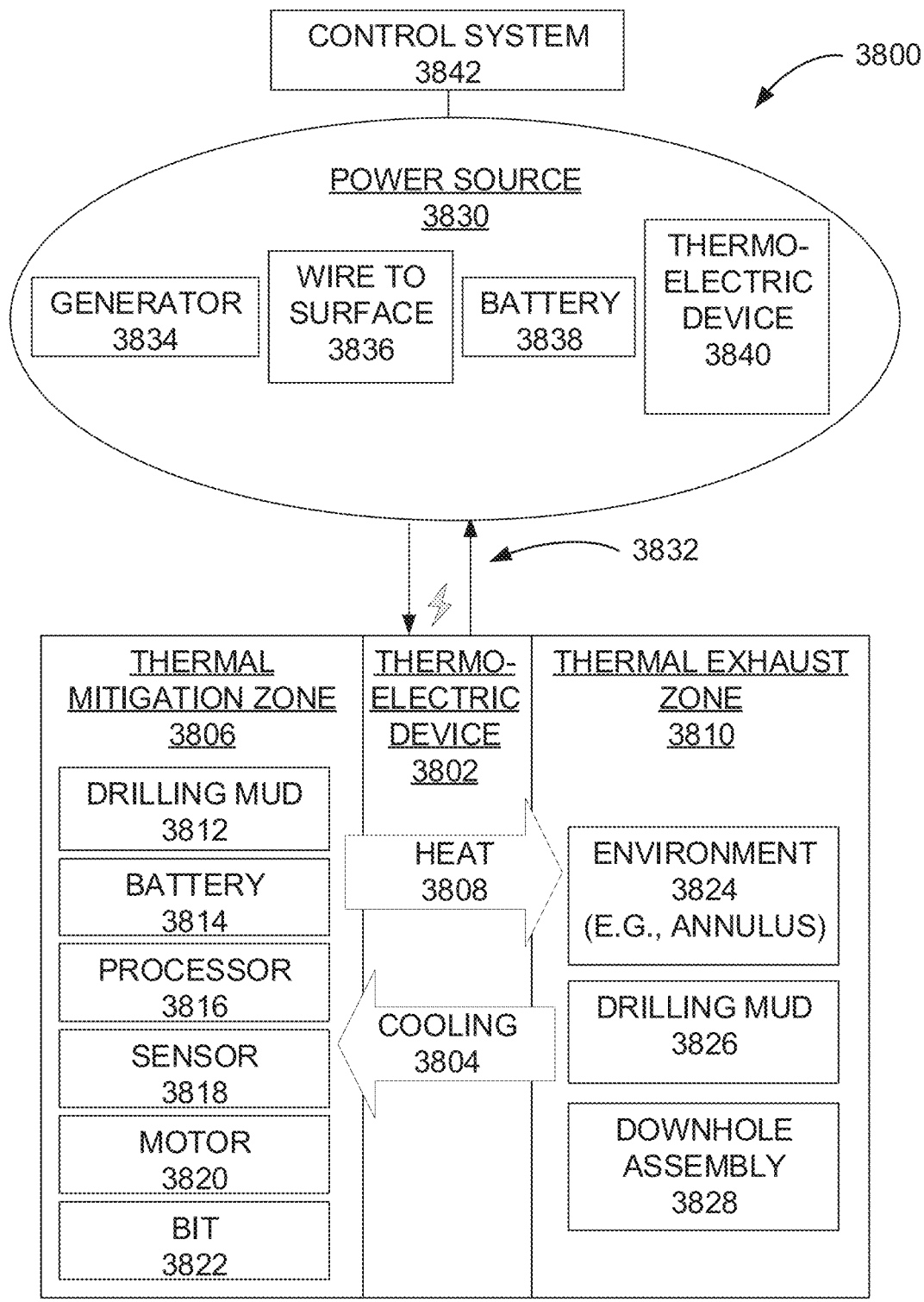
FIG. 38 illustrates an exemplary wellbore thermal management system.

FIG. 38 illustrates an exemplary wellbore thermal management system 3800. The thermal management system can include one or more thermoelectric devices 3802. The thermoelectric devices 3802 may be capable of providing cooling 3804 to a thermal mitigation zone 3806. The thermoelectric devices 3802 may cause heat 3808 to move from the thermal mitigation zone 3806 to a thermal exhaust zone 3810, for example. The thermoelectric devices 3802 may provide cooling and/or move heat in response to electric current being applied to the thermoelectric devices 3802. For example, the thermoelectric devices 3802 may be configured as a thermoelectric heat pump, as described above. In providing cooling, the thermoelectric devices 3802 may function as an active insulator to reduce heat effects relative to the target of the cooling. In addition, a thermal insulator and/or conductor may be disposed adjacent or near the thermoelectric devices 3802, such as to help conduct heat away from the thermoelectric devices 3802.

The thermoelectric devices 3802 can be arranged to impart cooling to one or more targets within the thermal mitigation zone 3806. Although different examples of targets are depicted within the thermal mitigation zone 3806 in FIG. 38, any combination of more, fewer, or different components may be utilized individually and/or in combination.

In some examples, the thermoelectric devices 3802 may provide cooling 3804 to drilling mud 3812. For example, the thermoelectric devices 3802 may be positioned along a fluid conduit through which drilling mud 3812 is to be conveyed. Cooling the drilling mud 3812 may reduce a temperature of the drilling mud 3812 so that the drilling mud 3812 in turn provides cooling to components with which the drilling mud 3812 interacts downstream of the thermoelectric devices 3802. Additionally or alternatively, cooling the drilling mud 3812 may reduce a temperature of the drilling mud 3812 so that the drilling mud 3812 is at a suitably reduced temperature to reduce wear or otherwise be within established preferred operating temperatures for components with which the drilling mud 3812 interacts downstream of the thermoelectric devices 3802.

In some examples, the thermoelectric devices 3802 may provide cooling 3804 to a battery 3814. Examples may include a lithium ion battery or other form of battery, such as may be utilized to power other devices within a downhole assembly. For example, one or more batteries may be located in a package that is surrounded in whole or in part by the thermoelectric devices 3802. Such a battery pack can be located within the BHA and kept cool by the thermoelectric devices 3802. The cooling side of the thermoelectric devices 3802 may be adjacent to or proximal the battery pack, with the heating side of the thermoelectric devices 3802 adjacent to or proximal an outside wall of the BHA, so as to help conduct the heat from the thermoelectric devices away from the battery pack. Additionally, a thermal conductor (e.g., graphene) may be used to help conduct the heat to a location further away from the battery pack.

In some examples, the thermoelectric devices 3802 may provide cooling 3804 to a processor 3816 and/or other electronic components (e.g., memory devices, printed circuit boards, etc.) located in the BHA. Examples may include a processor for controlling operation of—and/or managing data with respect to—other devices within a downhole assembly.

In some examples, the thermoelectric devices 3802 may provide cooling 3804 to one or more sensors 3818.

Examples may include logging while drilling sensors, measuring while drilling sensors, and/or other sensors within a downhole assembly.

In some examples, the thermoelectric device 3802 may provide cooling 3804 to a motor 3820. Examples may include mud motors for rotating drill bits or other components within and/or associated with a downhole assembly. Examples may include mud motors that rotate in response to flow of drilling mud therethrough and/or a generator coupled to the mud motor for generating an electric current from the operation of the mud motor.

In some examples, the thermoelectric device 3802 may provide cooling 3804 to a bit 3822. Examples may include bits for drilling a wellbore.

The thermoelectric device 3802 can be arranged to exhaust heat to one or more recipient devices within the thermal exhaust zone 3810. Although different examples of recipients are depicted within the thermal exhaust zone 3810 in FIG. 38, any combination of more, fewer, or different components may be utilized individually and/or in combination.

In some examples, the thermoelectric device 3802 may exhaust heat 3808 to an environment 3824 in which a downhole assembly is situated. Examples may include an annulus about a downhole assembly within a wellbore, strata along a wellbore, and/or structures introduced into a wellbore (including but not limited to casings or linings). One or more thermal conductors may be used to exhaust heat from the thermoelectric device 3802 to a location or recipient device away from the thermoelectric device 3802.

In some examples, the thermoelectric device 3802 may exhaust heat 3808 to drilling mud 3826 that may be used with a downhole assembly. Examples may include drilling mud be traveling within the downhole assembly or drilling mud that may be outside the downhole assembly. The drilling mud 3826 may be the same or different relative to drilling mud 3812.

In some examples, the thermoelectric device 3802 may exhaust heat 3808 to the downhole assembly 3828, such as to an outer wall or the BHA. Examples may include exhausting heat into segments, metal components, or other thermally conductive structure defined by the downhole assembly.

The cooling and/or transfer of heat provided by the thermoelectric devices 3802 may be accomplished with consumption of electrical energy from a suitable power source 3830 The thermoelectric devices 3802 may be coupled with the power source 3830 by a suitable electrically conductive element 3832. Although different examples of options are depicted as possibilities for the power source 3830 in FIG. 38, any combination of more, fewer, or different components may be utilized individually and/or in combination.

In some examples, the thermoelectric devices 3802 may be powered by a generator 3834. Examples may include generators powered by operation of a mud motor and/or operable to provide electrical power in response to movement of drilling mud or other medium passing in, along, and/or through a downhole assembly. In some examples, the generator 3834 may include an alternator.

In some examples, the thermoelectric devices 3802 may be powered by a wire to surface 3836. Examples may include cables or other conductors that extend along the length of a downhole assembly to reach a utility grid or other source of power.

In some examples, the thermoelectric devices 3802 may be powered by a battery 3838. Examples may include batteries included in the down hole assembly, on a rig, and/or at the surface of the wellbore.

In some examples, the thermoelectric devices 3802 used for providing cooling 3804 may be powered by a thermoelectric device 3840 used for generating electrical energy. Examples may include thermoelectric devices arranged to provide energy in response to thermal gradients that may be present in a wellbore operation (such as thermal gradients that may exist between fluid within the downhole assembly and fluid outside of the downhole assembly). Examples may include a Seebeck generator as described above.

The system 3800 may further include a control system 3842. The control system 3842 may control whether power is supplied from the power source 3830 to the thermoelectric devices 3802 (e.g., to turn cooling 3804 on or off). The control system 3842 additionally or alternatively may control operation of the of the thermoelectric devices 3832. In some examples, the control system 3842 may be operable to change an operating mode of the thermoelectric devices 3832. For example, the control system 3842 may be operable to change the thermoelectric devices 3832 from a thermal production mode (e.g., in which electric power is consumed to provide a thermal gradient for purposes of provide cooling 3804 and/or heat 3808 or other purposes) to a power production mode (e.g., in which presence of a thermal gradient is used to generate electrical power) or vice versa. In some examples, the control system 3842 may be operable to change the thermoelectric devices 3832 among different forms or sub-modes of the thermal production mode, such as by reversing a direction of current to reverse which side of the thermoelectric devices 3802 functions as the "hot side" and which functions as the "cold side." In use, the control system 3842 may allow automatic or manual switching between using a temperature differential to obtain current and instead applying current to adjust a temperature differential away from—e.g., increasing or decreasing relative to—what may be otherwise present.

In one example, one or more thermoelectric devices like those described can be located adjacent to or proximal one or more pieces of drill pipe, one or more portions of the BHA and/or the BHA's components. The control system 3842 can be enabled to automatically initiate cooling of the drilling mud in the wellbore via activation of the thermoelectric devices when needed to cool the drilling mud. For example, if the mud pumps are stopped and mud is not being circulated (such as may occur with slide drilling operations), the drilling mud will increase in temperature. By automatically activating the thermoelectric devices when slide drilling occurs, when the mud pumps stop or slow down the circulation of drilling mud, or the like, a signal can be sent to the control system 3842 to activate the thermoelectric devices so that the mud is cooled. In some cases, the control systems can activate the one or more thermoelectric devices before the mud pumps slow down or cease operation (e.g., before a planned slide drilling operation occurs) so that the thermoelectric devices begin cooling before the mud begins to increase in temperature. Additionally or alternatively, the mud temperature may be monitored and, when the temperature exceeds a threshold therefor, the control system 3842 can activate the thermoelectric devices to begin cooling the mud.

Figure 39:
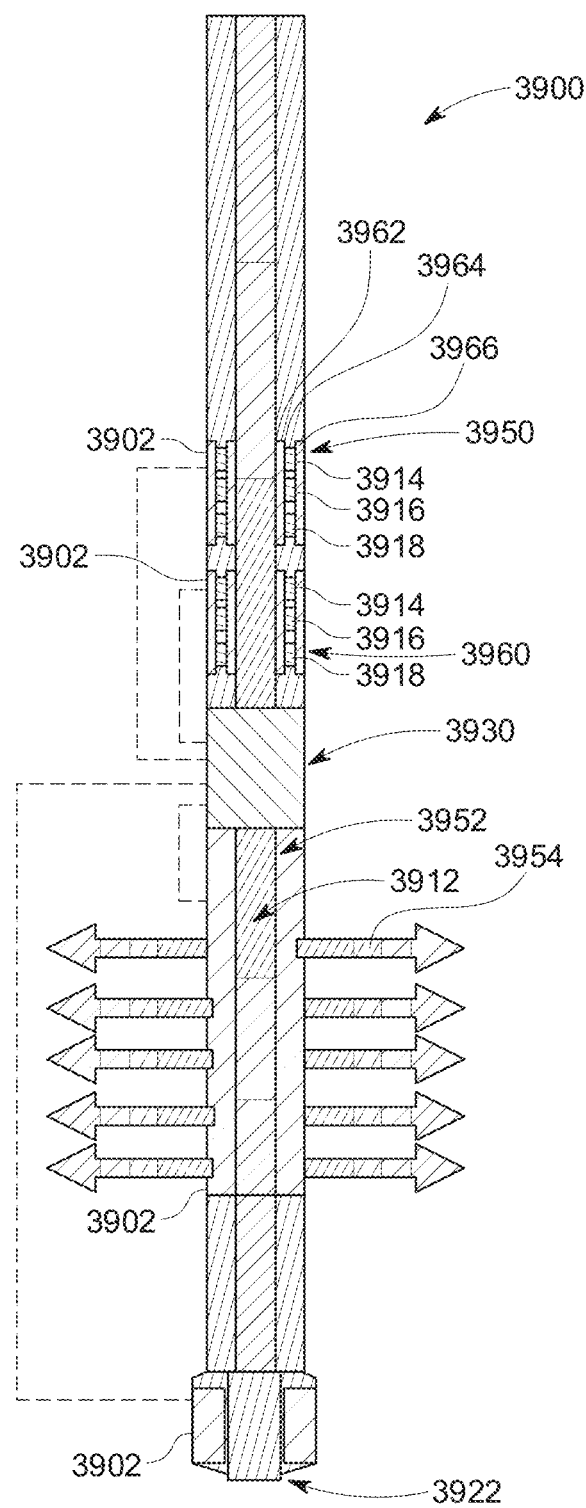
FIG. 39 illustrates an exemplary downhole assembly for thermal management.

FIG. 39 illustrates an exemplary downhole assembly 3900 for thermal management. The downhole assembly 3900 may correspond to a portion of a drill string for example. The downhole assembly 3900 can include a power generation section 3930. The power generation section 3930 can supply power to one or more thermoelectric devices 3902 that may be included in the downhole assembly 3900 to provide cooling, heat transfer, and/or other forms of thermal management. Suitable connection for conveying power is schematically shown by dashed lines in FIG. 39 and correspond to any suitable routing wires or other conductors within and/or along the downhole assembly 3900.

The power generation section 3902 may include a mud motor that can rotate a bit 3922 and/or that may generate electrical power in response to passage of drilling mud therethrough. The power generation section 3902 may additionally or alternatively include or be at least partially replaced with the power source 3830 described above with respect to FIG. 38. For ease of viewing, some components are shown uphole of the power generation section 3930 and others are shown downhole of the power generation section 3930, but any other respective arrangement and/or combination of these and/or other elements can be used.

The thermoelectric devices 3902 may be suitably arranged for providing cooling to components of the downhole assembly 3900, including, but not limited to the bit 3922, drilling mud 3912, a logging while drilling assembly 3950, and/or a measuring while drilling assembly 3960. For example, the thermoelectric devices 3902 can be provided in, on, adjacent, and/or upstream of such components. The logging while drilling assembly 3950 and the measuring while drilling assembly 3960 are each shown by way of example respectively with at least one battery 3814, at least one processor 3816, and at least one sensor 3818 that are cooled by thermoelectric devices 3902, although any combination of such components may be omitted or included within or independent from other illustrated elements. The thermoelectric devices 3902 may also be arranged to provide cooling to other components, such as one or more batteries, other sensors, and the like.

As one illustrative example of operation, drilling mud 3912 (or other fluid) may be supplied or introduced through a fluid conduit 3952 (e.g., which may correspond to an interior volume of a pipe or other passage). Thermoelectric devices 3902 along the fluid conduit 3952 can extract heat from the drilling mud 3912, e.g., in response to electrical power supplied from the power generation section 3930. In some examples, the thermoelectric devices 3902 may span substantially an entire pipe thickness or other distance between a central passage and an annulus of the downhole assembly 3900. The thermoelectric devices 3902 can transfer heat away from and thereby cool the drilling mud 3912, such as illustrated by arrows 3954. Such transfer of heat may reduce a temperature of the drilling mud 3912, e.g., such that the drilling mud 3912 is converted into and/or corresponds to a cooled fluid. The cooled fluid can be provided through a downstream portion of the downhole assembly 3900 so as to impart cooling to the downstream portion of the downhole assembly 3900. For example, the cooled drilling mud 3912 may provide cooling to the bit 3922.

In some examples, the thermoelectric devices 3902 may be arranged within a sleeve 3962 relative to other components. The sleeve 3962 in some examples may correspond to a hollow cylindrical structure that may accommodate a central passage through the downhole assembly 3900. The sleeve 3962 can include an inward sleeve portion 3964 and/or an outward sleeve portion 3966. The inward sleeve portion 3964 can be arranged radially inward from other components and/or the outward sleeve portion 3966 can be arranged radially outward from other components. In some examples, thermoelectric devices 3902 of the inward sleeve portion 3964 can transfer heat between components and drilling mud 3912 within the downhole assembly 3900 (e.g., to provide cooling to the components and exhaust heat to drilling mud 3912 within the downhole assembly 3900). Additionally or alternatively, thermoelectric devices 3902 of the outward sleeve portion 3966 can transfer heat between components and an environment around the downhole assembly 3900 (such as drilling mud or other substances in an annulus between the downhole assembly 3900 and the wellbore). For example, thermoelectric devices 3902 of the outward sleeve portion 3966 may provide cooling to components and exhaust heat to the annulus, strata, or other environmental features around the downhole assembly. In still other examples, one or more thermally conductive materials be thermally coupled to a portion of the sleeve to conduct heat away from the sleeve.

In some embodiments, one or more thermal storage devices may be provided. For example, a plurality of thermoelectric devices may be provided and arranged to either provide power from a thermal differential and/or provide cooling to one or more downhole components, such as described above, and a control system such as described above may be used to switch the operations of the thermoelectric devices as deemed appropriate. In addition, some or all of the plurality of thermoelectric devices may be located adjacent to or proximal one or more thermal storage devices. For example, one or more blocks comprising aluminum may be provided adjacent to or near the thermoelectric devices so that the thermoelectric devices can be used to provide heating or cooling of the aluminum block as desired, such as until the blocks reach a desired temperature. By cooling the aluminum blocks using the thermoelectric devices when mud is flowing and providing energy which can be used to power the thermoelectric devices, for example, the cooled aluminum blocks can help keep adjacent and nearby components cool when the mud pumps are off and mud is not flowing and no energy is provided to the thermoelectric devices. Other types of materials may be used for thermal storage devices, such as blocks made of Wood's metal, phase change materials, and the like. Moreover, one or more thermal conductors may be provided to provide thermal conductivity between the blocks and the one or more components to be cooled, so that the thermal storage devices need not be adjacent or even close to the components to be cooled. It should also be noted that, although this discussion refers to aluminum blocks, the thermal storage devices may be any desired shape or size, such as a curved piece adapted to fit within a drill string, a bottom hole assembly, or downhole sub or the like. Depending on the available space for the thermal storage device, the proximity and shape of the components to be cooled or powered by the thermoelectric devices, and the like, the thermal storage device may be any shape or size configured to fit within the available space.

Figure 40:
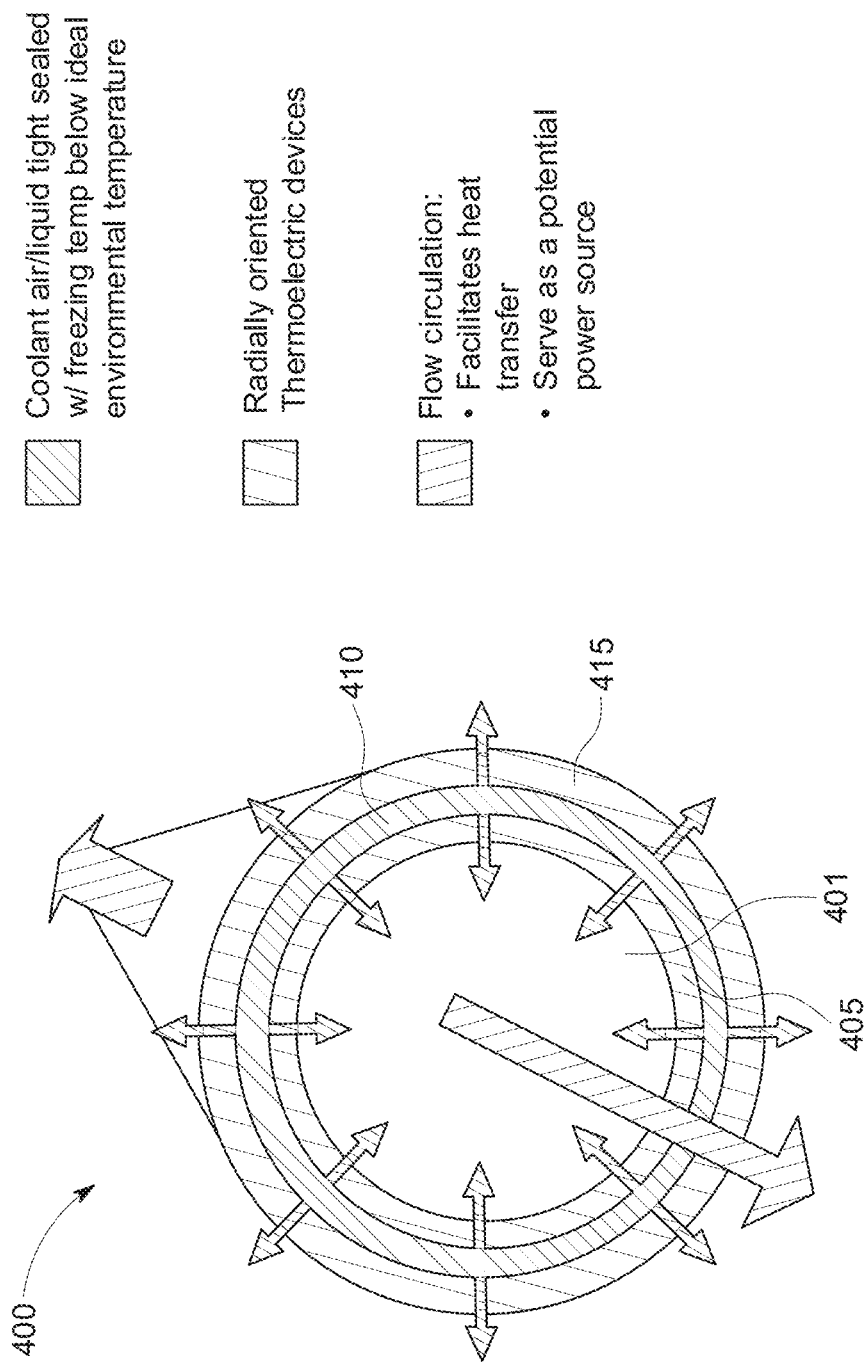
FIG. 40 illustrates a cross section of a system for controlling temperature in a downhole environment.

Referring now to FIG. 40, a cross section of a downhole temperature control system 400 is provide. The system 400 may be a downhole pipe, sub, BHA, or other downhole component or portion thereof. The system 400 includes a cylindrically shaped item with an opening 401 therethrough. The opening 401 may conduct drilling mud or other fluids, which may be heated or chilled, such as if a desired temperature difference is to be obtained to use thermoelectric devices to generate power. As shown in FIG. 40, the system may have three concentric layers 405, 410, and 415. Layers 405 and 415 may comprise a plurality of thermoelectric devices. Layer 410, located between layers 405 and 415, may comprise one or more thermal storage devices. The thermal storage devices 410 may comprise a cooled or frozen compound (such as ice), which can both create a temperature differential and also provide cooling. The layer 410 also may comprise a material that acts as a thermal storage device, such as aluminum or wood's metal, which may be cooled by operation of the thermoelectric devices when current is supplied to them.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

What is claimed is:

1. A bottom hole assembly comprising:
   a plurality of thermoelectric devices thermally coupled with a component of a bottom hole assembly (BHA) and electrically coupled with a power source, wherein the plurality of thermoelectric devices are adapted to cool at least a portion of the component when the plurality of thermoelectric devices are activated; and
   a control system coupled with the power source and/or the plurality of thermoelectric devices, the control system comprising a processor coupled with a memory, wherein the memory comprises control system instructions executable by the processor for activating the plurality of thermoelectric devices when a drilling mud temperature exceeds a threshold therefor.

2. The bottom hole assembly of claim 1, wherein the component comprises at least one of: a sensor, a battery, a processor, a memory device, or an electronic device.

3. The bottom hole assembly of claim 1, wherein the power source is located within the BHA.

4. The bottom hole assembly of claim 1, wherein the power source comprises a plurality of power sources, and wherein the plurality of power sources comprise a battery and a generator or alternator located in or coupled to the BHA.

5. The bottom hole assembly of claim 1, wherein the control system is adapted to activate and deactivate the plurality of thermoelectric devices.

6. The bottom hole assembly of claim 5, wherein the control system instructions comprise instructions executable by the processor to activate the plurality of thermoelectric devices when the drilling mud temperature exceeds the threshold for a predetermined time period.

7. The bottom hole assembly of claim 1, further comprising a thermally conductive material located adjacent or proximal one or more of the plurality of thermoelectric devices and adapted to conduct thermal heat away from the component.

8. The bottom hole assembly of claim 5, wherein the control system instructions comprise instructions executable by the processor for receiving information as to when a slide drilling operation is to begin or determining when the slide drilling operation is to begin and for activating the plurality of thermoelectric devices adapted to cool prior to the beginning of the slide drilling operation.

9. The bottom hole assembly of claim 5, wherein the control system instructions comprise instructions executable by the processor for receiving information as to when drilling mud flow ceases or is reduced below a threshold therefor or determining when the drilling mud flow ceases or is reduced below the threshold therefor and for activating the plurality of thermoelectric devices in response thereto.

10. The bottom hole assembly of claim 1, wherein the plurality of thermoelectric devices are configured to transfer heat from at least a portion of the component in response to electric current application to the plurality of thermoelectric devices.

11. The bottom hole assembly of claim 1, further comprising a means for regulating a variable flow rate of fluid across the plurality of thermoelectric devices.

12. A bottom hole assembly comprising:
    a plurality of thermoelectric devices thermally coupled with a component of a bottom hole assembly (BHA) and electrically coupled with a power source, wherein the plurality of thermoelectric devices are adapted to cool at least a portion of the component when the plurality of thermoelectric devices are activated; and
    a control system coupled with the power source and/or the plurality of thermoelectric devices, the control system comprising a processor coupled with a memory, wherein the memory comprises control system instructions executable by the processor for receiving information as to when a slide drilling operation is to begin or determining when the slide drilling operation is to begin and for activating the plurality of thermoelectric devices adapted to cool prior to the beginning of the slide drilling operation.

13. The bottom hole assembly of claim 12, wherein the component comprises at least one of: a sensor, a battery, a processor, a memory device, or an electronic device.

14. The bottom hole assembly of claim 12, wherein the power source is located within the BHA.

15. The bottom hole assembly of claim 12, wherein the power source comprises a plurality of power sources, and wherein the plurality of power sources comprise a battery and a generator or alternator located in or coupled to the BHA.

16. The bottom hole assembly of claim 12, wherein the control system is adapted to activate and deactivate the plurality of thermoelectric devices.

17. The bottom hole assembly of claim 12, further comprising a thermally conductive material located adjacent or proximal one or more of the plurality of thermoelectric devices and adapted to conduct thermal heat away from the component.

18. The bottom hole assembly of claim 16, wherein the control system instructions comprise instructions executable by the processor for receiving information as to when drilling mud flow ceases or is reduced below a threshold therefor or determining when the drilling mud flow ceases or is reduced below the threshold therefor and for activating the plurality of thermoelectric devices in response thereto.

19. The bottom hole assembly of claim 12, wherein the plurality of thermoelectric devices are configured to transfer heat from at least a portion of the component in response to electric current application to the plurality of thermoelectric devices.

20. The bottom hole assembly of claim 12, further comprising a means for regulating a variable flow rate of fluid across the plurality of thermoelectric devices.

21. The bottom hole assembly of claim 16, wherein the control system instructions comprise instructions executable by the processor for activating the plurality of thermoelectric devices when a drilling mud temperature exceeds a threshold therefor.

22. The bottom hole assembly of claim 16, wherein the control system instructions comprise instructions executable by the processor for receiving information as to when a slide drilling operation is to begin or determining when the slide drilling operation is to begin and for activating the plurality of thermoelectric devices adapted to cool prior to the beginning of the slide drilling operation.

23. A bottom hole assembly comprising:
a plurality of thermoelectric devices thermally coupled with a component of a bottom hole assembly (BHA) and electrically coupled with a power source, wherein the plurality of thermoelectric devices are adapted to cool at least a portion of the component when the plurality of thermoelectric devices are activated; and
a control system coupled with the power source and/or the plurality of thermoelectric devices, the control system comprising a processor coupled with a memory, wherein the memory comprises control system instructions executable by the processor for activating the plurality of thermoelectric devices when drilling mud flow ceases or is reduced below a threshold therefor.

24. The bottom hole assembly of claim 23, wherein the component comprises at least one of: a sensor, a battery, a processor, a memory device, or an electronic device.

25. The bottom hole assembly of claim 23, wherein the power source is located within the BHA.

26. The bottom hole assembly of claim 23, wherein the power source comprises a plurality of power sources, and wherein the plurality of power sources comprise a battery and a generator or alternator located in or coupled to the BHA.

27. The bottom hole assembly of claim 23, wherein the control system is adapted to activate and deactivate the plurality of thermoelectric devices.

28. The bottom hole assembly of claim 27, wherein the control system instructions comprise instructions executable by the processor to activate the plurality of thermoelectric devices when a drilling mud temperature exceeds a threshold therefor.

29. The bottom hole assembly of claim 28, wherein the control system instructions comprise instructions executable by the processor to activate the plurality of thermoelectric devices when the drilling mud temperature exceeds the threshold for a predetermined time period.

30. The bottom hole assembly of claim 23, further comprising a thermally conductive material located adjacent or proximal one or more of the plurality of thermoelectric devices and adapted to conduct thermal heat away from the component.

31. The bottom hole assembly of claim 27, wherein the control system instructions comprise instructions executable by the processor for receiving information as to when a slide drilling operation is to begin or determining when the slide drilling operation is to begin and for activating the plurality of thermoelectric devices adapted to cool prior to the beginning of the slide drilling operation.

32. The bottom hole assembly of claim 23, wherein the plurality of thermoelectric devices are configured to transfer heat from at least a portion of the component in response to electric current application to the plurality of thermoelectric devices.

33. The bottom hole assembly of claim 23, further comprising a means for regulating a variable flow rate of fluid across the plurality of thermoelectric devices.

* * * * *